(12) United States Patent
Suzuki

(10) Patent No.: US 6,933,976 B1
(45) Date of Patent: Aug. 23, 2005

(54) SOLID-STATE IMAGE PICKUP DEVICE

(75) Inventor: Nobuo Suzuki, Miyagi (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 981 days.

(21) Appl. No.: 09/654,348

(22) Filed: Sep. 1, 2000

(30) Foreign Application Priority Data

Sep. 3, 1999 (JP) .................................. 11-250655
Sep. 27, 1999 (JP) .................................. 11-273408

(51) Int. Cl.⁷ .......................... H04N 3/14; H04N 5/335; H01L 27/148
(52) U.S. Cl. ....................... 348/315; 348/275; 257/240
(58) Field of Search ................... 348/315, 311, 294, 348/275; 257/240, 241

(56) References Cited

U.S. PATENT DOCUMENTS

| 4,602,289 A | * | 7/1986 | Sekine .................... 348/315 |
| 5,306,906 A | * | 4/1994 | Aoki et al. .............. 257/222 |
| 5,376,967 A | * | 12/1994 | Sakota et al. ........... 348/311 |
| 5,793,071 A | * | 8/1998 | Sekine .................... 257/240 |
| 6,236,434 B1 | * | 5/2001 | Yamada ................... 348/315 |

FOREIGN PATENT DOCUMENTS

JP    10136391 A  *  5/1998   ............ H04N 9/07

* cited by examiner

Primary Examiner—Wendy R. Garber
Assistant Examiner—Timothy J. Henn
(74) Attorney, Agent, or Firm—Arent Fox, PLLC.

(57) ABSTRACT

In a solid-state image pickup device in which a large number of photoelectric converters are disposed in a shifted-pixel layout, a charge transfer channel configuring a vertical transfer CCD includes a section having a first width and being contiguous to a readout gate region and a section having a second width and being separated therefrom. The first width is less than the second width. Alternatively, a relative positional relationship between each photoelectric converter and the readout gate region corresponding thereto is fixed for all pixels. This makes it possible to easily prevent the event in which the light collecting efficiency and sensitivity of each pixel vary between two adjacent pixel rows. It is also possible to increase the pixel density while suppressing the decrease in area of the light receiving section of each pixel.

16 Claims, 32 Drawing Sheets

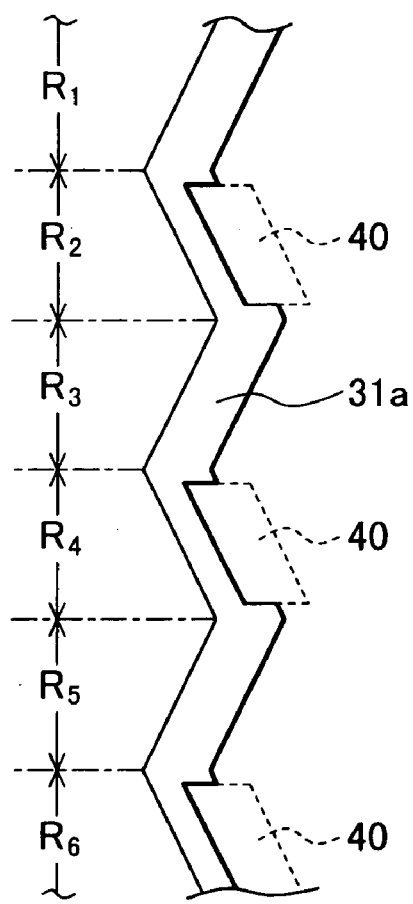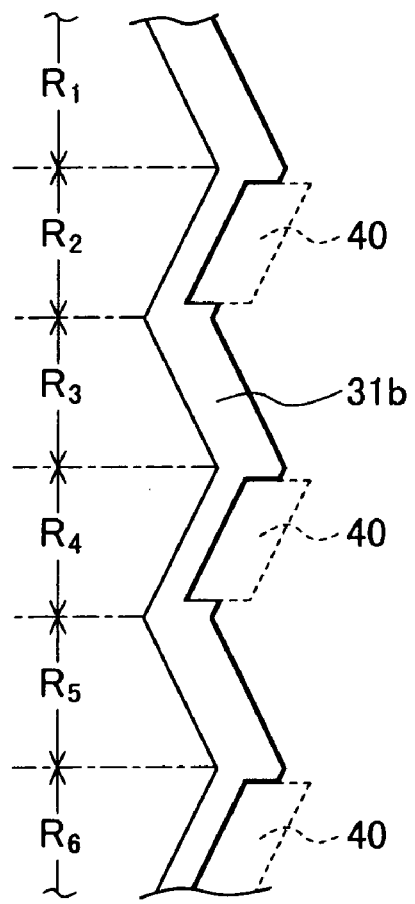

POTENTIAL OF PULSE SUPPLYING TERMINAL 285c

POTENTIAL OF PULSE SUPPLYING TERMINAL 285d

POTENTIAL OF PULSE SUPPLYING TERMINAL 285c

POTENTIAL OF PULSE SUPPLYING TERMINAL 285d

SOLID-STATE IMAGE PICKUP DEVICE

This application is based on Japanese Patent Applications HEI 11-250655 filed on Sep. 3, 1999 and HEI 11-273408 filed on Sep. 27, 1999, the entire contents of which are incorporated herein by reference.

BACKGROUND OF THE INVENTION a) Field of the Invention

The present invention relates to a solid-state image pickup device used as an area image sensor and a driving method of the same, and in particular, to a solid-state image pickup device of interline transfer type comprising a plurality of photoelectric converter columns and the same number of vertical transfer charge-coupled devices (CCD) as the photoelectric converter columns and a driving method of the same.

b) Description of the Related Art

Development of mass-production technology of CCDs enhances a quick spread of a video camera, an electronic still camera, and the like using a solid-state image pickup device of CCD type as an area image sensor. Solid-state image pickup devices of CCD type are classified into several kinds according to structure including a solid-state image pickup device of interline transfer type (to be referred to as "IT-CCD" herebelow).

An IT-CCD comprises a large number of photoelectric converters or photoelectric converter elements arranged on a surface of a semiconductor substrate in a plurality of columns with a constant pitch and in a plurality of rows with a constant pitch. Each of the columns and the rows includes a plurality of photoelectric converters. Each photoelectric converter is comprised of a photo diode in ordinary cases.

For example, to form a large number of photoelectric converters being composed of p-n photodiodes, a p-type well is manufactured on a desired surface of a semiconductor substrate and n-type regions each having a desired contour are formed in the p-type well as many as there are photoelectric converters. If necessary, a $p^+$-region is manufactured on each n-type region. Signal charge is stored in each n-type region. Namely, each n-type region serves as a signal charge storage region.

In this specification, a term "photoelectric converter (element)" indicates only a signal charge storage region depending on cases. Moreover, "adjacent to a photoelectric converter" means that "adjacent to a signal charge storage region constituting a photoelectric converter" and "contiguous to a photoelectric converter" indicates "contiguous to a signal charge storage region constituting a photoelectric converter".

In the IT-CCD, for each photoelectric converter column, one charge transfer channel is formed adjacent thereto. Therefore, an IT-CCD includes a plurality of charge transfer channels. Each charge transfer channel is used to transfer signal charge stored in respective photoelectric converters of each photoelectric converter column adjacent to the charge transfer channel.

A plurality of transfer electrodes are formed on the surface of the semiconductor substrate with an electrically insulating film intervening therebetween, the transfer electrodes intersecting the charge transfer channels in plan view. Each intersection between the electrodes and the channels serves as one charge transfer stage. That is, one vertical transfer CCD includes one charge transfer channel and the transfer electrodes.

In this specification, a region of the charge transfer stage in each transfer electrode of the vertical transfer CCD is called "transfer path forming region".

Each vertical transfer CCD of the IT-CCD of interlace driving type ordinarily has two charge transfer stages for one photoelectric converter. Each vertical transfer CCD of the IT-CCD of all pixel readout type ordinarily includes three or four charge transfer stages for each photoelectric converter.

Each photoelectric converter stores signal charge by achieving photoelectric conversion. The signal charge is read therefrom to an associated charge transfer channel at a predetermined point of time.

To control the operation to read of signal charge from the photoelectric converters to the charge transfer channels, one readout gate region is disposed for each photoelectric converter to be contiguous to the photoelectric converter. Each readout gate region is formed on the surface of the semiconductor substrate to be contiguous to an associated photoelectric converter and to a charge transfer channel corresponding to the photoelectric converter. Ordinarily, to form a potential barrier against the signal charge, the readout gate region has a conductivity type opposite to that of the photoelectric converter and the charge transfer channel.

Each readout gate region has a readout gate electrode region thereon. Each readout gate electrode region is ordinarily part of the transfer path forming region of a predetermined transfer electrode of the vertical transfer CCD. By applying a high voltage to the readout gate electrode region to remove or to lower the potential barrier in the readout gate region, signal charge accumulated in the photoelectric converter can be read out to the charge transfer channel.

Signal charge on each charge transfer channel is transferred to an output transfer path by each vertical transfer CCD comprising the charge transfer channel. The output transfer path is ordinarily composed of CCDs (which are referred to as "horizontal transfer CCD in some cases").

The output transfer path being composed of horizontal transfer CCD includes N charge transfer stages for one vertical transfer CCD. Ordinarily, one charge transfer stage includes one potential barrier region and one potential well region and N is two. When each charge transfer stage has substantially uniform potential, N is three or more.

The output transfer path sequentially transfers received signal charge in a longitudinal direction (to be referred to as "row direction" herebelow) of the photoelectric converter row. This resultantly outputs received signal charge to an output portion. Like the vertical transfer CCD, the output transfer path is formed also on the semiconductor substrate.

Each of the vertical transfer CCD and the horizontal transfer CCD has a function of photoelectric conversion. Therefore, to prevent unnecessary photoelectric conversion in the vertical and horizontal CCDs, a light shielding film is arranged. The film has an opening with a predetermined contour on each photoelectric converter (photodiode). One opening is disposed for each photoelectric converter. The opening is ordinarily disposed in plan view within an area defined by a peripheral edge of a signal charge storage region of the photoelectric converter.

One pixel includes one photoelectric converter, one readout gate region formed contiguous to the photoelectric converter, one readout gate electrode region over the readout gate region in plan view, and two to four charge transfer stages (of the vertical transfer CCD) corresponding to the photoelectric converter. On the surface of each photoelectric converter, an area exposed by the opening in plan view serve as a light receiving section of the pertinent pixel.

In an IT-CCD, the contour and area of the light receiving section are therefore substantially determined by the contour and the area of each opening formed in the light shielding film in plan view.

Broad development of the IT-CCD requires further improvement of performance of the IT-CCD in, for example, resolution and sensitivity.

The resolution of the IT-CCD considerably depends of a pixel density (a degree of integration). The more the pixel density (degree of integration) is, the easier the improvement of resolution is. On the other hand, the sensitivity greatly depends on the area of the light receiving section of each pixel. The larger the area is, the easier the improvement of the sensitivity is.

Japanese Patent Publication Ser. No. 2825702 describes an IT-CCD (the device is referred to as "solid-state image pickup device" therein, but will be referred to as "IT-CCD" in this specification) in which the pixel density can be increased while suppressing the decrease in the area of the light receiving section of each pixel.

This IT-CCD comprises a large number of photoelectric converters in a plurality of columns with a constant pitch and in a plurality of rows with a constant pitch. Each of the columns and the rows includes a plurality of photoelectric converters. The photoelectric converters in even columns are respectively shifted in a direction of the column from those in odd columns about one half of the pitch of photoelectric converters in each photoelectric converter column. Similarly, the photoelectric converters in even rows are respectively shifted in a direction of the row from those in odd row about one half of the pitch of photoelectric converters in each photoelectric converter row. Each photoelectric converter column is composed of photoelectric converters of only odd or even rows.

To transfer signal charge stored in each photoelectric converter, a plurality of vertical transfer CCDs are arranged. Each vertical transfer CCD, locally meandering, transfers the signal charge in a predetermined direction.

Each vertical transfer CCD comprises a plurality of transfer electrodes arranged in a honeycomb layout. Arrangement of these transfer electrodes in such a shape configures gaps or regions each having a hexagonal contour. In each of the hexagonal regions, one photoelectric converter exists in plan view.

Signal charge stored in each photoelectric converter in an odd column is read out to an associated vertical transfer CCD via a readout gate region formed in plan view adjacent to an inner side of a lower-left edge of the hexagonal region. On the other hand, signal charge stored in each photoelectric converter in an even column is read out to the associated vertical transfer CCD via a readout gate region formed in plan view adjacent to an inner side of an upper-left edge of the hexagonal region.

In the IT-CCD described in the publication, by arranging a large number of photoelectric converters and a plurality of transfer electrodes (for the vertical transfer CCD) as above, the pixel density can be increased while suppressing the decrease in the area of the light receiving section of each pixel.

In this specification, the arrangement of a large number of photoelectric converters above is referred to as "shifted-pixel layout".

In the IT-CCD, for each photoelectric converter, one microlens is formed thereover in ordinary cases. Light from an object is collected by an optical system of an image-pickup or imaging lens. Resultant light is further collected by the microlens to produce an image on the photoelectric converter.

In this situation, a light beam incident to the microlens at a position in an upper section of a photoelectric converter column has an incidence angle which is reverse, with respect to an optical axis of the image-pickup lens, to an incidence angle of a light beam incident to the microlens in a lower section of the photoelectric converter column. Therefore, between the upper and lower sections of the photoelectric converter column, a position of the image produced by the microlens on the photoelectric converter is also reversed with respect to the optical axis of the image-pickup lens.

FIG. 34 is a cross-sectional view for explaining a position of an image formed on a photoelectric converter by the microlens. A photoelectric converter 401 shown in FIG. 34 is formed on a semiconductor substrate 402. A microlens 403 is formed over the converter 401 with a focus adjusting layer 404 intervening therebetween. In FIG. 34, a photoelectric converter column extends in right and left direction.

When the photoelectric converter 401 exists in an upper section of the photoelectric converter column, a light beam 405 which cross an optical axis 403a of the microlens 403 along an inclined direction from a central side of the photoelectric converter column to the upper section of the photoelectric converter column enters the microlens 403. The light beam 405 produces an image focused at a point 405a shifted upward (on an upper side in the direction of the photoelectric converter column) with respect to the optical axis 403a of the microlens 403.

On the other hand, when the photoelectric converter 401 exists in a lower section of the photoelectric converter column, a light beam 406 which cross the optical axis 403a of the microlens 403 along an inclined direction from a central side of the photoelectric converter column to the lower section of the photoelectric converter column enters the microlens 403. The light beam 406 produces an image focused at a point 406b shifted downward (on a lower side in the direction of the photoelectric converter column) with respect to the optical axis 403a of the microlens 403.

The amount of shift of the point 405a from the optical axis 403a of the microlens 403 increases as the position of the microlens 403 becomes farther from the central position of the photoelectric converter column. This also applies to the amount of shift of the point 406b relative to the optical axis 403a of the microlens 403.

Also in the IT-CCD in which pixels are disposed in a quadratic or square lattice format and the IT-CCD in which pixels are arranged in a shifted-pixel layout, light collecting efficiency and sensitivity of each pixel vary between two adjacent pixel rows in cases (A) to (C) as follows.

(A) The light receiving section of each pixel has a different contour.

(B) The contour of the light receiving section is almost uniform in each pixel, but the sections vary in size thereof.

(C) The contour and the size of the light receiving section are almost uniform in each pixel, but the light receiving sections vary in direction thereof.

When light collecting efficiency and sensitivity of each pixel vary between two adjacent pixel rows, for example, in an IT-CCD for color images, signals produced from the IT-CCD become deteriorated in color balance and hence an image produced is attended with color shading. In an IT-CCD for monochrome images, an image reproduced is lowered in its quality by unevenness in a background of the image.

For example, in the IT-CCD of Japanese Patent Publication Ser. No. 2825702, the hexagonal gaps or regions appearing in the honeycomb arrangement of a plurality of transfer electrodes have a shift of 180° in plan view between the regions in odd rows and those in even rows. Therefore, in this IT-CCD, when the contour and the size of the light receiving section of each pixel is fabricated in a form analogous to a form obtained by directly minimizing the hexagonal region, the light collecting efficiency and sensitivity of each pixel easily vary between two adjacent pixel rows. Resultantly, color shading and background unevenness easily take place in the IT-CCD.

In this description, "regions in odd rows" and "regions in even rows" respectively mean "regions in odd rows" and "regions in even rows" when the regions are arranged in an array in which the longitudinal direction (to be referred to as "column direction" herebelow) of the photoelectric converter column and that of the photoelectric converter row are assumed to be the column direction and the row direction, respectively.

In the IT-CCD of Japanese Patent Publication Ser. No. 2825702, when the light receiving section of each pixel between two adjacent pixel rows is fabricated to have an almost identical contour and size and an almost identical direction, the area of the light receiving section becomes further narrower than the hexagonal region. That is, an area available for the light receiving section is decreased. It is therefore difficult to increase the pixel density while preventing the minimization of the area of the light receiving section of each pixel.

Heretofore, in the charge transfer channel of the vertical transfer CCD, a section thereof contiguous to the readout gate region and a section thereof separated from the readout gate region have substantially equal channel width.

Consequently, the transfer path forming region including the readout gate electrode region must be have a width larger than that not including the readout gate electrode region. Alternatively, each transfer path forming region is formed to have a width substantially equal to the width of the transfer path forming region including the readout gate electrode region.

For example, in the IT-CCD of the Patent Publication above, when the width of the transfer path forming region becomes greater, the area of the hexagonal region appearing in the honeycomb arrangement of the transfer electrodes of the vertical transfer CCD is minimized in plan view. Since the photoelectric converter is manufactured in the hexagonal region as viewed in plan, the area of the photoelectric converter is also decreased as that of the hexagonal region is minimized in plan view.

As described above, the contour of the light receiving section of each pixel is naturally determined by that of the openings in plan view formed in the light shielding film. However, the opening is ordinarily manufactured inside the peripheral edge of the associated photoelectric converter in plan view. This means that the area of the light receiving section of the pixel cannot be larger than that of the photoelectric converter of the pertinent pixel.

Therefore, when the area of the photoelectric converter becomes smaller, the area of the light receiving section of the associated pixel is also decreased in ordinary cases.

SUMMARY OF THE INVENTION

It is therefore an object of the present invention to provide an IT-CCD and a method of driving the same capable of preventing an event in which the light collecting efficiency and sensitivity of each pixel vary between two adjacent pixel rows regardless adoption of the shifted-pixel layout, the IT-CCD being also capable of increasing the pixel density while suppressing the minimization of the area of the light receiving section of each pixel.

In accordance with a first aspect of the present invention, there is provided a solid-state image pickup device, comprising: a semiconductor substrate; a large number of photoelectric converters arranged on one surface of said semiconductor substrate in a plurality of columns and a plurality of rows, each of said columns and said rows including a plurality of photoelectric converters, said photoelectric converters in odd ones of said columns being shifted about one half of a pitch $P_1$ in a direction of said column relative to said photoelectric converters in even ones of said columns, said photoelectric converters in odd ones of said rows being shifted about one half of a pitch $P_2$ in a direction of said row relative to said photoelectric converters in even ones of said rows, each said photoelectric converter column including said photoelectric converters of only said odd rows or said even rows; a vertical charge transfer channel provided for each said photoelectric converter column on the surface of said semiconductor substrate, each said channel being adjacent to an associated photoelectric converter column, each said channel including a plurality of sections of different directions lying in a line, said channel generally extending, while meandering in a zigzag shape, in column direction; a plurality of transfer electrodes disposed on the surface of said semiconductor substrate to intersect in plan view said charge transfer channels, each said transfer electrode including a plurality of transfer path forming regions which are equal in number to said charge transfer channels, each said transfer path forming region covering one of said sections of said charge transfer channels, said transfer path forming region and said section disposed thereunder forming one-charge transfer stage; each said transfer electrode generally extending in row direction, while two adjacent ones of said transfer electrodes sandwiching one of said photoelectric converter rows therebetween and determining one photoelectric converter region for every second one of said photoelectric converter columns by meeting each other and parting from each other to enclose in plan view every one of said photoelectric converters in said odd or even row; and a readout gate region disposed contiguous to each said photoelectric converter and to an associated one of said charge transfer channels, each said charge transfer channel having a first width at location where said channel is contiguous to said readout gate region and a second width at a location where said channel is separated from said readout gate region, said first width being less than said second width.

In accordance with a second aspect of the present invention, there is provided a method of driving a solid-state image pickup device according to the first aspect, comprising the steps of: reading out, in one vertical blanking period, signal charge stored in each said photoelectric converter of a predetermined photoelectric converter rows, via said associated readout gate region contiguous to said photoelectric converter, to said associated charge transfer channel contiguous to said associated readout gate region; and converting, from the vertical blanking period to a next vertical blanking period subsequent thereto, each said signal charge read out to said charge transfer channel into an image signal and outputting the image signal.

In the solid-state image pickup device of the first aspect, since the channel width of the charge transfer channel in a section thereof contiguous to the readout gate regions is smaller than a section thereof other than the section above.

Therefore, in manufacturing a transfer path forming region including a readout gate electrode, the readout gate electrode region can be desirably arranged on the semiconductor substrate without particularly enlarging the width of the pertinent transfer path forming region when compared with any other transfer path forming regions not including the readout gate electrode region.

As a result, it becomes easy to prevent an event in which the area on the photoelectric converter not available as a light receiving section of a pixel increases because of presence of the readout gate electrode region. Simultaneously, between two adjacent pixel rows, the light receiving sections of the respective pixels can be easily formed to be equal in contour, in size, and in direction to each other.

Therefore, in the solid-state image pickup device of the first aspect, although the shifted-pixel layout is employed, the event in which the light collecting efficiency and sensitivity of each pixel vary between two adjacent pixel rows can be easily prevented. Additionally, the pixel density can be easily improved while suppressing the minimization of the area of the light receiving section in each pixel.

In this solid-state image pickup device, for at least every second section of each charge transfer channel having a plurality of sections, a readout gate region is formed with being contiguous to one associated section. That is, a region in which the width of charge transfer channel is narrowed is disposed for at least every second charge transfer stage, in each charge transfer channel. Therefore, the charge transfer stage for which the charge transfer channel has a narrower channel width need only store signal charge for a short period of time and transfer the signal charge to a subsequent charge transfer stage.

When the charge transfer channel and the readout gate region are thus constructed, transfer efficiency almost equal to that of the prior art can be attained while keeping, as in the prior art, the channel width of the charge transfer channel in the location in which the readout gate region is not contiguous to the charge transfer channel.

There may occurs, for example, an event in which narrow channel effect takes place by narrowing the channel width of the charge transfer channel and hence the transfer efficiency is lowered. However, the decrease in the transfer efficiency caused by occurrence of narrow channel effect can be suppressed by generating a so-called fringe electric field.

The fringe electric field can be produced, for example, by setting a relationship between the transfer path forming region of the transfer electrode and the readout gate region to satisfy conditions (1) to (3) below.

(1) The size of the transfer path forming region of the transfer electrode in plan view is sufficiently great to cover the readout gate region.

(2) The transfer path forming region of the charge transfer stage for which the width of the charge transfer channel is not narrowed has an edge section on a downstream side (indicating a side of an output transfer path herebelow), the edge section being brought into contact in plan view with an edge section on an upstream side (indicating a side in plan view opposite to the output transfer path herebelow) of a readout gate region disposed on an immediately downstream side of the charge transfer stage.

(3) The transfer path forming region of the charge transfer stage for which the width of the charge transfer channel is not narrowed has an edge section on an upstream side, the edge section being brought into contact in plan view with an edge section on a downstream side of a readout gate region disposed on an immediately upstream side of the charge transfer stage.

However, when the channel width of the charge transfer channel is too narrow in the area in which the readout gate region is contiguous to the charge transfer channel, even if the conditions (1) to (3) are satisfied, signal charge cannot be easily stored in the pertinent charge transfer stage. The channel width in the section of the channel where the readout gate region is contiguous thereto is desirably about 50% to about 95% of that of the channel in the other section, and is in particular desirably set to about 60% to about 80%.

According to a third aspect of the present invention, there is provided a solid-state image pickup device, comprising; a semiconductor substrate; a large number of photoelectric converters arranged on one surface of said semiconductor substrate in a plurality of columns and a plurality of rows, each of said columns and said rows including a plurality of photoelectric converters, said photoelectric converters in odd ones of said columns being shifted about one half of a pitch $P_1$ in a direction of said column relative to said photoelectric converters in even ones of said columns, said photoelectric converters in odd ones of said rows being shifted about one half of a pitch $P_2$ in a direction of said row relative to said photoelectric converters in even ones of said rows, each said photoelectric converter column including said photoelectric converters of only said odd rows or said even rows; a vertical charge transfer channel provided for each said photoelectric converter column on the surface of said semiconductor substrate, each said channel being adjacent to an associated photoelectric converter column, each said channel including a plurality of sections of different directions lying in a line, said channel generally extending, while meandering in a zigzag shape, in column direction; a plurality of transfer electrodes disposed on the surface of said semiconductor substrate to intersect in plan view said charge transfer channels, each said transfer electrode including a plurality of transfer path forming regions which are equal in number to said charge transfer channels, each said transfer path forming region covering one of said sections of said charge transfer channels, said transfer path forming region and said section disposed thereunder forming one charge transfer stage; each said transfer electrode generally extending in row direction, while two adjacent ones of said transfer electrodes sandwiching one of said photoelectric converter rows therebetween and determining one photoelectric converter region for every second one of said photoelectric converter columns by meeting each other and parting from each other to enclose in plan view every one of said photoelectric converters in said odd or even row; and a readout gate region disposed contiguous to each said photoelectric converter and to an associated one of said charge transfer channels, said readout gate regions being equal to each other in relative positional relationship with said associated photoelectric converter, each said readout gate region associating to one of said photoelectric converter rows being covered in plan view with mutually different ones of said transfer path forming regions of said one transfer electrode associating to said photoelectric converter row.

According to a fourth aspect of the present invention, there is provided a method of driving a solid-state image pickup device of the third aspect, comprising the steps of: reading out, in one vertical blanking period, signal charge stored in each said photoelectric converter of at least part of said photoelectric converter rows, via said associated readout gate region contiguous to said photoelectric converter, to said associated charge transfer channel contiguous to said associated readout gate region; and converting, from the vertical blanking period to a next vertical blanking period subsequent thereto, each said signal charge read out to said charge transfer channel into an image signal and outputting the image signal.

In the solid-state image pickup device of the third aspect, since each readout gate region is arranged as above, the light receiving sections of the respective pixels can be easily formed, although in the shifted-pixel layout, to have a uniform contour, a uniform size, and a uniform direction.

For example, a predetermined number of photoelectric converters each having a hexagonal contour in plan view and a predetermined number of readout gate regions are arranged such that each readout gate region is contiguous to a lower-left edge of each photoelectric converter. The respective photoelectric converters have an almost equal contour, an almost equal size, and an almost equal direction in this configuration. By disposing the photoelectric converters and the readout gate regions as above, the light receiving section of each pixel can be easily formed to have almost uniform contour and size of a hexagonal, and the light receiving sections can be formed to have an almost equal direction.

Resultantly, the light receiving sections of the respective pixels can be easily formed to be substantially equal in contour, size, and direction between two adjacent pixel rows while suppressing decrease in area of the light receiving section of each pixel.

Therefore, the solid-state image pickup device can prevent an event in which the light collecting efficiency and sensitivity of each pixel vary between two adjacent pixel rows even in the shifted-pixel layout. This device makes it possible that the pixel density is easily increased while suppressing the minimization of the area of the light receiving section of each pixel.

BRIEF DESCRIPTION OF THE DRAWINGS

The objects and features of the present invention will become more apparent from the consideration of the following detailed description taken in conjunction with the accompanying drawings in which:

FIGS. 3A and 3B are plan views schematically showing charge transfer channels shown in FIG. 2;

DESCRIPTION OF THE PREFERRED EMBODIMENTS

Figure 1:
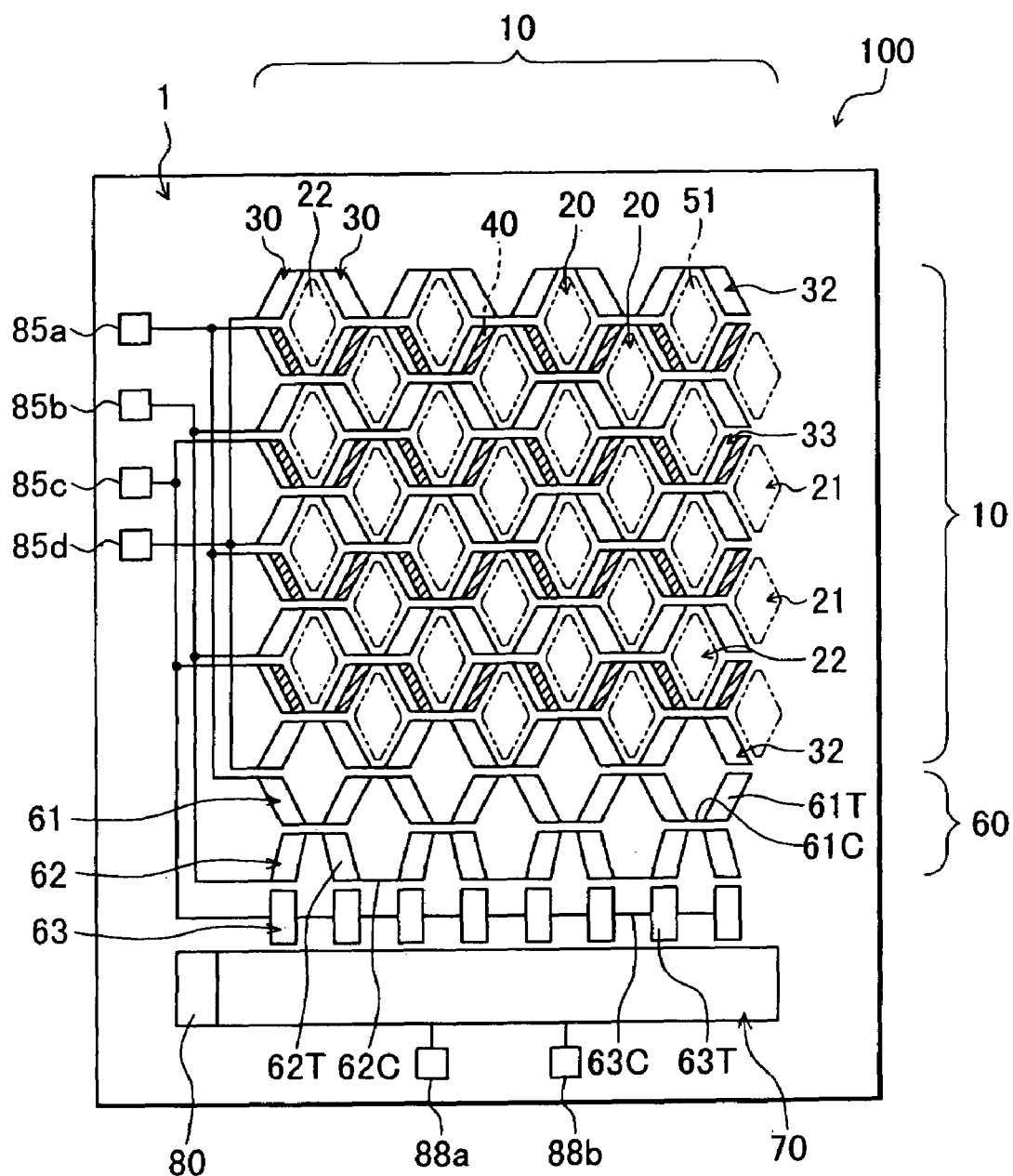
FIG. 1 is a plan view schematically showing an IT-CCD according to a first embodiment.

Referring now to the drawings, description will be given in detail of embodiments according to the present invention.

FIG. 1 schematically shows in plan view an IT-CCD 100 of a first embodiment. The IT-CCD 100 is an IT-CCD of interlace driving type including a plurality of pixels in a shifted-pixel layout.

In this configuration, 32 photoelectric converters 22 in a simplified image are arranged in eight rows and in eight columns in a shifted-pixel layout. An odd photoelectric converter column 20 includes only photoelectric converters of odd rows and an even photoelectric converter column 20 includes only photoelectric converters of even rows.

An actual IT-CCD includes about several hundreds of thousand pixels to several million pixels. In such a configuration, the pixels are arranged in a shifted-pixel layout such that an odd photoelectric converter column 20 includes only photoelectric converters of odd rows and an even photoelectric converter column 20 includes only photoelectric converters of even rows. If a first photoelectric converter column 20 relative to a left-most end of the device shown in FIG. 1 is omitted, an odd photoelectric converter column 20 includes only photoelectric converters of even rows and an even photoelectric converter column 20 includes only photoelectric converters of odd rows.

In the IT-CCD 100, a light sensing section 10 is set up on a surface of a substrate 1, an adjusting section 60 is disposed on an outside of the light sensing section 10, and an output transfer path 70 is formed on an outside of the adjusting section 60. The output transfer path 70 has an end connected to an output portion 80.

Disposed on the surface of the substrate 1 are eight photoelectric converter columns 20, eight photoelectric converter rows 21, eight vertical transfer CCDs 30, and 32 readout gate regions 40 in the light sensing section 10.

Each photoelectric converter column 20 includes four photoelectric converters 22 each including an n-type region in a p-type well, and each photoelectric converter row 20 also includes four photoelectric converters 22.

Each vertical transfer CCD 30 includes one charge transfer channel (not shown in FIG. 1) comprising an n-type region in a p-type well disposed on the surface of the semiconductor substrate 1, five transfer electrodes 32 arranged on the substrate 1 with a insulating film (not shown in FIG. 1) intervening therebetween to intersect the pertinent charge transfer channel in plan view, and four transfer electrodes 33 arranged on the substrate 1 with an insulating film (not shown in FIG. 1) intervening therebetween to intersect the pertinent charge transfer channel in plan view. The transfer electrodes 32 are formed of, for example, a first polycrystalline silicon layer. The transfer electrodes 33 are formed of, for example, a second polycrystalline silicon layer. These transfer electrodes 32 and 33 are alternately disposed.

Each readout gate region 40 is brought into contact with a predetermined photoelectric converter 22 and a predetermined section of the charge transfer channel of an associated vertical transfer CCD 30. In FIG. 1, the readout gate region is hatched for easy understanding thereof.

The adjusting section 60 includes 24 charge transfer stages, which are respectively connected to associated ends of the charge transfer channels of the respective vertical transfer CCDs 30. Each charge transfer stage includes an adjusting charge transfer channel (not shown) continued from the charge transfer channel and either one of three transfer electrodes 61 to 63 arranged on the substrate 1 to intersect the adjusting charge transfer channel in plan view. At each of the intersections between the adjusting charge transfer channel and the transfer electrodes 61 to 63 in plan view, one charge transfer stage is fabricated.

The transfer electrode 61 includes a transfer path forming region or section 61T at each of the intersections between the electrode 61 and each adjusting charge transfer channel in plan view. These transfer path forming regions 61T are coupled with each other via a connecting region 61C. The transfer electrode 62 includes a transfer path forming region or section 62T at each of the intersections between the electrode 62 and each adjusting charge transfer channel in plan view. These regions 62T are link with each other via a connecting region 62C. The transfer electrode 63 includes a transfer path forming region or section 63T at each of the intersections between the electrode 63 and each adjusting charge transfer channel in plan view. These regions 63T are connected to each other via a connecting region 63C. This also applies to the transfer electrodes 32 and 33 formed in the light sensing section 10, which will be described later.

Each adjusting charge transfer channel extends in a direction, which longitudinally intersects in plan view the transfer path forming regions 61T, 62T, and 63T.

For easy discrimination of the transfer electrode 32 nearest to the adjusting section 60, the transfer electrodes 61, 62, and 63, these electrodes are separated from each other in FIG. 1. However, the transfer electrode 32 nearest to the adjuster 60 and the transfer electrode 61 are overlapped with each other in plan view in at least an edge section on a downstream side (on the side of the output transfer path 70) of the transfer path forming region 32T and in an edge section on an upstream side (on the side of the light sensing section 10) of the transfer path forming region 61T. This is also the case of a combination of the transfer electrodes 61 and 62 and a combination of the transfer electrodes 62 and 63. These transfer electrodes are mutually isolated from each other by an electrically insulating film.

The adjusting section 60 changes the transfer direction of signal charge transferred by each vertical transfer CCD 30 and adjusts the pitch of two adjacent charge transfer paths to a constant value.

The output transfer path 70 receives signal charge sent from each vertical transfer CCD 30 via the adjusting section 60 and sequentially transfers the signal charge in the row direction to the output portion 80.

The output portion 80 converts signal charge sent from the output transfer path 70 into a signal voltage using floating capacity (not shown) and amplifies the signal voltage by, for example, a source follower circuit (not shown). After the detection (conversion), the signal charge is absorbed in a power source (not shown) via a reset transistor (not shown).

To supply predetermined driving pulses to each of the transfer electrodes 32, 33, and 61 to 63, four pulse supply terminals 85a to 85d are arranged on an outer side of the light sensing section 10.

To supply four-phase driving pulses, each of the terminals 85a to 85d is electrically connected to every fourth one of the transfer electrodes 32, 33, 61, 62, and 63 which are formed in a region ranging from an upper end side of the light sensing section 10 (a farthest side to the output transfer path 70) to a lower end side of the adjusting section 60 (a nearest side to the path 70).

To supply predetermined driving pulses to the output transfer path 70, two pulse supply terminals 88a and 88b are disposed on an outer side of the light sensing section 10.

FIG. 1 further includes openings 51 disposed in a light shielding film 50, which will be described later.

Referring now to FIGS. 2, 3A, 3B, 4, 5, 6A, and 6B, description will be given of structure of the light sensing section 10 in an example including a semiconductor substrate 1. The substrate 1 is an n-type silicon substrate including a p-type well. However, the present invention is not restricted by this example.

Figure 2:
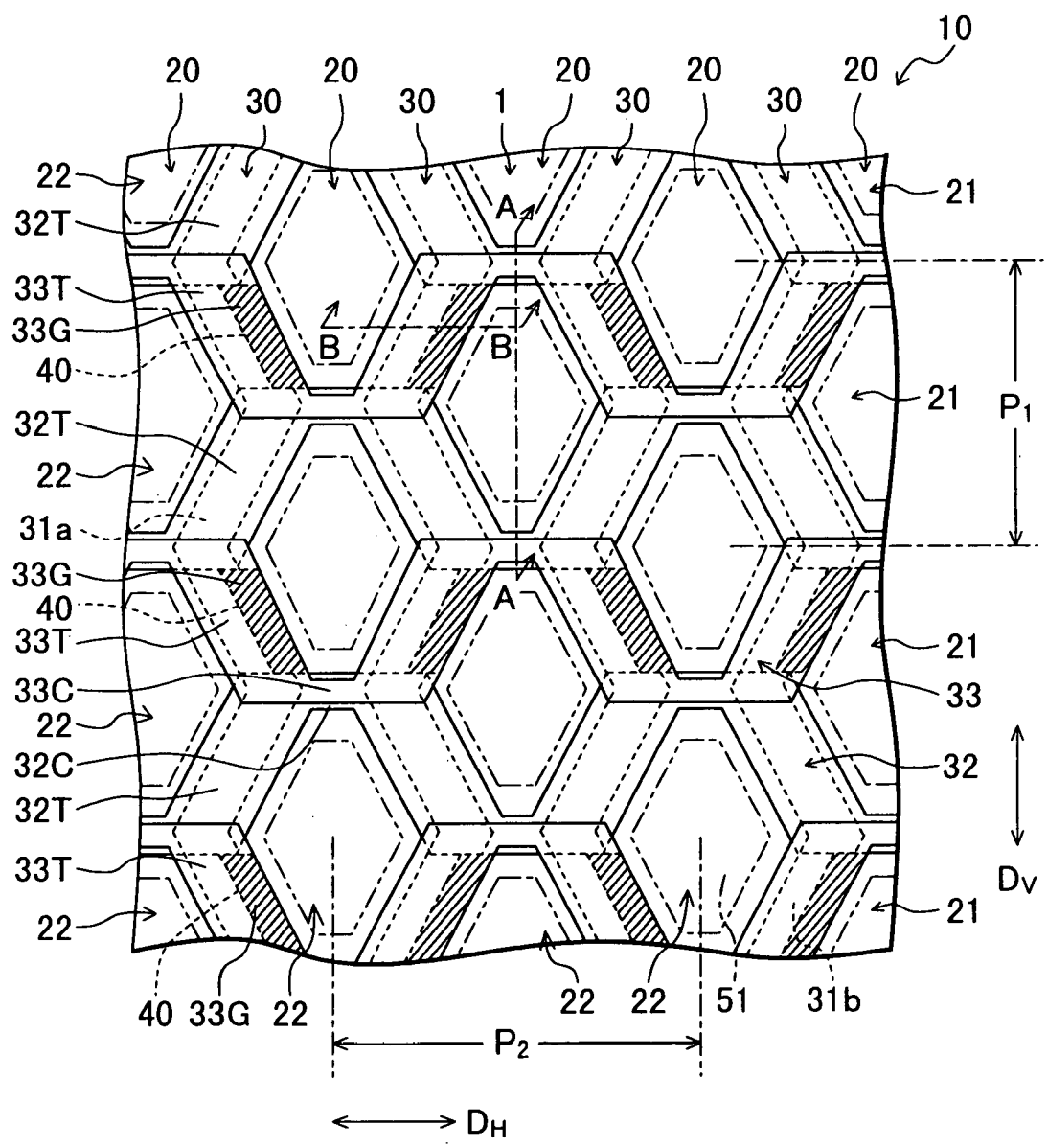
FIG. 2 is a magnified plan view showing a light sensing section of the IT-CCD shown in FIG. 1.

FIG. 2 is a plan view showing a magnified image of part of the section 10 shown in FIG. 1;

FIG. 3A schematically shows in plan view a charge transfer channel 31a shown in FIG. 2. FIG. 3B shows in a schematic plan view a charge transfer channel 31b shown in FIG. 2.

Figure 4:
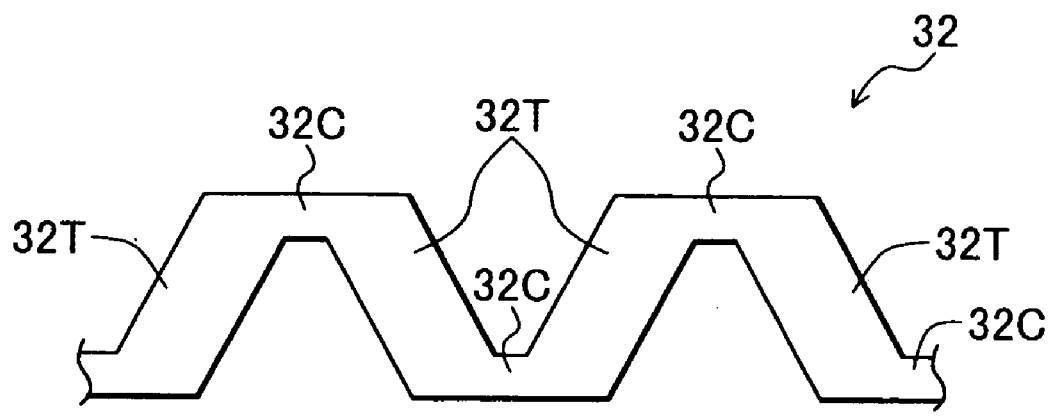
FIG. 4 is a plan view schematically showing one of transfer electrodes 32 shown in FIG. 2.

FIG. 4 is a plan view schematically showing one of the transfer electrodes 32.

Figure 5:
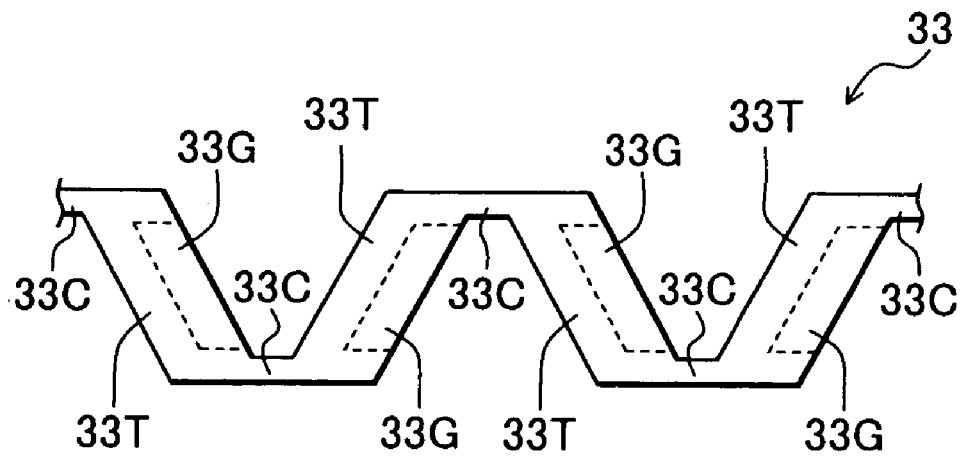
FIG. 5 is a plan view schematically showing one of transfer electrodes 33 shown in FIG. 2.

FIG. 5 schematically shows in plan view one of the transfer electrodes 33.

Figure 6A:
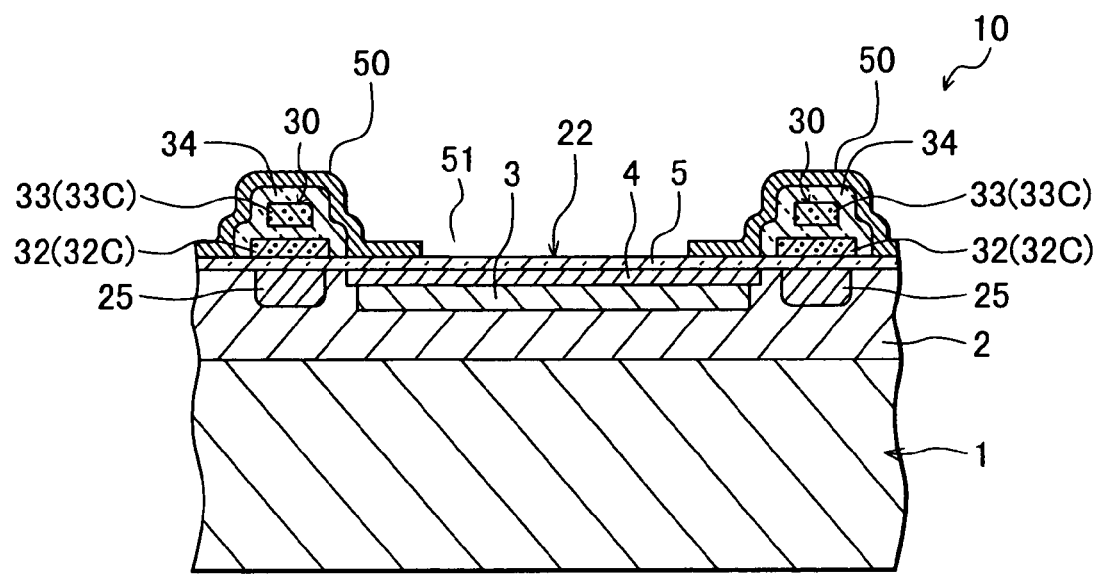
FIG. 6A is a cross-sectional view of FIG. 2 taken along line A—A.
Figure 6B:
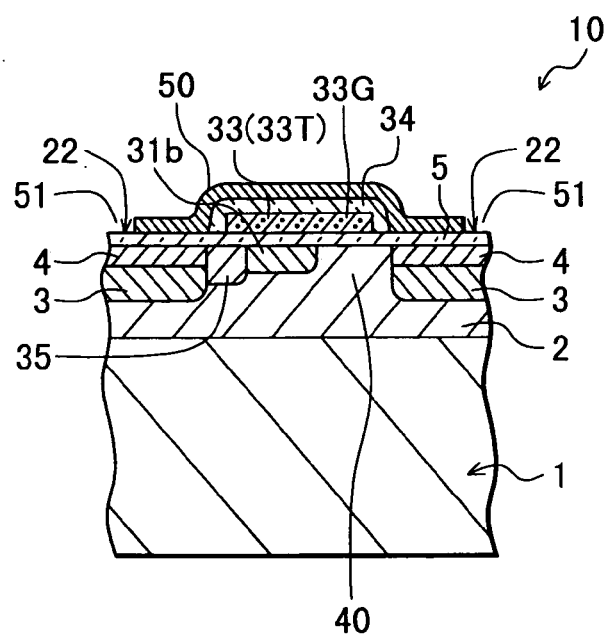
FIG. 6B is a cross-sectional view of FIG. 2 taken along line B—B.

FIGS. 6A and 6B are cross-sectional views of FIG. 2 taken along lines A—A and B—B, respectively.

As can be seen from FIG. 2, each photoelectric converter column 20 formed in the light sensing section 10 includes a predetermined number of photoelectric converters (signal charge storage regions) 22 with a constant pitch $P_1$ in a column direction $D_V$ (indicated by an arrow mark in FIG. 2). Each photoelectric converter row 21 formed in the section 10 includes a predetermined number of photoelectric converters (signal charge storage regions) 22 with a constant pitch $P_2$ in a row direction $D_H$ (indicated by an arrow mark in FIG. 2).

Each photoelectric converter 22 of an even photoelectric converter column 20 is shifted relative to an associated photoelectric converter 22 of an odd photoelectric converter column 20 by about one half of the pitch $P_1$ in the column direction $D_V$ (FIG. 2). Analogously, each photoelectric converter 22 of an even photoelectric converter row 21 is shifted relative to an associated photoelectric converter 22 of an odd photoelectric converter row 21 by about one half of the pitch $P_2$ in the row direction $D_H$ (FIG. 2).

In this specification, "about one half of the pitch $P_1$" includes, in addition to $P_1/2$, any value which is different from $P_1/2$ because of factors such as a manufacturing error, a rounding error of a pixel position appearing in a design phase or a mask fabrication process, or the like and which nevertheless can be regarded as substantially equivalent to $P_1/2$ in consideration of obtained performance of the IT-CCD and picture quality thereof. This also applies to "about one half of the pitch $P_2$" in this specification.

Each photoelectric converter 22 has substantially a hexagonal shape in plan view, and the photoelectric converters 22 are substantially equal in size to each other.

Four charge transfer channels 31a and four charge transfer channels 31b of two types are alternately disposed in the row direction $D_H$ (FIG. 2). These channels 31a and 31b are almost axially symmetric in contour in plan view. Excepting the right-most (in FIG. 1) photoelectric converter column 20, each photoelectric converter column 20 is arranged between two charge transfer channels 31a and 31b adjacent to each other.

As shown in FIGS. 2, 3A, and 3B, each of the charge transfer channels 31a and 31b includes a plurality of sections lying in a line. Each section has a direction different from that of the next section such that the channel generally shows a zigzag shape extended in the column direction $D_V$. The channels 31a and 31b have an equal number of sections. In each channel, every second section has a narrow channel width (for every second photoelectric converter row). In both channels 31a and 31b, the region of such a narrow width is formed in sections which each equally numbered in the channels 31a and 31b beginning at the upper end side of the light sensing section 10 (the farthest side from the output transfer path 70). Contiguous to each region of the narrow width, a readout gate region 40 is arranged. Each region 40 is contiguous also to a predetermined photoelectric converter 22.

In FIGS. 3A and 3B, the channels 31a and 31b includes sections $R_1$, $R_2$, $R_3$, . . . , $R_6$.

Two types of transfer electrodes 32 and 33 are disposed to intersect respectively the channels 31a and 31b in plan view (FIG. 2). Each of the transfer electrodes 32 and 33 includes transfer path forming regions 32T or 33T as many as there are charge transfer channels 31a and 31b.

As can be seen from FIG. 2 or 4, the transfer path forming regions 32T are coupled via a connecting region 32C to each other in the row direction $D_H$ in the transfer electrode 32. Two regions 32T coupled via one connecting region 32C with each other are symmetric with respect to plane. Each transfer path forming region 32T covers in plan view one of the narrow regions of the channels 31a and 31b. The region 32T and the narrow region of the channel 31a or 31b constitute one charge transfer stage.

In the transfer electrode 33, the transfer path forming regions 33T are linked via a connecting region 33C to each other in the row direction $D_H$ in the transfer electrode 33 as shown in FIG. 2 or 5. Two regions 33T connected via one connecting region 33C to each other are symmetric with respect to plane. Each transfer path forming region 33T covers in plan view one of the narrow regions of the channels 31a and 31b. The region 33T and the narrow region of the channel 31a or 31b constitute one charge transfer stage.

Each transfer path forming region 33T individually covers also one readout gate region 40 in plan view. In the region 33T over the region 40 in plan view serves as a readout gate electrode region 33G to read signal charge from the associated photoelectric converters 22 (FIG. 5).

The charge transfer stage including the transfer path forming region 32T and that including the transfer path forming region 33T are alternately arranged in the column direction $D_V$ to configure one vertical transfer CCD 30 (FIG. 2). Each charge transfer stage of the CCD 30 has a direction different from that of the next stage such that the stages generally shows a zigzag shape extended in the column direction $D_V$ (FIG. 2).

When two adjacent transfer electrodes 32 and 33 intersect one photoelectric converter column 20, the electrodes 32 and 33 overlap with each other in the connecting regions 32C and 33C. When the electrodes 32 and 33 intersect a photoelectric converter column 20 adjacent to the column 20 above, the electrodes 32 and 33 are separated from each other to enclose in plan view one photoelectric converter 22 of the pertinent column 20. The two transfer electrodes 32 and 33 are formed repeatedly in this pattern of "meeting and parting" and generally extend in the row direction $D_H$ (FIG. 2).

In the constitution shown in FIG. 1, viewed from an upper side of the light sensing section 10, when two adjacent transfer electrodes are the transfer electrodes 32 and 33, these electrodes 32 and 33 enclose in plan view each photoelectric converter 22 of the odd columns. On the other hand, when two adjacent transfer electrodes are the transfer electrodes 33 and 32, these electrodes 33 and 32 enclose in plan view each photoelectric converter 22 of the even columns.

Two adjacent transfer electrodes 32 and 33 described above enclose in plan view one photoelectric converter 22 at each location at which the electrodes 32 and 33 are separated from each other. This resultantly defines one photoelectric converter region having a hexagonal contour or a substantially hexagonal contour. These photoelectric converter regions are substantially equal in contour, size, and direction to each other. The transfer electrodes 32 and 33 are configured generally in a honeycomb layout (FIG. 2).

Each photoelectric converter region is defined in plan view by one connecting region 32C, two transfer path forming regions 32T adjacent via the region 32C to each other, one connecting region 33C, and two transfer path forming regions 33T adjacent via the region 33C to each other.

For easy discrimination between the transfer electrodes 32 and 33, these electrodes 32 and 33 are separated from each other in FIG. 1. However, as shown in FIG. 2, the transfer electrodes 32 and 33 overlap with each other in the connecting regions 32C and 33C and the transfer path forming regions 32T and 33T.

When the vertical transfer CCD 30 is not arranged on the left side of the photoelectric converter column 20 at the left end of the light sensing section 10 (the left end of FIG. 1), each photoelectric converter 22 of the pertinent column 20 need not be enclosed by two adjacent transfer electrodes 32 and 33 in plan view. That is, the transfer path forming regions 32T and 33T required to enclose in plan view each photoelectric converter 22 of the left-most column 20 can be dispensed with. Additionally, the left-most connecting regions 32C and 33C can be also removed. This also applies to a case in which the vertical transfer CCD 30 is not arranged on the right side of the right-most photoelectric converter column 20 in the light sensing section 10 (FIG. 1).

As can be seen from FIGS. 6A and 6B, the photoelectric converter 22 is, for example, a photodiode of burried type including a predetermined region of a p-type well 2 formed on one surface of a semiconductor substrate 1, an n-type region 3 formed in the predetermined region, and a p$^+$-type layer 4 disposed as an burring region in the n-type region 3. The n-type region 3 serves as a signal charge storage region. On the p$^+$-type layer 4, an insulating film (silicon oxide file) 5 is disposed. Two adjacent photoelectric converters 22 in the column direction D$_V$ are separated from each other by a channel stop region 25 (FIG. 6A) comprising, for example, a p$^+$-type layer.

The charge transfer channels 31a and 31b are arranged by forming, for example, an n-type region at predetermined locations of the p-type well 2 on the substrate 1. The channels 31a and 31b are electrically isolated from the photoelectric converters 22 in other than the location of the readout gate regions 40 by a channel stop region 35 (FIG. 6B) comprising, for example, a p$^+$-type layer.

The transfer electrode 32 is made of, for example, a first polycrystalline silicon layer formed on the substrate 1 with the insulating film 5 intervening therebetween. Each transfer electrode 32 is coated with an insulating layer made of a silicon oxide or the like.

The transfer electrode 33 is made of, for example, a second polycrystalline silicon layer. Each electrode 33 is covered with an insulating film, which will be described later. For easy understanding, the electrodes 32 and 33 are covered with one insulating layer 34 in FIGS. 6A and 6B.

Each readout gate region 40 (FIG. 6B) comprises, for example, a predetermined region of the p-type well 2 on the substrate 1. The readout gate electrode region 33G is formed on the readout gate region 40 with the insulating film 5 intervening therebetween.

FIGS. 6A and 6B includes a light shielding film 50, which will be described later. FIGS. 1, 2, 6A, and 6B include openings 51 disposed in the film 50.

In the IT-CCD 100 including the light sensing section 10, one pixel is configured using (a) one photoelectric converter 22, (b) two charge transfer stages of the vertical transfer CCD 30 adjacent to the converter 22 shown on the left-hand side of FIG. 2, i.e., a charge transfer stage including the transfer path forming region 32T and a cha rge transfer stage including the transfer path forming region 33T, and (c) a readout gate region 40 arranged between the photoelectric converter 22 and the charge transfer stage including the transfer path forming region 33T.

As described above, to prevent unnecessary photoelectric conversion in the respective vertical transfer CCDs 30 of the IT-CCD, the region ranging from the light sensing section 10 to the output transfer path 70 is coated with the light shielding film 50 in plan view.

As can be seen from FIGS. 6A and 6B, the light shielding film 50 has openings 51 each having a predetermined contour on respective photoelectric converters 22 in the light sensing section 10. One opening 51 is disposed for each photoelectric converter 22. Each opening 51 is within a peripheral edge in plan view of the signal charge storage region (n-type region 3) of the converter 22. The converter 22 has a section exposed in the opening 51 in plan view, the section serving as a light receiving section (this section will be referred to as "light receiving section 51" in some cases herebelow).

The light shielding film 50 is made of, for example, a metallic film of aluminum, chromium, wolfram, titanium, molybdenum, or the like or a film of an alloy including at least two kinds of the metals above. Alternatively, the film 50 is made of a multilayer film including a combination of metals above or a combination of metals above and alloys above.

Each opening (light receiving section) 51 is substantially a hexagonal shape in plan view. The hexagon is axially symmetric with respect to the column direction D$_V$ and the row direction D$_H$. These openings 51 are mutually and substantially equal in contour, size and direction to each other.

Light incident through the opening 51 to the photoelectric converter 22 is photoelectrically converted by the converter 22 into signal charge. The signal charge is fed from the n-type region 3 as the signal charge storage region of the converter 22 via the readout gate region 40 contiguous to the converter 22 to the vertical transfer CCD 30. At this point of time, a predetermined field shift pulse (readout pulse) is applied to the transfer electrode 33 (readout gate electrode region 33G).

The signal charge read out to the CCD 30 is sequentially transferred through the charge transfer stages of the CCD 30 to be delivered via the adjusting section 60 to the output transfer path 70 (FIG. 1).

Figure 7:
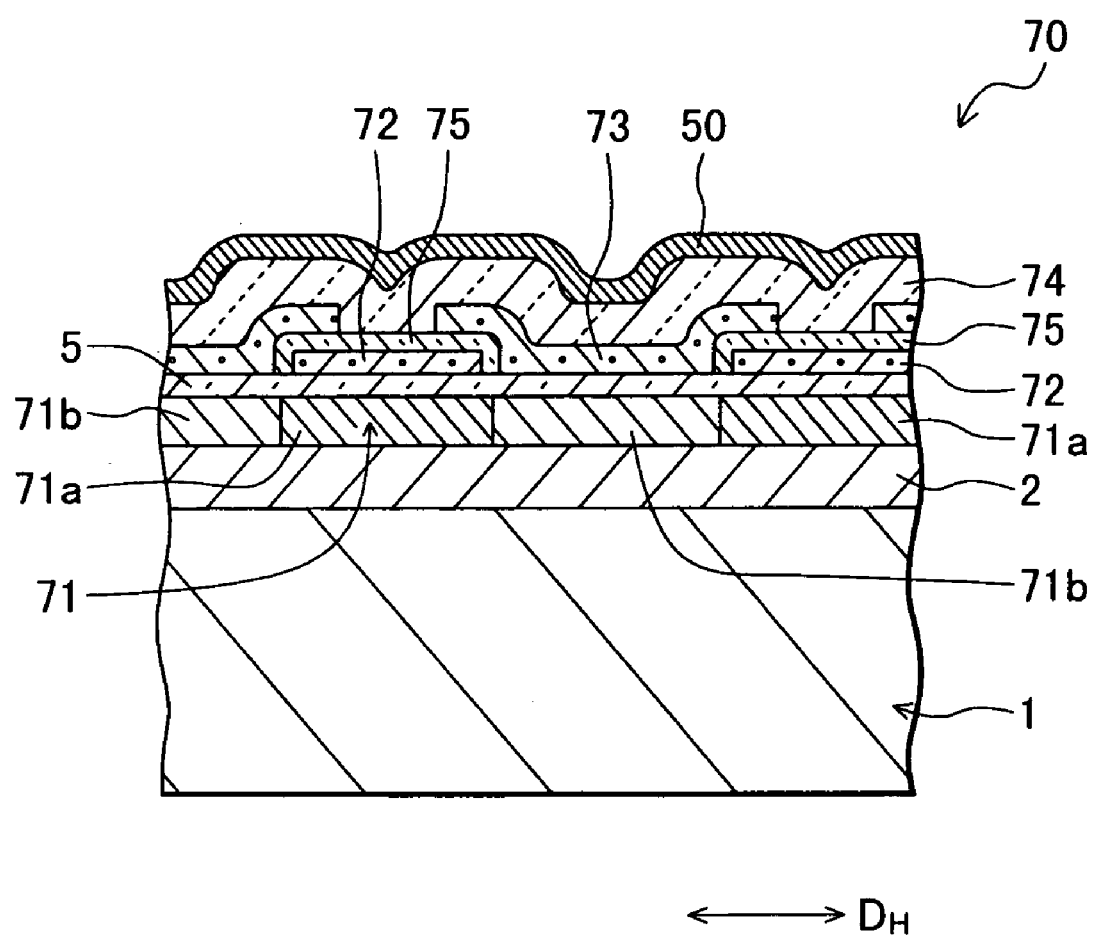
FIG. 7 is a cross-sectional view schematically showing an example of an output transfer path in the IT-CCD of the first embodiment.

FIG. 7 schematically shows in a cross-sectional view an example of the output transfer path 70. The path 70 is comprised of a CCD of two-phase driving type with two-layer polycrystalline silicone electrodes.

In FIG. 7, the same constituent components as those shown in FIG. 6 are assigned with the same reference numerals and duplicated description thereof will be avoided.

The output transfer path (horizontal transfer CCD) 70 shown in FIG. 7 includes one charge transfer channel 71 formed on a semiconductor substrate 1, a plurality of transfer electrodes 72 and 73 disposed on the substrate 1 with an insulating film (silicon oxide film) 5 intervening therebetween, an insulating film 74 manufactured on the transfer electrodes 72 and 73, and a light shielding film 50 disposed on the insulating film 74.

The charge transfer channel 71 includes an n+-type region 71a having a high concentration of n-type impurity and an n-type region 71b having a low concentration of n-type impurity, the regions 71a and 71b being alternately fabricated at predetermined locations in a p-type well 2 formed on one surface of the substrate 1. The channel 71 extends in the row direction $D_H$.

Each transfer electrode 72 is made of a polycrystalline silicon layer. Disposed on a surface of the electrodes 72 is a film of silicone oxide 75. The electrode 72 is arranged on each n+-type region 71a. Each transfer electrode 73 is also made of a polycrystalline silicon layer. The electrode 73 is arranged on each n-type region 71b.

The transfer electrodes 72 and 73 are arranged to intersect the charge transfer channel 71. Respective end sections on the side of the electrode 72 of the electrodes 73 are disposed over the electrodes 72. That is, the electrodes 72 and 73 are in a so-called overlapping transfer electrode configuration.

One n+-type region 71a and one transfer electrode 72 disposed over the region 71a with the insulating (silicon oxide) film 5 intervening therebetween constitute one potential well region. Similarly, one n-type region 71b and one transfer electrode 73 arranged over the region 71b with the insulating film 5 intervening therebetween constitute one potential barrier region.

One charge transfer stage is configured by applying a voltage of a predetermined level to the transfer electrode 73 forming one potential barrier region and to the transfer electrode 72 constituting one potential well region immediately downstream (the side of the output portion 80) of the potential barrier.

In the output transfer path 70, two charge transfer stages are disposed for one vertical transfer CCD 30. In the path 70, one CCD 30 is connected via the adjusting section 60 to every second charge transfer stage of the output transfer path 70.

Signal charge transferred from the CCD 30 via the adjuster 60 is received by the output transfer path 70 in the potential well region of the path 70.

The insulating film 74 protects the transfer electrodes 72 and 73 and electrically insulates the light shielding film 50. The film 74 is composed of, for example, a film of silicon oxide, a two-layer film including a film of silicon oxide and a film of silicon nitride, or a three-layer film including a film of silicon oxide, a film of silicon nitride, and a film of silicon oxide.

The light shielding film 50 hinders light from entering the pertinent output transfer path 70 and the like to prevent unnecessary photoelectric conversion in the path 70 and the like.

The signal charge sequentially transferred through the path 70 is delivered to the output portion 80 (FIG. 1) to be converted into a signal voltage. The signal voltage is amplified therein and is outputted to a predetermined circuit.

In the IT-CCD 100 above, the charge transfer channel 31a or 31b is narrower in a section thereof which is contiguous to the readout gate region 40 than in other sections thereof (FIG. 3). The IT-CCD 100 therefore provides advantages as follows.

Even when the width of the transfer path forming region 33T of the transfer electrode 33 is not larger than that of the transfer path forming region 32T of the transfer electrode 32, it is possible to reserve, in the transfer path forming region 33T, a region as a transfer path forming region for the vertical transfer CCD 30 and a region as the readout gate electrode region 33G. Resultantly, the area of the photoelectric converter region defined for every second photoelectric converter column 20 by two adjacent transfer electrodes 32 and 33 can be easily increased. Accordingly, the area of the opening (light receiving section) 51 can be easily enlarged while keeping unchanged the contour, the size, and the direction of the openings 51 of the pixels for two adjacent pixel rows.

Consequently, the IT-CCD 100 can easily prevent the event in which the light collecting efficiency and sensitivity of each pixel vary between two adjacent pixel rows. The pixel density can be easily increased while preventing the minimization of the area of each opening (light receiving section) 51.

As above, the charge transfer stage having a narrowed width of the channel 31a or 31b and that having an original width of the charge transfer channel 31a or 31b are alternately formed for each vertical transfer CCD 30. One charge transfer stage having the original width exists between two adjacent readout gate regions 40 along one charge transfer channel 31a or 31b.

It is therefore possible to minimize the disadvantage caused by the reduction of the channel width in the section contiguous to the readout gate region 40 as shown in FIG. 3. The charge transfer stage having a narrowed width of the channel 31a or 31b need only store signal charge for a short period of time and need transfer the signal to a subsequent charge transfer stage. The channel width in the charge transfer stage having the narrowed width is favorably about 50% to about 95% of the channel width of the section of the channel 31a or 31b apart from the readout gate region 40 and is most favorably about 60% to about 80% thereof.

To drive the IT-CCD 100 shown in FIG. 1, a drive pulse supplier is employed to feed predetermined driving pulses to the respective transfer electrodes 32, 33, and 61 to 63 and the output transfer path 70.

Description will be given of an example of a method of driving the IT-CCD 100. This example is interlaced driving in which one frame is divided into two fields including a first field and a second field.

Figure 8:
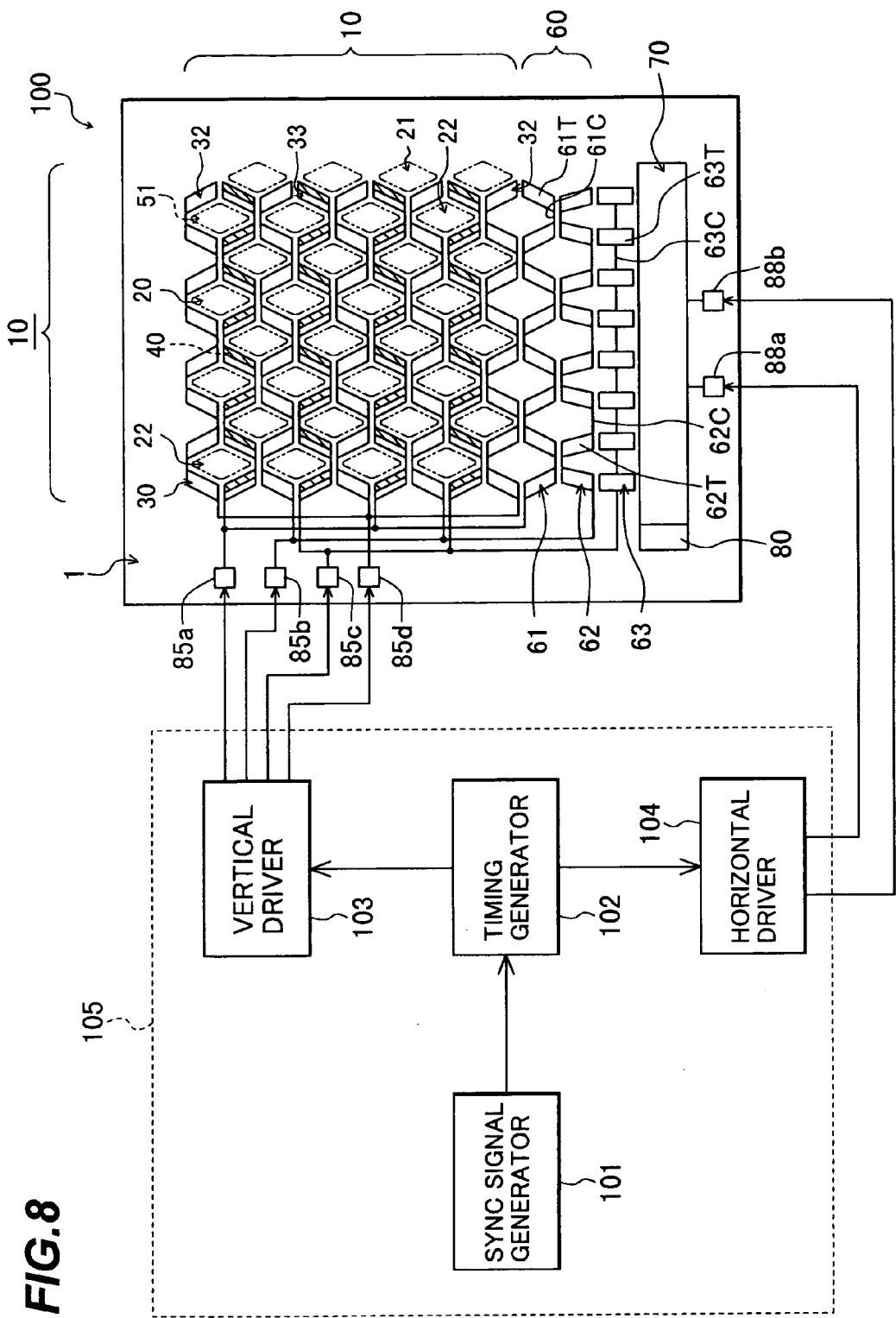
FIG. 8 is a schematic diagram showing a relationship between the IT-CCD of FIG. 1 and a driving pulse supplier to conduct interlace driving of the IT-CCD.

The pulse supplier 105 to drive the IT-CCD 100 includes as shown in FIG. 8, for example, a sync signal generator 101, a timing generator 102, a vertical driver circuit 103, and a horizontal driver circuit 104.

The sync signal generator 101 generates various pulses necessary for signal processing such as a vertical sync pulse and a horizontal sync pulse. The timing generator 102 generate timing signals for four-phase vertical pulse signals necessary to drive the vertical transfer CCD 30, a field shift pulse necessary to read out signal charge from the photoelectric converter 22, and two-phase horizontal pulse signals necessary to drive the output transfer path 70.

The vertical driver circuit 103 generates vertical pulse signals according to the timing signals above and feeds the signals via the pulse supply terminals 85a to 85d to predetermined transfer electrodes 32, 33, 61, 62, and 63. The horizontal driver circuit 104 generates horizontal pulse signals according to the timing signals above and sends the signals via the pulse supply terminals 88a and 88b to the output transfer path 70.

Assume that the vertical pulse signals applied respectively to the terminals 85a, 85b, 85c, and 85d are represented as $V_a$, $V_b$, $V_c$, and $V_d$, respectively. The horizontal pulse signals applied respectively to the terminals 88a and 88b are denoted as $H_a$ and $H_b$, respectively. The signals $H_a$ and $H_b$ are shifted $\pi$ in phase from each other.

At an appropriate time in a In afirst vertical blanking period determined by a blanking pulse, a low-level vertical pulse $V_L$ is applied to the terminals 85a and 85b and a high-level vertical pulse $V_H$ is applied to the terminals 85c and 85d. While these vertical pulses are being applied thereto, a higher-level field shift pulse $V_R$ is applied to the terminal 85c. In response to the pulse $V_R$, signal charge respectively stored in the photoelectric converters 22 of first, second, fifth, and sixth pixel rows is read out to the vertical transfer CCDs 30 respectively corresponding thereto (signal charge readout process).

In this description, "a pixel row" means a group of pixels arranged in series in the row direction $D_H$. The pixel rows are called a first pixel row, a second pixel row, . . . , an n-th pixel row (n is a positive integer) beginning at the pixel row nearest to the output transfer path 70. This also applies to the solid-state image pickup device of the other embodiments. One pixel row includes one photoelectric converter row 21 (FIG. 1). The IT-CCD 100 includes eight pixel rows including the first to eighth pixel rows.

After the field shift pulse $V_R$ is applied to the terminal, the vertical pulse signals $V_a$, $V_b$, $V_c$, and $V_d$ respectively having predetermined waveforms are fed to the terminals 85a to 85d. The signal charge read out to the CCD 30 is sequentially transferred to the output transfer path 70.

The signal charge read from each photoelectric converter 22 of the first and second pixel rows is transferred to the output transfer path 70 during a first horizontal blanking period following the vertical blanking period. The signal charge is sequentially outputted from the output portion 80 during a first effective signal period following the first horizontal blanking period. In this operation, the image signal from the second pixel row and that from the first pixel row are alternately outputted in a unit of pixel or for each pixel (image signal output process).

Signal charge read out of each photoelectric converter 22 of the fifth and sixth pixel rows is transferred to the output transfer path 70 during a second horizontal blanking period following the first effective signal period. The signal charge is sequentially delivered from the output portion 80 during a second effective signal period following the second horizontal blanking period. In this situation, the image signal from the sixth pixel row and that from the fifth pixel row are alternately outputted in the pixel unit (image signal output process).

At an appropriate time in a second vertical blanking period determined by a blanking pulse after termination of the second effective signal period, a high-level vertical pulse $V_H$ is applied to the terminals 85a and 85b and a low-level vertical pulse $V_L$ is fed to the terminals 85c and 85d. While these vertical pulses are being applied thereto, a field shift pulse $V_R$ is applied to the terminal 85a. In response to the pulse $V_R$, signal charge respectively stored in each photoelectric converter 22 of third, fourth, seventh, and eighth pixel rows is read out to the vertical transfer CCDs 30 respectively corresponding thereto (signal charge readout process).

The signal charge read out of each photoelectric converter 22 of the third and fourth pixel rows is transferred to the output transfer path 70 during a third horizontal blanking period following the second vertical blanking period. The signal charge is sequentially outputted from the output portion 80 during a third effective signal period following the third horizontal blanking period. In this case, the image signal from the fourth pixel row and that from the third pixel row are alternately outputted in a unit of pixel (image signal output process).

Signal charge read out of each photoelectric converter 22 of the seventh and eighth pixel rows is transferred to the output transfer path 70 during a fourth horizontal blanking period following the third effective signal period. The signal charge is sequentially delivered from the output portion 80 during a fourth effective signal period following the fourth horizontal blanking period. In this situation, the image signal from the eighth pixel row and that from the seventh pixel row are alternately outputted in the pixel unit (image signal output process).

By repeatedly executing the operation (processes) above ranging from the first vertical blanking period to the fourth effective signal period, interlaced image signals, namely, image signals of each field are sequentially outputted from the output portion 80.

By disposing a color filter array on the IT-CCD 100, there is implemented an IT-CCD for color images.

In a camera requiring a color image signal for each field, color signal processing is executed for an image output signal of each field outputted from the output portion 80 to obtain a color image signal of each field.

In a camera requiring a color image signal for each frame, image output signals of two successive fields are once stored in a frame memory and the color signal processing is executed for the image signals of one frame to produce a frame of color image signals. In this operation, a mechanical shutter is favorably used to prevent the exposure time from varying between respective fields. After termination of the first vertical blanking period, the mechanical shutter is kept closed to prevent light from entering the pixels by the second vertical blanking period is started. As a result, for each of the first and second fields, a field image output signal at an identical time can be obtained. This also applies to a camera requiring a frame of monochrome image signals. In a camera requiring only one sheet of frame image, the mechanical shutter is kept closed after the first vertical blanking period is terminated. This prevents smear from appearing in the image of the second field.

The IT-CCD 100 of the first embodiment described above is an IT-CCD of a simple configuration. In an actual IT-CCD, a plurality of microlenses are ordinarily arranged to improve photoelectric conversion efficiency of each photoelectric converter 22. In an IT-CCD for color images, a color filter array is disposed.

To form the microlenses, a planarizing film is first disposed on the light sensing section 10. The planarizing film is also used as a focus adjusting layer. In an IT-CCD for monochrome images, a microlens array including a predetermined number of microlenses is disposed on a surface of the planarizing film. On the other hand, in an IT-CCD for color images, a color filter array is formed on the planarizing film. Therefore, after a second planarizing film is arranged on the color filter array, the microlenses are formed on the second planarizing film. In the IT-CCD for monochrome images and the IT-CCD for color images, each microlens is disposed to individually cover the light receiving section of an associated pixel in plan view.

Figure 9A:
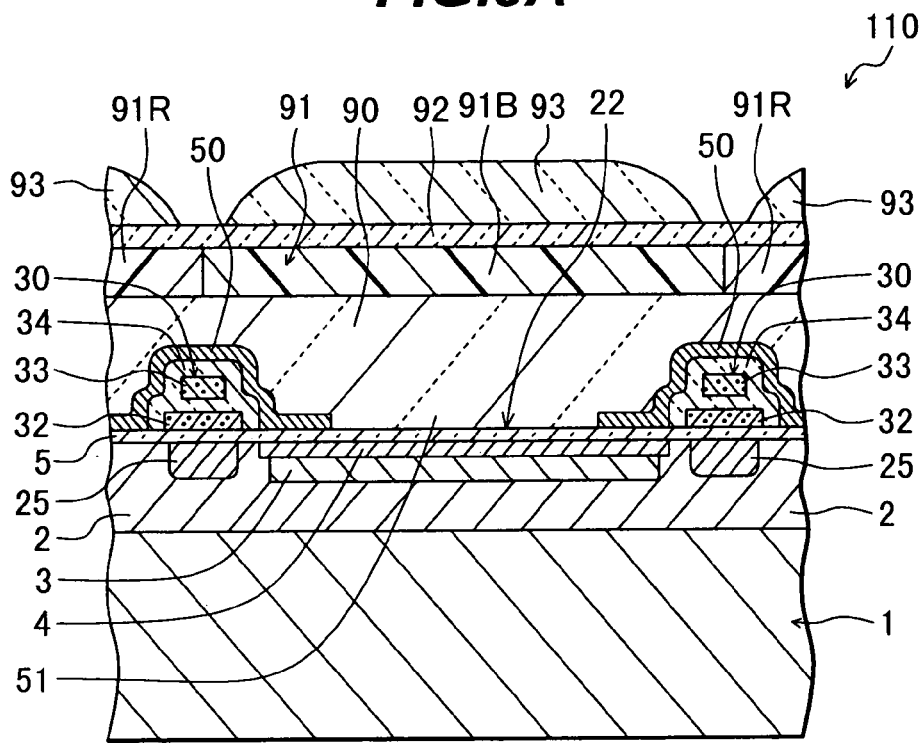
FIGS. 9A and 9B are cross-sectional views schematically showing an IT-CCD according to a second embodiment.
Figure 9B:
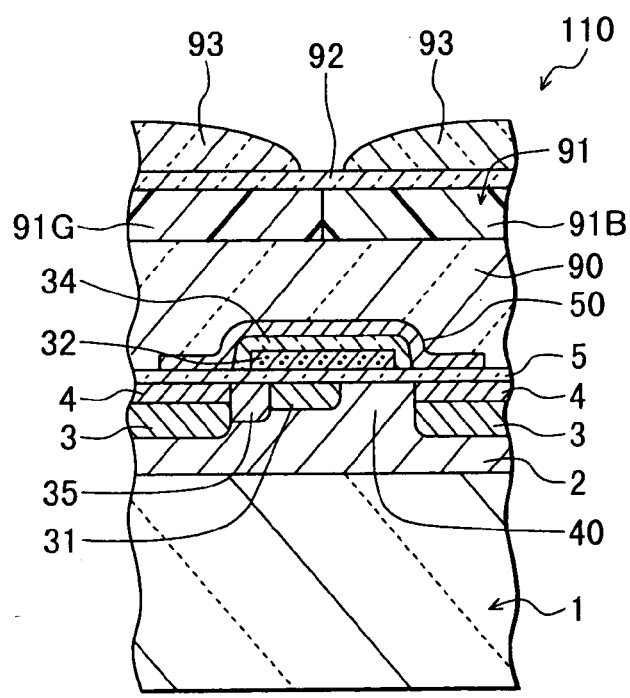

FIGS. 9A and 9B are cross-sectional views partly showing the IT-CCD 110 of the second embodiment. These diagrams show part of the light sensing section of the IT-CCD 110. The IT-CCD 110 is implemented by adding a color filter array and a microlens array to the IT-CCD 100 of the first embodiment. The IT-CCD 110 is namely an IT-CCD to produce color images.

In FIG. 9A or 9B, the same constituent components as those shown in FIG. 6A or 6B are assigned with the same reference numerals and duplicated description thereof will be avoided.

In the IT-CCD 110, a first planarizing film 90 is disposed to cover a light shielding film 50 on the light sensing section and the light receiving section 51 of each pixel. Formed on a surface of the first planarizing film 90 is a color filter array 91. On the color filter array 91, a second planarizing film 92 is disposed. A microlens array including a predetermined number of microlenses 93 is disposed on a surface of the second planarizing film 92.

The first planarizing film 90 is arranged by coating the pertinent area with a transparent resin, for example, photoresist having a desired thickness, for example, by spin coating.

The color filter array 91 includes, for example, a red filter 91R, a green filter 91G, and a blue filter 91B in a predetermined pattern. The color filter array 91 can be arranged by forming at a predetermined location a layer of resin mixed with a desired color of pigment or dye, for example, by photolithography.

As described in conjunction with the IT-CCD 100 of the first embodiment, each of the transfer electrodes 32 and 33 is arranged in a honeycomb layout. Each photoelectric converter 22 exists in plan view in a photoelectric converter region defined by two adjacent transfer electrodes 32 and 33 in every second photoelectric converter column. Therefore, the red, green, and blue filters 91R, 91G, and 91B are arranged in a hexagonal pattern in the color filter array 91.

In the array 91, an allocation pattern is selected for each color filter for the following purpose. In the IT-CCD having the color filter array 91, signal charge stored in each photoelectric converter of predetermined two pixel rows, for example, two adjacent pixel rows are processed in additive or subtractive color matching to obtain full-color information.

Figure 10:
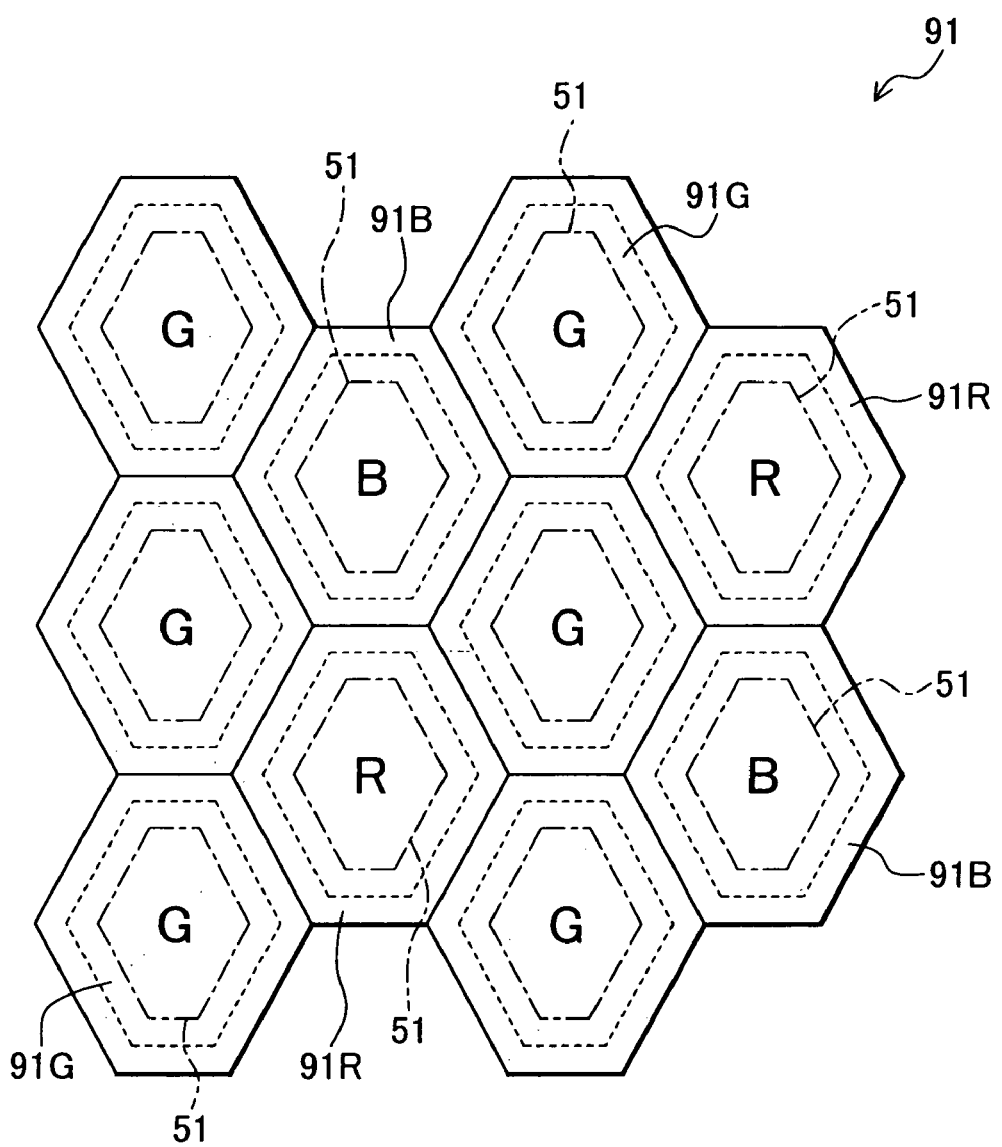
FIG. 10 is a plan view showing an example of a color filter array.

FIG. 10 partly shows in plan view an example of the color filter array 91. The array 91 alternately includes a color filter column including only green filters 91G and a color filter column alternately including a blue filter 91B and a red filter 91R.

Each of the color filters 91R, 91G, and 91B is arranged to cover in plan view the light receiving section 51 of each pixel. In FIG. 10, a photoelectric converter region defined by two adjacent transfer electrodes 32 and 33 in every second photoelectric converter column has a contour drawn by a dotted line. Letters R, G, and B respectively indicate colors, red, green, and blue of the respectively color filters.

The second planarizing film 92 shown in FIGS. 9A and 9B is disposed by coating the pertinent area with a transparent resin, e.g., photoresist having a desired thickness, for example, in a spin coating process.

Each microlens 93 shown in FIGS. 9a and 9B is formed as follows to cover the light receiving section of one pixel in plan view. A layer of transparent resin (including photoresist) having a refractive index from about 1.3 to about 2.0 is subdivided into hexagonal partitions by photolithography or the like. The transparent resin of each partition is molten by heat treatment. Edges of each partition are rounded by surface tension and then the partition is cooled down to obtain the microlens 93.

In the IT-CCD 110 having the color filter array 91 and the microlens array, the first planarizing film 90 is ordinarily disposed on the light shielding film 50 of the output transfer path 70 shown in FIG. 7 and the second planarizing film 92 is disposed on the first planarizing film 90.

Figure 11:
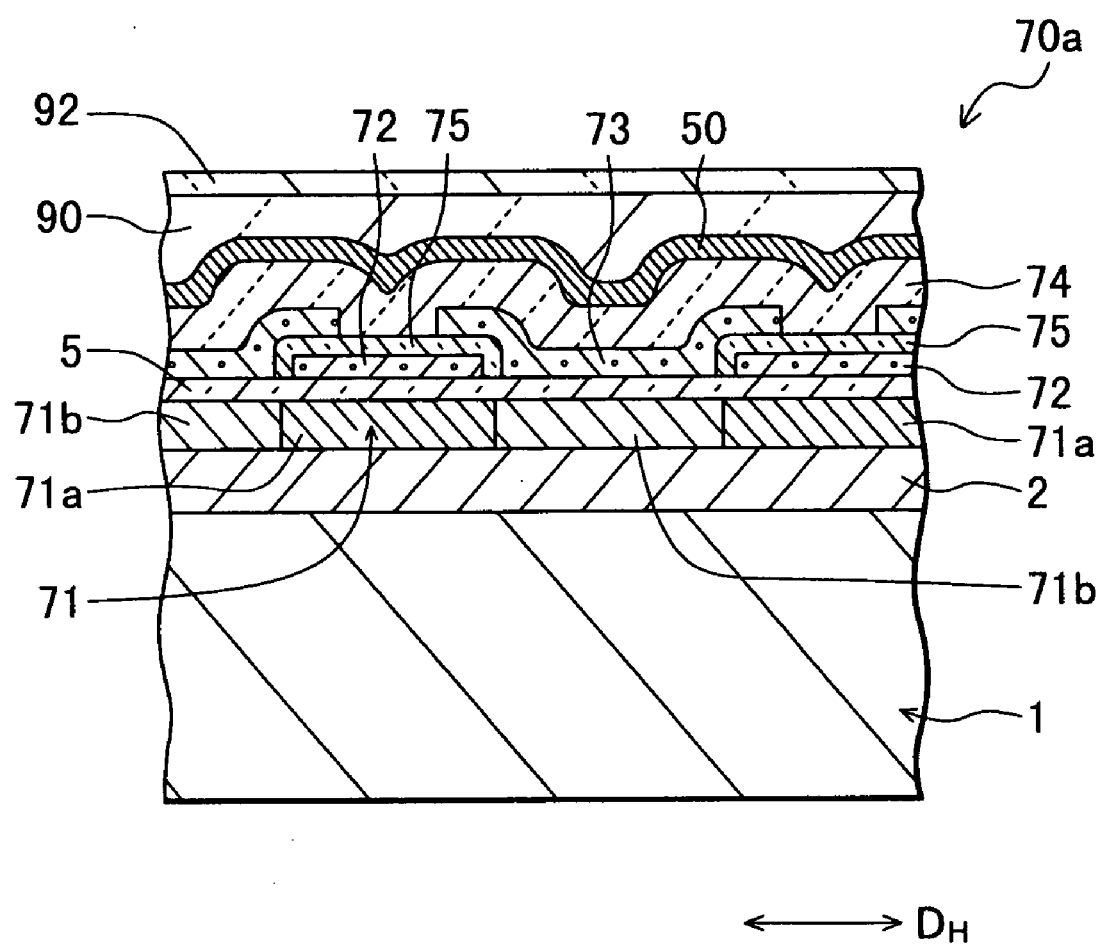
FIG. 11 is a cross-sectional view schematically showing an output transfer path in the IT-CCD of the second embodiment.

FIG. 11 is a cross-sectional view schematically showing part of the output transfer path 70a of the IT-CCD 110. In FIG. 11, the same constituent elements as those shown in FIG. 7 or FIGS. 9A and 9B are assigned with the same reference numerals and duplicated description thereof will be avoided.

The first planarizing film 90 shown in FIG. 11 is disposed in the process to form the first planarizing film 90 on the light sensing section 10 (FIGS. 9A and 9B). The second planarizing film 92 shown in FIG. 11 is arranged in the process to form the second planarizing film 92 on the color filter array 91 (FIGS. 9A and 9B).

In the IT-CCD 110 having the color filter array 91 shown in FIG. 10, the green filter 91G is arranged on each photoelectric converter of one of the two adjacent pixel rows. In the other one of the adjacent pixel rows, the blue filter 91B or the red filter 91R is disposed on each photoelectric converter. In the other pixel row above, the blue and red filters 91B and 91R are alternately arranged in this order or in an order reverse to this order.

Full-color information is generated according to signal charge from each photoelectric converter 22 of the pixel rows provided with only the green filter 91G and signal charge from each photoelectric converter 22 of the pixel rows alternately provided with the blue filter 91B and the red filter 91R.

When the light collecting efficiency and sensitivity of each pixel vary between two adjacent pixel rows, the same disadvantage takes place between the pixel row provided only with the green filter 91G and the pixel row provided alternately with the blue and red filters 91B and 91R. Resultantly, a ratio between a red signal output and a green signal output differs from a ratio between a blue signal output and a green signal output obtained according to signal charge stored in the photoelectric converters 22 of these pixel rows. This means that color balance is lost in the output signal from the IT-CCD 110. This leads to color shading in a picture reproduced from the signal.

However, the light sensing section 10 of the IT-CCD 110 is substantially identical to the light sensing section 10 of the IT-CCD 100 of the first embodiment. As above, each light receiving section 51 formed in the light sensing section 10 of the IT-CCD 100 is an axially symmetric hexagonal shape in the column direction $D_V$ and the row direction $D_H$ in plan view. The sections 51 are substantially equal to each other in contour, size, and direction.

Consequently, although the shifted-pixel layout is employed in the IT-CCD 110, the event in which the light collecting efficiency and sensitivity of each pixel vary between two adjacent pixel rows rarely take place. Therefore, the color shading seldom occurs. In addition, the pixel density can be easily improved while suppressing the decrease in the area of the light receiving section 51 of each pixel.

Figure 12:
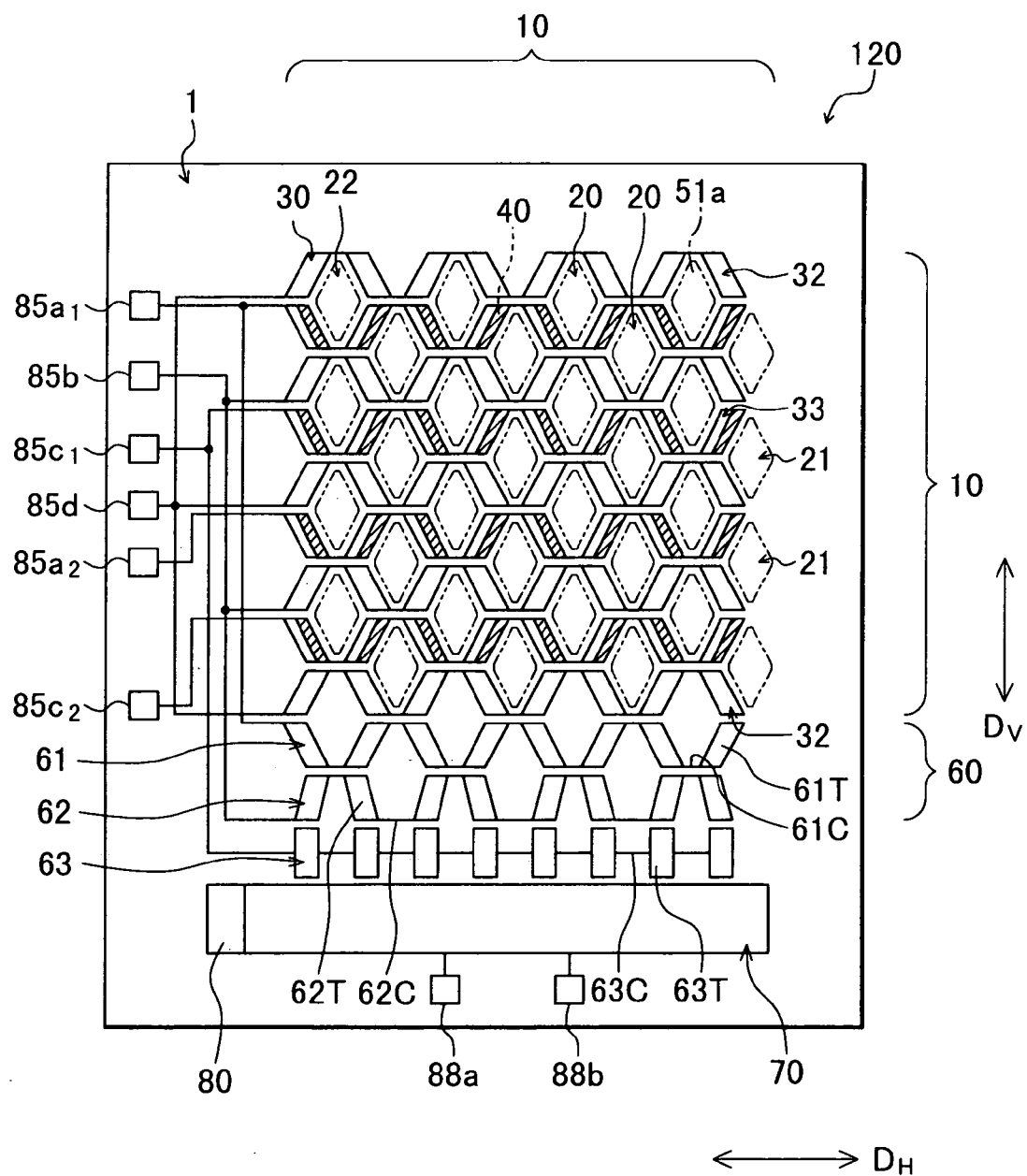
FIG. 12 is a plan view schematically showing an IT-CCD according to a third embodiment.

Next, an IT-CCD of a third embodiment will be described by referring to FIG. 12. FIG. 12 is a plan view schematically showing an IT-CCD 120 of the third embodiment.

The IT-CCD 120 is of the same configuration as the IT-CCD 100 excepting (i) a contour of a light receiving section of each pixel, (ii) the number of pulse supply terminals to supply predetermined driving pulses to each of transfer electrodes 32, 33, 61, 62, and 63, and (iii) specifications of connections between the pulse supply terminals and the transfer electrodes 32, 33, 61, 62, and 63. In the configuration shown in FIG. 12, the same constituent components as those shown in FIG. 1 are assigned with the same reference numerals and duplicated description thereof will be avoided.

As can be seen from FIG. 12, the IT-CCD 120 includes a light receiving section 51a for each pixel, the section 51a having a shape of almost a parallelogram in which a longer diagonal is substantially parallel to the column direction $D_V$ and a shorter diagonal is substantially parallel to the row direction $D_H$.

The IT-CCD 120 includes six pulse supply terminals $85a_1$, $85a_2$, $85b$, $85c_1$, $85c_2$, and $85d$ to supply predetermined driving pulses to the transfer electrodes 32, 33, 61, 62, and 63.

The pulse supply terminal 85a shown in FIG. 1 is divided into the pulse supply terminals $85a_1$ and $85a_2$. The pulse supply terminal 85c shown in FIG. 1 is divided into the pulse supply terminals $85c_1$, and $85c_2$.

Each of the pulse supply terminals $85a_1$, $85a_2$, $85b$, $85c_1$, $85c_2$, and $85d$ is electrically connected to the predetermined transfer electrode 32, 33, 61, 62, or 63.

Also in the IT-CCD 120 shown in FIG. 12, the charge transfer channel 31a or 31b has a narrowed width in a section thereof to which the readout gate region 40 is contiguous. Namely, the channel width is narrower in this section than in other sections of the channel. In the IT-CCD 120, because of almost the same reason as for the IT-CCD 100 of the first embodiment, the area of the light receiving section 51a can be easily increased while keeping unchanged the contour, the size, and the direction of the light receiving section 51a of each pixel between two adjacent pixel rows.

Resultantly, although the IT-CCD 120 employs the shifted-pixel layout, the event in which the light collecting efficiency and sensitivity of each pixel vary between two adjacent pixel rows can be easily prevented. Additionally, the pixel density can be easily increased while suppressing the decrease in the area of the light receiving section 51 of each pixel.

By disposing a color filter array in the IT-CCD 120, an IT-CCD for color images can be implemented. The color filter array can be produced in a procedure similar, for example, to the procedure to dispose the color filter array in the IT-CCD 110 of the second embodiment.

When the IT-CCD 120 is modified to produce color images, color shading seldom occurs for substantially the same reason as for the IT-CCD 110 of the second embodiment.

The IT-CCD 120 can be driven, like the IT-CCD 100, by interlaced driving. In the driving, a vertical pulse signal $V_a$ is applied to the pulse supply terminals $85a_1$ and $85a_2$ and a vertical pulse signal $V_b$ is delivered to the pulse supply terminal 85b. Vertical pulse signal $V_c$ is applied to the pulse supply terminals $85c_1$ and $85c_2$ and a vertical pulse signal $V_d$ is fed to the pulse supply terminal 85d. A horizontal pulse signal $H_a$ is applied to the pulse supply terminal 88a and a horizontal pulse signal $H_b$ is fed to the pulse supply terminal 88b.

As a result, one frame is subdivided into two fields, i.e., a first field including the first, second, fifth, and sixth pixel rows and a second field including the third, fourth, seventh, and eighth pixel rows. An image signal output of each field can be attained through operation similar to the operation of the IT-CCD 100 of the first embodiment. By conducting the operation above for the first and second fields, an image output signal can be obtained for one frame.

The IT-CCD 120 can be driven while thinning out the number of pixel rows, storing signal charge to be read out, to one quarter of all pixel rows. In the thinning-out driving, at an appropriate time during a first vertical blanking period determined by the blanking pulse, for example, a low-level vertical pulse $V_L$ is applied to the pulse supply terminals $85a_1$, $85a_2$, and 85b and a high-level vertical pulse $V_H$ is fed to the pulse supply terminals $85c_1$, $85c_2$, and 85d. While these vertical pulses $V_L$ and $V_H$ are being fed to the terminals above, a field shift pulse $V_R$ is applied to the pulse supply terminal $85c_2$. In response to the field shift pulse $V_R$, signal charge stored in each photoelectric converter 22 of the first and second pixel rows is read out to an associated vertical transfer CCD 30 (signal charge readout process).

The field shift pulse $V_R$ may also be applied to the pulse supply terminal $85c_1$. In this case, signal charge stored in each photoelectric converter 22 of the fifth and sixth pixel rows is read out to an associated vertical transfer CCD 30.

Signal charge stored in each photoelectric converter 22 of the third and fourth pixel rows can be read out to an associated vertical transfer CCD 30. For this purpose, at an appropriate time during a first vertical blanking period, a high-level vertical pulse $V_H$ is applied to the pulVertical pulse signal V se supply terminals $85a_1$, $85a_2$, and 85b and a low-level vertical pulse $V_L$ is applied to the pulse supply terminals $85c_1$, $85c_2$, and 85d. While these vertical pulses $V_L$ and $V_H$ are being fed to the terminals, a field shift pulse $V_R$ is applied to the pulse supply terminal $85a_2$.

Signal charge stored in each photoelectric converter 22 of the seventh and eighth pixel rows can be read out to an associated vertical transfer CCD 30. To read out the signal charge, at an appropriate time during a first vertical blanking period, a high-level vertical pulse $V_H$ is applied to the pulse supply terminals $85a_1$, $85a_2$, and 85b and a low-level vertical pulse $V_L$ is applied to the pulse supply terminals $85c_1$, $85c_2$, and 85d. While these vertical pulses $V_H$ and $V_L$ are being fed to the terminals, a field shift pulse $V_R$ is applied to the pulse supply terminal $85a_1$.

By processing the signal charge thus read out in a manner similar to that of the signal charge processing by ordinary interlaced driving, filed image signals or frame image signals thinned out to one quarter of the original image signals can be obtained.

The thinning-out described above is carried out to obtain image signals thinned out to one quarter of the original image signals in any situation. Namely, it is not necessary to read out signal charge of all pixels. Since the IT-CCD 120 includes only eight pixel rows, the quarter thinning-out operation is completed by one horizontal reading operation. However, the actual number of pixel rows is, for example, 600 or more.

In an IT-CCD in which n stages of the light sensing sections 10 shown in FIG. 12 are sequentially arranged in the column direction $D_V$, to obtain frame image signals thinned out to one quarter of the original image signals, the thinning-out operation is conducted from the first stage to the n-th stage. In this operation, for the respective stages, signal charge is simultaneously read from each photoelectric converter 22 of a desired pixel row and is fed to the vertical transfer CCD 30. Signal charge read from the each stage is sequentially transferred by an associated vertical transfer CCD 30 to the output transfer path 70. The signal charge is transferred through the path 70 to be sequentially outputted from the output portion 80.

For example, for a digital still camera to conduct optimal setting of exposure conditions (a shutter speed and a lens opening), focus adjustment, and monitor picture display, it is necessary to obtain image output signals at a high frame frequency of about 30 frames per second.

On the other hand, to produce a digital still camera having high resolution, it is desired that the IT-CCD of the camera have one million pixels or more.

However, when the number of pixels exceeds one million, quite a long period of time is required to obtain an image signal output of one frame, for example, one second for several frames. Therefore, the optimal setting of exposure conditions, the focus adjustment, and the monitor picture display cannot be achieved.

Consequently, to fabricate a digital still camera having high resolution, it is desired to use an IT-CCD in which operations other than the readout of a still picture recorded at depression of the shutter are carried out at a high frame frequency.

As above, the ordinary interlaced driving and the driving with the quarter thinning-out can be selectively achieved by the IT-CCD 120. The frame frequency in the thinning-out driving is four times that in the ordinary interlaced driving. The IT-CCD 120 is therefore an IT-CCD of a suitable configuration to attain image signals of a high frame frequency.

In a camera requiring color image signals for each field, color signal processing is executed for image output signals of each field delivered from the output portion 80 to obtain color image signals of each field.

In a camera requiring color image signals of a frame, two successive field image output signals are once stored in a frame memory, color signal processing is executed for image output signals of each frame to obtain color image signals of one frame. To prevent exposure time from varying between respective fields, a mechanical shutter is favorably employed. After the vertical blanking period for the first field is terminated, the mechanical shutter is kept closed to prevent light from entering the pixels by the vertical blanking period for the second field is started. Resultantly, for each of the first and second fields, a field image output signal at an identical time can be obtained. This also applies to a camera requiring a frame of monochrome image signals. In a camera requiring only one sheet of frame image, the mechanical shutter is kept closed after the vertical blanking period for the first field is terminated. This prevents smear from appearing in the image of the second field.

Figure 13:
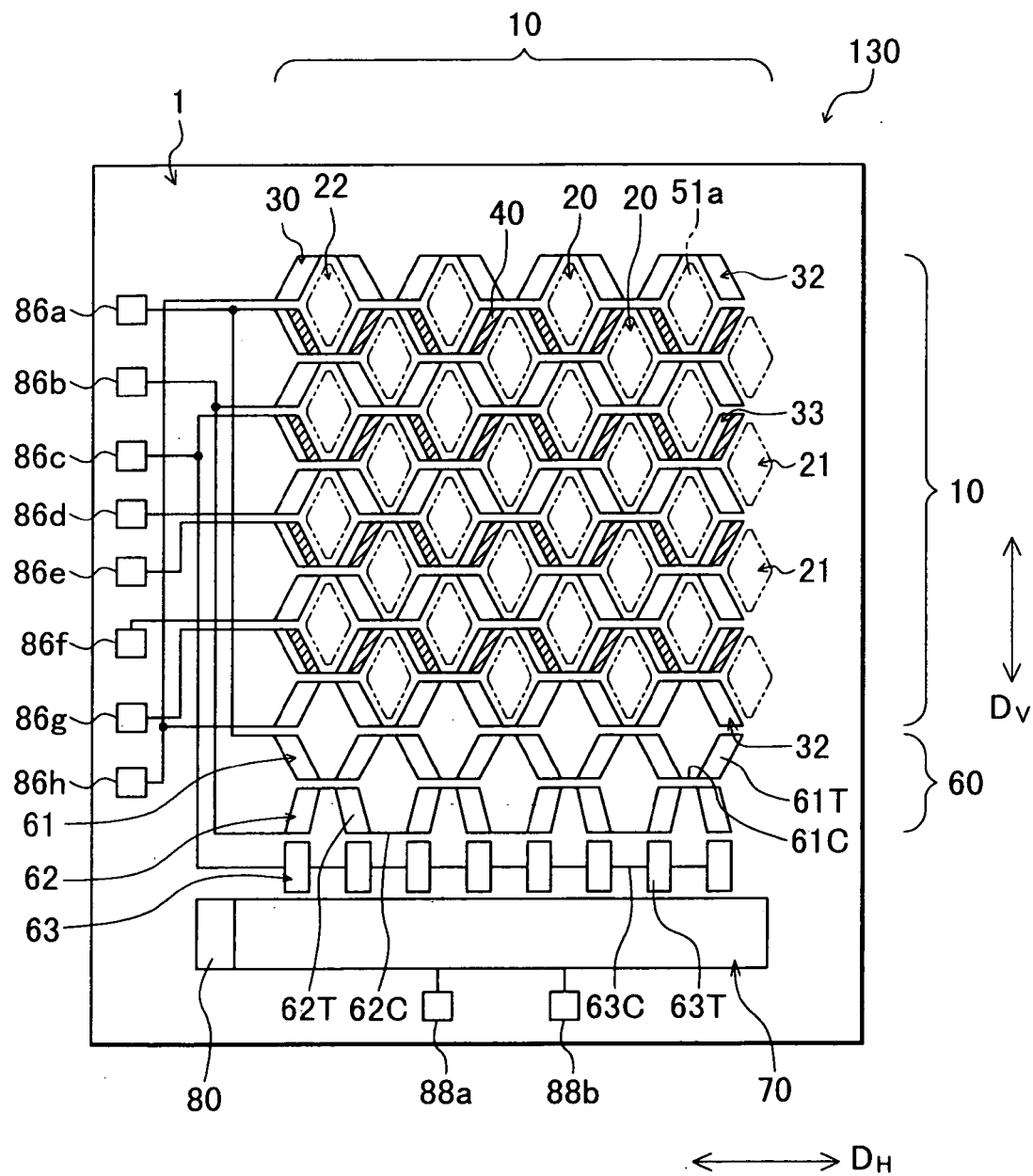
FIG. 13 is a plan view schematically showing an IT-CCD according to a fourth embodiment.

Referring next to FIG. 13, description will be given of an IT-CCD of a fourth embodiment.

FIG. 13 is a plan view schematically showing an IT-CCD 130 of the fourth embodiment.

The IT-CCD 130 has the same constitution as that of the IT-CCD 120 excepting (i) the number of pulse supply terminals to supply predetermined driving pulses to each of the transfer electrodes 32, 33, 61, 62, and 63 and (ii) specifications of connections between the pulse supply terminals and the transfer electrodes 32, 33, 61, 62, and 63. In FIG. 13, the same constituent elements as those shown in FIG. 12 are assigned with the same reference numerals and duplicated description thereof will be avoided.

As shown in FIG. 13, the IT-CCD 130 includes eight pulse supply terminals 86*a* to 86*h* to supply predetermined driving pulses to the transfer electrodes 32, 33, 61, 62, and 63.

Each of the pulse supply terminals 86*a* to 86*h* is electrically connected to the predetermined transfer electrode 32, 33, 61, 62, or 63.

In the IT-CCD 130 shown in FIG. 13, because of almost the same reason as for the IT-CCD 120 of the third embodiment, the area of the light receiving section 51*a* can be easily increased without changing the contour, the size, and the direction of the light receiving section 51*a* of each pixel between two adjacent pixel rows. As a result, although the IT-CCD 130 employs the shifted-pixel layout, the event in which the light collecting efficiency and sensitivity of each pixel vary between two adjacent pixel rows can be easily prevented. Moreover, the pixel density can be easily increased while suppressing the decrease in the area of the light receiving section 51*a* of each pixel.

When the IT-CCD 130 is modified to produce color images, color shading rarely occurs for substantially the same reason as for the IT-CCD 120 of the third embodiment.

To drive the IT-CCD 130 by interlaced driving, predetermined vertical pulses are respectively applied to the pulse supply terminals 86*a* to 86*h*. The horizontal pulse signals $H_a$ and $H_b$ are applied to the pulse supply terminals 88*a* and 88*b*, respectively.

Resultantly, one frame is subdivided into four fields, namely, a first field including the first and second pixel rows, a second field including the third and fourth pixel rows, a third field including the fifth and sixth pixel rows, and a fourth field including the seventh and eighth pixel rows.

For each field, an image signal output can be obtained by conducting operation similar to the operation to produce an image signal output for one field when one frame is divided into two fields for the interlaced driving (reference is to be made to the IT-CCD 100 of the first embodiment). By accomplishing the operation for the first to fourth fields, an image output signal can be obtained for one frame.

When the image signal output is produced only for an identical field, the IT-CCD 130 can be driven by quarter thinning-out driving, namely, the number of pixel rows from which signal charge to be read out is reduced to one quarter of all pixel rows. In an IT-CCD including n stages of the light sensing sections 10 shown in FIG. 13 sequentially arranged in the column direction $D_V$, to produce frame image signals thinned out to one quarter of the original image signals, the thinning-out operation is conducted from the first stage to the n-th stage. In the operation, for the respective stages, signal charge is simultaneously read from each photoelectric converter 22 of a desired pixel row and is delivered to the associated vertical transfer CCD 30. Signal charge read from the each stage is sequentially transferred by each vertical transfer CCD 30 to the output transfer path 70. The signal charge is transferred through the path 70 and is sequentially outputted from the output portion 80.

The IT-CCD 130 can drive each vertical transfer CCD 30 by eight-phase driving. In a CCD of eight-phase driving type, one potential well is disposed for six to seven successive charge transfer stages and charge signal stored in the potential well is transferred. On the other hand, in a CCD of four-phase driving type, one potential well is disposed for two to three successive charge transfer stages and charge signal stored in the potential well is transferred.

Therefore, when the transfer electrodes 32 and 33 have an almost equal design pattern, the vertical transfer CCD of eight-phase driving type could transfer signal charge of about two to three times that of the vertical transfer CCD of four-phase driving type.

As a result, in the IT-CCD 130, by decreasing the channel width of the charge transfer channel of each vertical transfer CCD 30, the area of the photoelectric converter 22 and the area of the light receiving section 51*a* can be as much increased substantially in proportion to the decrease in the channel width. Consequently, the sensitivity, the saturation output level, and the dynamic range can be increased.

By additionally disposing a color filter array, the IT-CCD 130 can be modified to an IT-CCD to produce color images. The color filter array can be disposed in almost the same production procedure as for the color filter array employed, for example, in the IT-CCD 110 of the second embodiment.

In a camera requiring color image signals for each field, color signal processing is executed for image output signals of each field outputted from the output portion 80 to obtain color image signals of each field.

In a camera requiring color image signals of a frame, four successive field image output signals are once accumulated in a frame memory and color signal processing is executed for image output signals of one frame to obtain color image signals of one frame. To prevent exposure time from varying between respective fields, a mechanical shutter is favorably employed. After the vertical blanking period for the first field is terminated, the mechanical shutter is kept closed to prevent light from entering the pixels by the vertical blanking period for the fourth field is started. As a result, for each of the first to fourth fields, there is obtained a field image output signal at an identical time. This also applies to a camera requiring a frame of monochrome image signals. In a camera requiring only one sheet of frame image, the mechanical shutter is kept closed after the vertical blanking period for the first field is terminated. This prevents smear from appearing in the image of the second to fourth fields.

Description will next be given of an IT-CCD of a fifth embodiment by referring next to FIG. 14.

Figure 14:
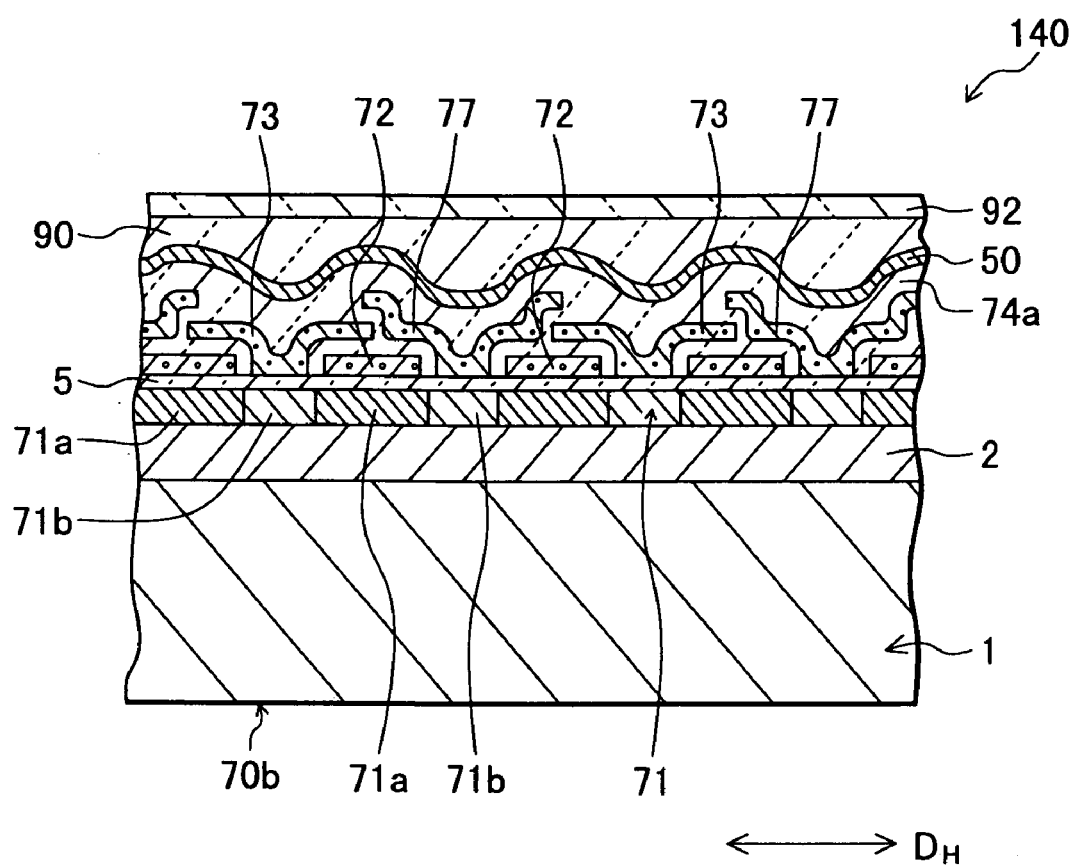
FIG. 14 is a schematic cross-sectional view showing an output transfer path being composed of a CCD of three-layer polycrystalline silicon electrodes in an IT-CCD of a fifth embodiment.

FIG. 14 is a cross-sectional view schematically showing an example of the output transfer path of an IT-CCD 140 of this embodiment.

The IT-CCD 140 is configured almost in the same way as for the IT-CCD 100 of the first embodiment excepting that the output transfer path 70 is replaced with an output transfer path 70b. In FIG. 14, the same functional constituent elements as those shown in FIG. 11 are assigned with the same reference numerals and duplicated description thereof will be avoided.

The output transfer path 70b is composed of a CCD of two-phase driving type with three-layer polycrystalline silicon electrodes. Like the output transfer path 70a of IT-CCD 110 shown in FIG. 11, the path 70b includes a charge transfer channel 71 disposed as follows. At predetermined locations of a p-type well 2 formed on one surface of a semiconductor substrate 1, an n$^+$-type region 71a having a high n-type impurity concentration and an n-type region 71b having a low n-type impurity concentration are alternately arranged in the row direction $D_H$. The region 71a is larger in width than the region 71b. The channel 71 extends in the row direction $D_H$.

The output transfer path 70b includes predetermined numbers respectively of three kinds of transfer electrodes 72, 73, and 77 made of a polycrystalline layer. The electrode 72 is arranged on each n$^+$-type region 71a. The transfer electrodes 73 and 77 are alternately disposed respectively on the n-type regions 71b.

The transfer electrodes 72, 73, and 77 are disposed to intersect the charge transfer channel 71. The transfer electrode 73 has, on the side of the transfer electrode 72, an end section which covers the electrode 72. The transfer electrode 77 has, on the side of the transfer electrode 73, an end section which covers the electrode 73. That is, the transfer electrodes 72, 73, and 77 are configured in a so-called overlapping transfer gate layout.

One n$^+$-type region 71a and one transfer electrode 72 over the region 71a constitute one potential well region. Similarly, one n-type region 71b and one transfer electrode 73 or 77 over the region 71b form one potential barrier region.

One charge transfer stage is configured by applying a voltage of a predetermined level to the transfer electrode 73 or 77 of one potential barrier region and to the transfer electrode 72 of one potential well region disposed immediately downstream of the potential barrier (on the side of the output portion 80. This also applies to the following description).

Each of the electrodes 72, 73, and 77 is coated with an insulating film. FIG. 14 representatively shows one insulating film 74a for simplicity of the drawing.

As in the case of the output transfer path 70 shown in FIG. 1, two pulse supply terminals are disposed to apply a predetermined driving pulse to the output transfer path 70b. The transfer electrode 72 and the transfer electrode 73 or 77 immediately downstream thereof are electrically connected to an identical pulse supply terminal. Two adjacent transfer terminals 72 with the transfer electrode 73 or 77 intervening therebetween are electrically linked with mutually different pulse supply terminals, respectively.

The output transfer path being composed of the CCD of two-phase driving type with three-layer polycrystalline silicone electrodes has advantage of loose or wide design rules when compared with the output transfer path being composed of the CCD of two-phase driving type with two-layer polycrystalline silicone electrodes. For example, when the CCD of two-phase driving type with two-layer polycrystalline silicone electrodes is disposed in a so-called overlapping electrode layout shown in FIG. 7 or 11, it is required to keep the gap between the transfer electrodes 73 substantially equal to, or less than the gap between the transfer electrodes 72. To manufacture the transfer electrodes 73 of this kind, there arises restriction in consideration of design rules.

In the CCD 70b of two-phase driving type with three-layer polycrystalline silicone electrodes shown in FIG. 14, the transfer electrodes 73 can be disposed without such restriction.

Therefore, when an output transfer path being composed of the CCD of two-phase driving type with three-layer polycrystalline silicone electrodes is adopted, it is easy to produce an IT-CCD by minimizing the pixel pitch between pixels (pitch $P_2$ between photoelectric converters) in the direction of the photoelectric converter row (row direction DH). This also applies to a case in which the electrodes are formed with a material other than polycrystalline silicon.

Description will now be given of an IT-CCD of a sixth embodiment.

Figure 15:
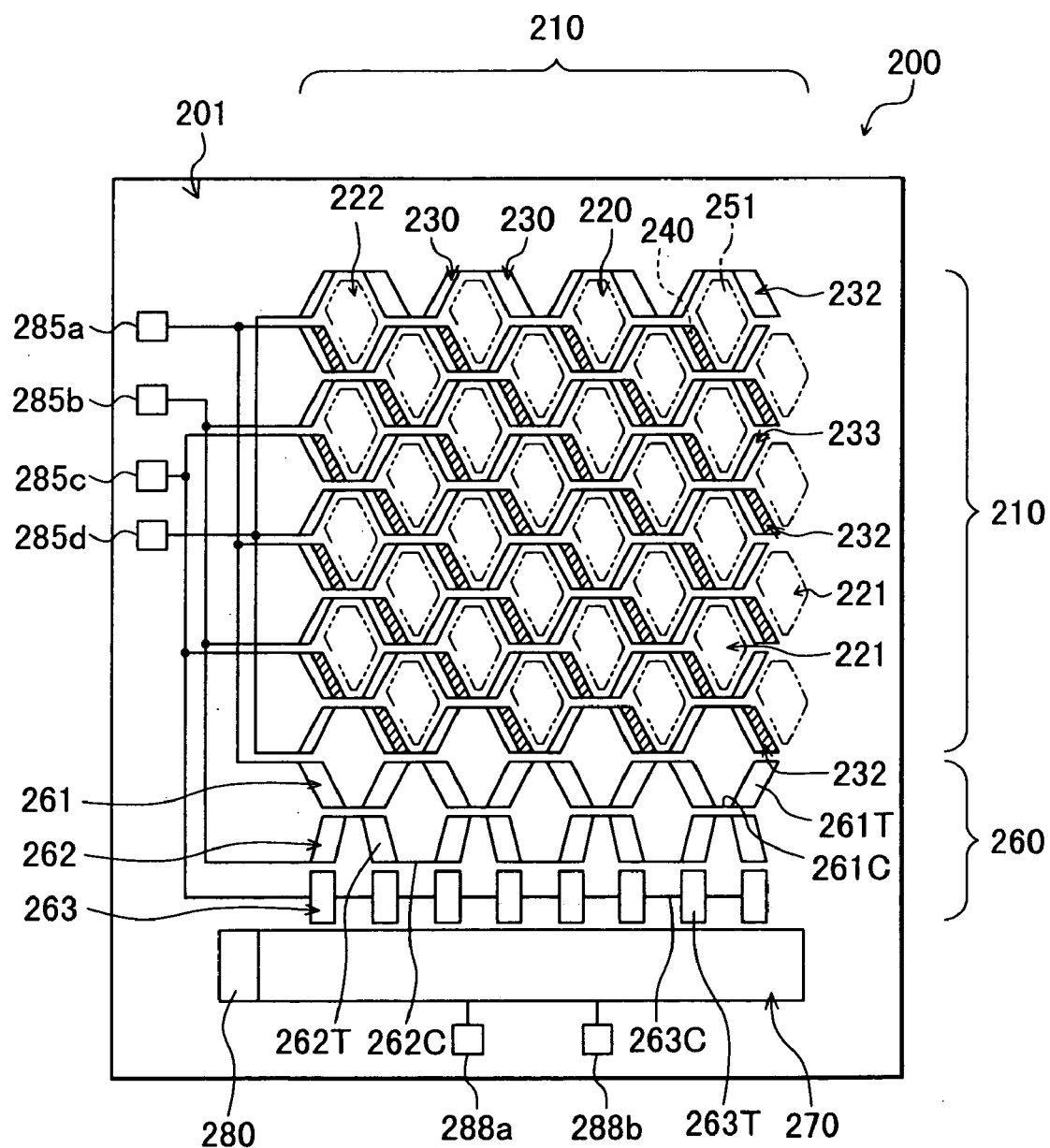
FIG. 15 is a plan view schematically showing an IT-CCD according to a sixth embodiment.

FIG. 15 is a plan view schematically showing an IT-CCD 200 of the sixth embodiment.

Figure 16:
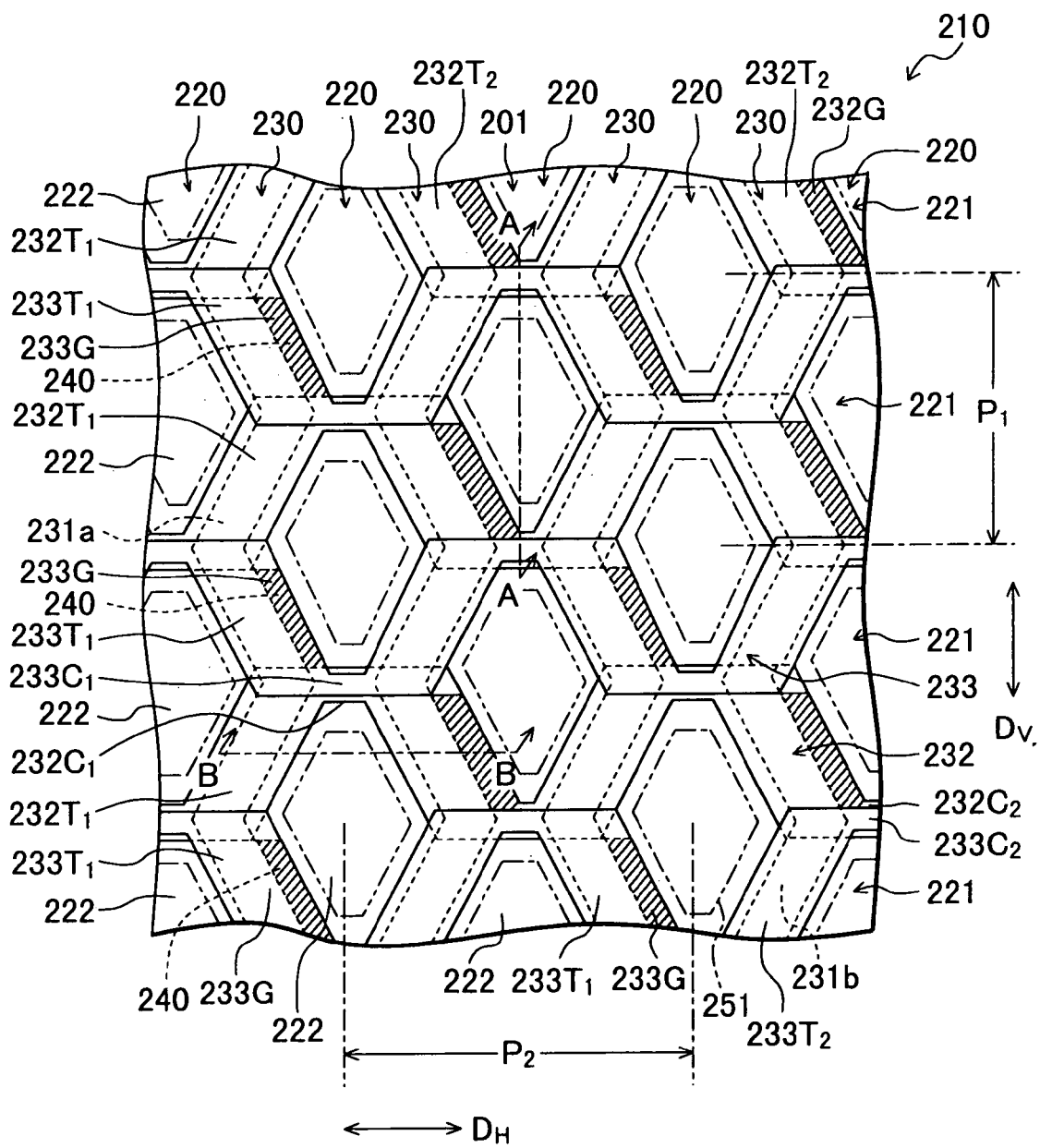
FIG. 16 is a magnified plan view partly showing a light sensing section of the IT-CCD shown in FIG. 15.

FIG. 16 shows, in a magnified plan view, part of the light sensing section 210 shown in FIG. 15.

The IT-CCD 200 of this embodiment is structurally almost the same as the IT-CCD 100 excepting (i) a relative positional relationship between a photoelectric converter 222 and a readout gate region 240 associated therewith, (ii) contours of charge transfer channels 231a and 231b of each vertical transfer CCD 230, and (iii) a position of a readout gate electrode region of each of the transfer electrodes 232 and 233. In FIG. 15 or 16, the functionally same constitution elements as those shown in FIG. 1 or 2 are assigned with reference numerals created by adding 200 to the associated reference numerals used in FIG. 1 or 2, and duplicated description thereof will be avoided.

As can be seen from FIGS. 15 and 16, in the IT-CCD 200, the relative positional relationship between the photoelectric converter 222 and a readout gate region 240 contiguous thereto is fixed for all pixels. That is, for each pixel, the readout gate region 240 is contiguous in plan view to a lower-left edge of the associated photoelectric converter 222. In association therewith, each of the transfer electrodes 232 and 233 includes a readout gate electrode region.

Figure 17:
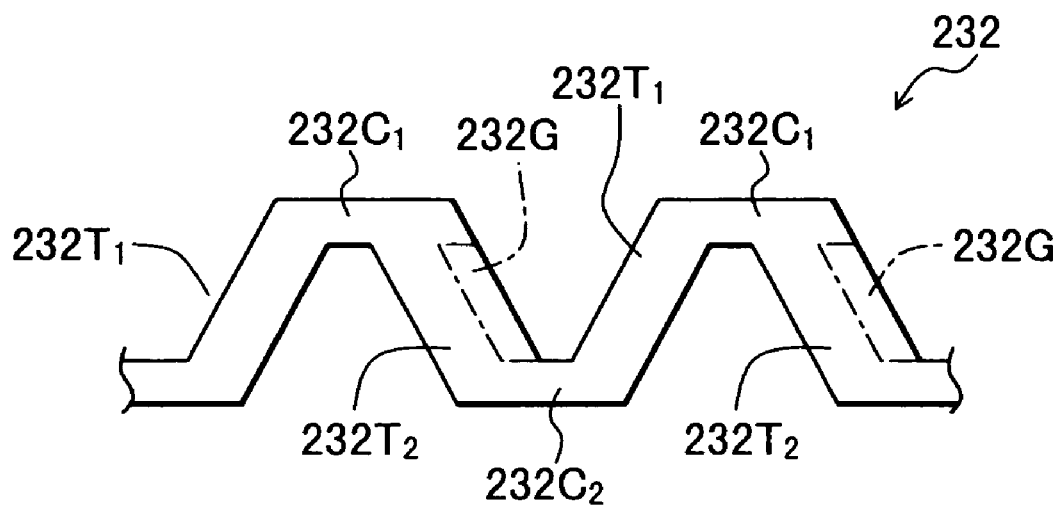
FIG. 17 is a schematic plan view showing one of transfer electrodes 232 shown in FIG. 16.

FIG. 17 is a plan view schematically showing one transfer electrode 232.

Figure 18:
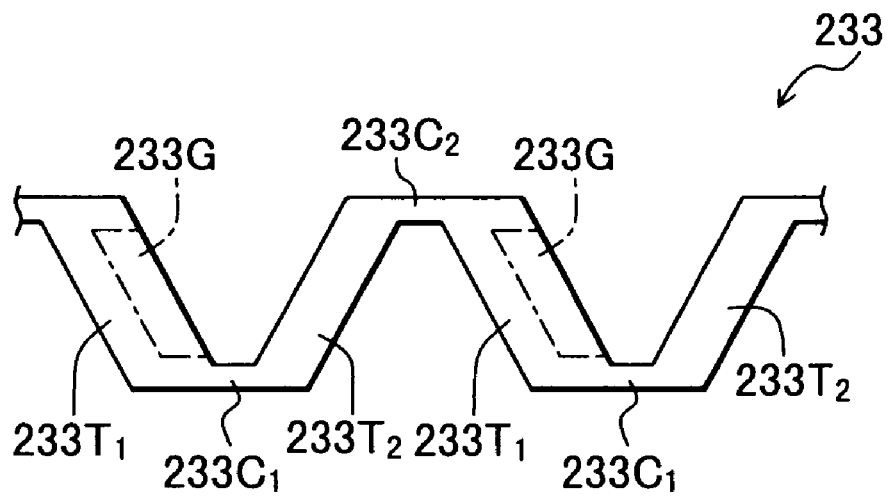
FIG. 18 is a plan view schematically showing one of transfer electrodes 233 shown in FIG. 16.

FIG. 18 is a plan view schematically showing one transfer electrode 233.

As shown in FIG. 17, each transfer electrode 232 includes a predetermined number of transfer path forming sections or regions $232T_1$ and $232T_2$. Each transfer electrode 232 further includes a predetermined number of two kinds of connecting sections $232C_1$ and $232C_2$ in the row direction $D_H$.

The connecting section $232C_1$ is contiguous, at its left end region (the left end regions in FIGS. 16 and 17), to the transfer path forming sections $232T_1$ and is contiguous, at its right end region (the right end regions in FIGS. 16 and 17), to the transfer path forming sections $232T_2$. The connecting section $232C_2$ is contiguous, at its left end region (the left end regions in FIGS. 16 and 17), to the transfer path forming sections $232T_2$ and is contiguous, at its right end region (the right end regions in FIGS. 16 and 17), to the transfer path forming sections $232T_1$.

The connecting section $232C_1$ of the transfer electrode 232, excepting the transfer electrode 232 disposed at an upper-most position of the light sensing section 210, is slightly longer than the connecting section $232C_2$. In the transfer electrode 232 at an upper-most position of the light sensing section 210, the connecting sections $232C_1$ and $232C_2$ are substantially equal in length to each other. Paying attention only to a positional relationship between the connecting sections $232C_1$ and $232C_2$ in each transfer electrode 232, the connecting sections $232C_1$ and $232C_2$ are alternately fabricated.

The total number of the transfer path forming sections $232T_1$ and $232T_2$ in one transfer electrode 232 is equal to that of the charge transfer channels 231a and 231b formed in the light sensing section 210. As shown in FIG. 16, each of the transfer path forming sections $232T_1$ and $232T_2$ covers in plan view one of the sections of the charge transfer channel 231a or 231b. The pertinent section $232T_1$ or $232T_2$ and the section of the channel configure one charge transfer stage.

The transfer path forming section $232T_2$, excepting the sections $232T_2$ in the upper-most transfer electrode 232 of the light sensing section 210, also covers in plan view one respective readout gate region 240. Specifically, one transfer path forming section $232T_2$ covers in plan view one readout gate region 240 corresponding to a photoelectric converter 222 in an even column relative to the left end in the configuration shown in FIG. 15. Therefore, the section $232T_2$ is wider than the section $232T_1$. In each section $232T_2$, the section thereof to cover the readout gate region 240 serves as a readout gate electrode region 232G to read signal charge from the associated photoelectric converter 222 (FIG. 17).

Each transfer electrode 233 includes a predetermined numbers of two kinds of transfer path forming sections $233T_1$ and $233T_2$ as shown in FIG. 18. Each transfer electrode 233 also includes a predetermined numbers of two kinds of connecting sections $233C_1$ and $233C_2$ extending in the row direction $D_H$.

The connecting section $233C_1$ is contiguous, at its left end region (the left end regions in FIGS. 16 and 18), to the transfer path forming section $233T_1$ and is contiguous, at its right end region (the right end regions in FIGS. 16 and 18), to the transfer path forming section $233T_2$. The connecting section $233C_2$ is contiguous, at its left end region (the left end regions in FIGS. 16 and 18), to the transfer path forming section $233T_2$ and is contiguous, at its right end region (the right end regions in FIGS. 16 and 18), to the transfer path forming section $233T_1$. The connecting section $233C_2$ is slightly longer than the connecting section $233C_1$. The connecting sections $233C_1$ and $233C_2$, when attention is paid only thereto, are alternately arranged.

The total number of the transfer path forming sections $233T_1$ and $233T_2$ in one transfer electrode 233 is equal to that of the charge transfer channels 231a and 231b disposed in the light sensing section 210. As can be seen from FIG. 16, each of the transfer path forming sections $233T_1$ and $233T_2$ covers in plan view one of the sections of the charge transfer channel 231a or 231b. The section $233T_1$ or $233T_2$ and the pertinent section of the channel configure one charge transfer stage.

The transfer path forming section $233T_1$ also covers in plan view one respective readout gate region 240. Concretely, one transfer path forming section $233T_1$ covers in plan view one readout gate region 240 corresponding to a photoelectric converter 222 in an odd column relative to the left end in the configuration shown in FIG. 15. Therefore, the section $233T_1$ is wider than the section $233T_2$. In each section $233T_1$, the section or region thereof to cover the readout gate region 240 serves as a readout gate electrode region 233G to read signal charge from the associated photoelectric converter 222 (FIGS. 16 and 18).

The charge transfer stage including the transfer path forming section $232T_1$ and that including $233T_1$ are alternately arranged to form one vertical transfer CCD 230 (FIG. 16). In the vertical transfer CCD 230, the respective charge transfer stages generally extend, while changing direction thereof at boundaries therebetween, in the column direction $D_V$ (FIG. 16). The vertical transfer CCD 230 transfers in the column direction $D_V$ signal charge stored in each photoelectric converter 222 of a photoelectric converter column 220 (an odd photoelectric converter column) disposed adjacent to the vertical transfer CCD 230 on the right side thereof (the right side of FIG. 15 or 16).

The charge transfer stage including the transfer path forming section $232T_2$ and that including $233T_2$ are alternately disposed to configure one vertical transfer CCD 230 (FIG. 16). In the vertical transfer CCD 230, the respective charge transfer stages generally extend, while changing direction thereof at boundaries therebetween, in the column direction $D_V$ (FIG. 16). The vertical transfer CCD 230 transfers in the column direction $D_V$ signal charge stored in each photoelectric converter 222 of a photoelectric converter column 220 (an even photoelectric converter column) disposed adjacent to the vertical transfer CCD 230 on the right side thereof (the right side of FIG. 15 or 16).

When two adjacent transfer electrodes 232 and 233 intersect one photoelectric converter column 220, these electrodes overlap with each other at the connecting sections $232C_1$ and $233C_1$ or the connecting sections $232C_2$ and $233C_2$. When the electrodes 232 and 233 intersect an adjacent photoelectric converter column 220 adjacent to the column 220 above, these electrodes separate from each other to enclose one photoelectric converter 222 in plan view. The transfer electrodes 232 and 233 generally extend, while meeting and parting, in the column direction $D_H$ (FIG. 16).

In the configuration shown in FIG. 15, viewed from an upper end of the light sensing section 210, when the two adjacent transfer electrodes are the transfer electrodes 232 and 233, these electrodes 232 and 233 enclose each photoelectric converter 222 of an odd column. On the other hand, when the two adjacent transfer electrodes are the transfer electrodes 233 and 232, these electrodes 233 and 232 enclose each photoelectric converter 222 of an even column.

The transfer electrodes 232 and 233 enclose in plan view one photoelectric converter 222 at a location where they are apart from each other to determine one hexagonal or substantially hexagonal photoelectric converter region. The photoelectric converter regions are substantially equal in contour, size, and direction to each other. That is, the transfer electrodes 232 and 233 are configured generally in a honeycomb layout (FIG. 16).

Each photoelectric converter region in an odd photoelectric converter column 220 relative to the left end of the configuration shown in FIG. 15 is determined in plan view by one connecting section $232C_1$, two adjacent transfer path forming regions $232T_1$ and $232T_2$ with the section $232C_1$ intervening therebetween, one connecting section $233C_1$, and two adjacent transfer path forming regions $233T_1$ and $233T_2$ with the section $233C_1$ intervening therebetween.

On the other hand, each photoelectric converter region in an even photoelectric converter column 220 relative to the left end of FIG. 15 is defined in plan view by one connecting section $232C_2$, two adjacent transfer path forming regions $232T_2$ and $232T_1$ with the section $232C_2$ intervening therebetween, one connecting section $233C_2$, and two adjacent transfer path forming regions $233T_2$ and $233T_1$ with the section $233C_2$ intervening therebetween.

In FIG. 15, for simplicity of the drawing, the transfer electrodes 232 and 233 are separated. However, these electrodes 232 and 233 overlap with each other in the connecting sections $232C_1$ and $233C_1$, the connecting sections $232C_2$ and $233C_2$, the transfer path forming regions $232T_1$ and $233T_1$, and the transfer path forming regions $232T_2$ and $233T_2$ as shown in FIG. 16.

When the vertical transfer CCD 230 is not arranged on the left side of the left-most photoelectric converter column 220 (on the left side of FIG. 15) in the light sensing section 210, each photoelectric converter 222 of the left-most column 220 need not be enclosed in plan view by two adjacent transfer electrodes 232 and 233. That is, the left-most transfer path forming regions $232T_1$ and $233T_1$ required to enclose in plan view each photoelectric converter 222 of the left-most photoelectric converter column 220 can be dispensed with. Additionally, the left-most connecting sections $232C_1$ and $233C_1$ can also be removed. This also applies when the vertical transfer CCD 230 is not arranged on the right side of the right-most photoelectric converter column 220 in the light sensing section 210 (FIG. 15).

In the IT-CCD 200 configured as above, the contour of the charge transfer channels 231a and 231b is different from that of the charge transfer channels 31a and 31b of the IT-CCD 100 of the first embodiment.

Figure 19A:
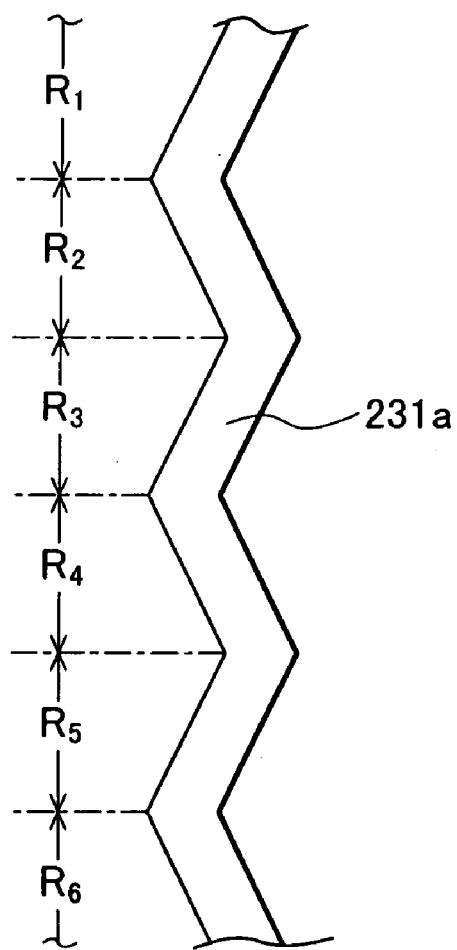
FIG. 19A is a plan view schematically showing one of charge transfer channels 231a shown in FIG. 16.

FIG. 19A is a plan view schematically showing the charge transfer channel 231a shown in FIG. 16.

Figure 19B:
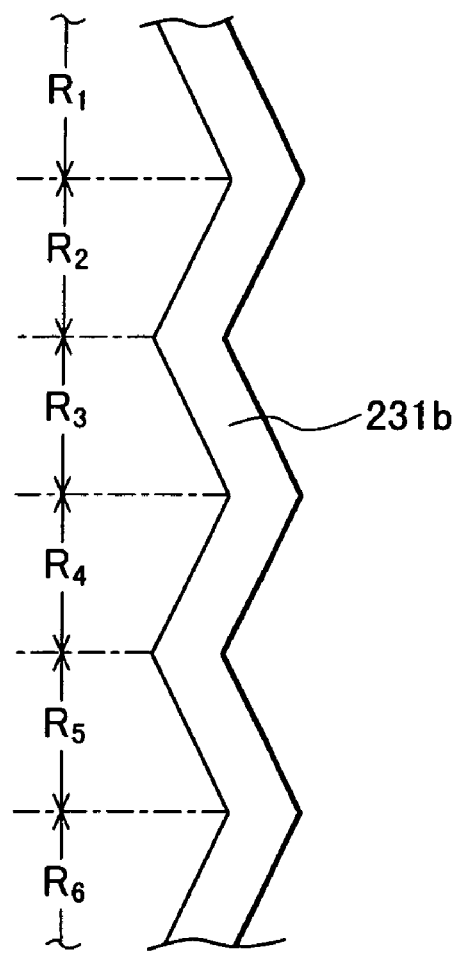
FIG. 19B is a plan view schematically showing one of charge transfer channels 231b shown in FIG. 16.

FIG. 19B is a plan view schematically showing the charge transfer channel 231b shown in FIG. 16.

As can be seen from FIGS. 19A and 19B, each of the channels 231a and 231b generally extends, while a plurality of its sections are changing their directions at boundaries therebetween, in a zigzag form in the column direction $D_V$. In this regard, the contours of the channels 231a and 231b are similar to that of the charge transfer channels 31a and 31b of the IT-CCD 100 of the first embodiment. In FIGS. 19A and 19B, the channels 231a and 231b respectively include constituent sections R1, R2, . . . , R6.

The channels 231a and 231b differ from the channels 31a and 31b of the IT-CCD 100 of the first embodiment in that the respective sections are substantially of the same width.

In each charge transfer channel 231a, a readout gate region 240 is arranged to be contiguous to a right side of each even section of the channel 231a relative to the upper end of the light sensing section 210. In each charge transfer channel 231b, a readout gate region 240 is disposed to be contiguous to a right side of each odd section of the channel 231a (excepting a first section) relative to the upper end of the light sensing section 210. Each readout gate region 240 is also contiguous to predetermined photoelectric converters 222.

Although the sections of each of the charge transfer channels 231a and 231b are substantially equal in width to each other, a relative positional relationship between a photoelectric converter 222 and a readout gate region 240 contiguous thereto is fixed for all pixels. This leads to advantage as follows.

Without greatly minimizing the size of the light receiving section 251 (FIG. 16) of each pixel relative to the size of the photoelectric converter 222, the light receiving sections 251 can be easily formed to be substantially equal in contour, size, and direction to each other. Resultantly, the contour, the size, and the direction of the light receiving section 251 can be easily fixed between two adjacent pixel columns while preventing the decrease in area of the light receiving section 251 of each pixel.

In consequence, although the IT-CCD 200 is constructed using the shifted-pixel layout, the event in which the light collecting efficiency and sensitivity of each pixel vary between two adjacent pixel rows can be easily prevented. The pixel density can be easily increased while suppressing the decrease in area of each opening (light receiving section) 251.

In the IT-CCD 200, each pixel is configured with (a) one photoelectric converter 222, (b) two charge transfer stages in a vertical transfer CCD 230 disposed adjacent to and on the left side of the photoelectric converter 222 in FIG. 16, namely, two charge transfer stages including the transfer path forming sections $232T_1$ and $233T_1$ or two charge transfer stages including the transfer path forming sections $232T_2$ and $233T_2$, and (c) one readout gate region 240 disposed between the charge transfer stage including the transfer path forming sections $232T_2$ or $233T_1$ and the photoelectric converter 222.

Excepting the difference above, the configuration of the IT-CCD 200 is similar to that of the IT-CCD 100 of the first embodiment as above. Although not shown in FIGS. 15 and 16, to prevent unnecessary photoelectric conversion in each vertical transfer CCD 230, the IT-CCD 200 includes, like the IT-CCD 100 of the first embodiment, a light shielding film 250 covering in plan view an area ranging from the light sensing section 210 to the output transfer path 270.

Figure 20A:
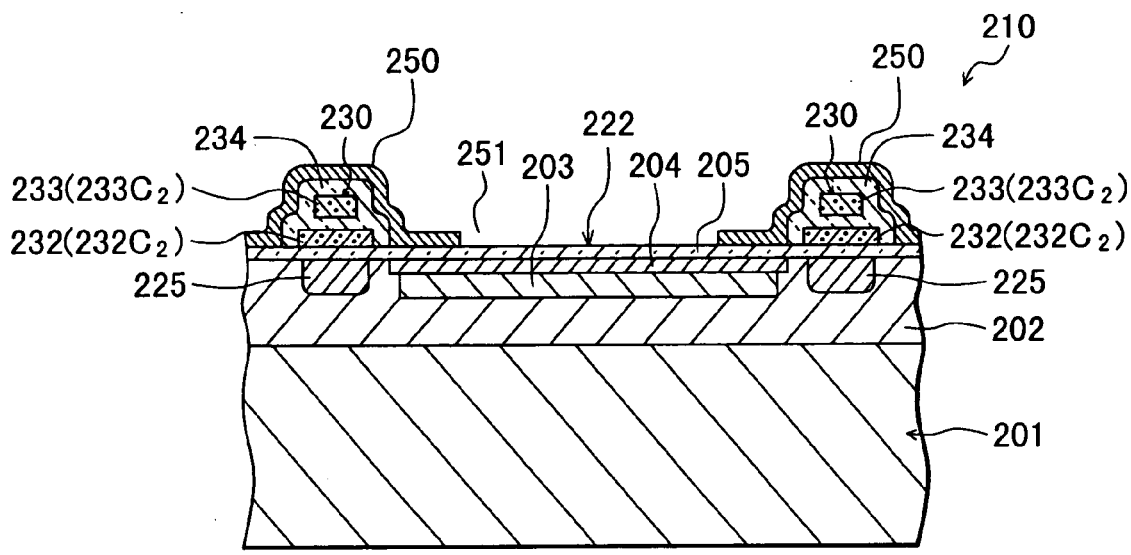
FIG. 20A is a cross-sectional view of FIG. 16 taken along line A—A.
Figure 20B:
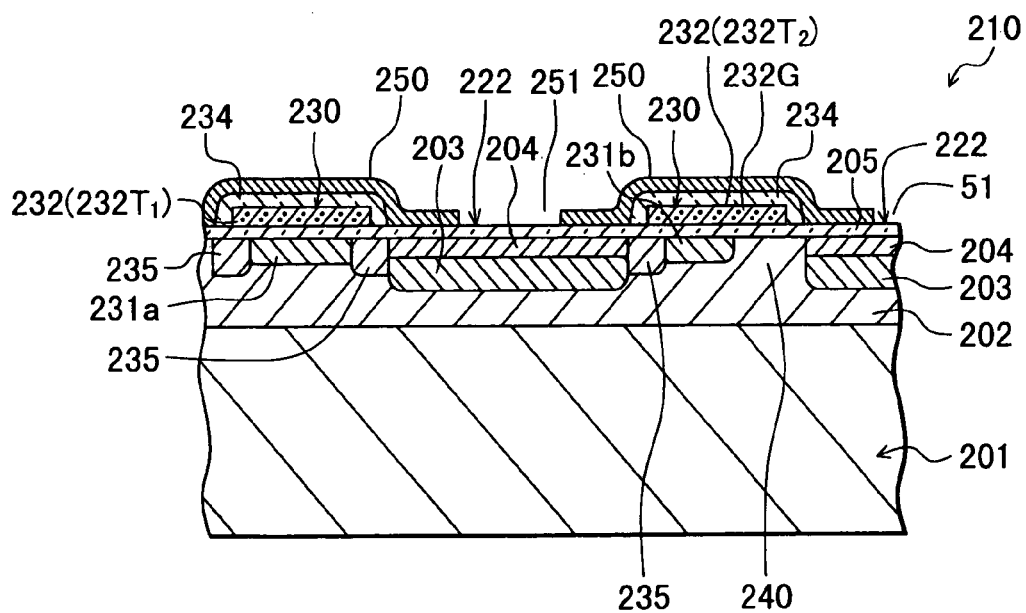
FIG. 20B is a cross-sectional view of FIG. 16 taken along line B—B.

FIG. 20A schematically shows a cross section of FIG. 16 along line A—A and FIG. 20B schematically shows a cross section of FIG. 16 along line B—B. FIGS. 6A and 6B include all functionally equivalent constituent elements shown in FIGS. 20A and 20B.

As can be seen from comparison between FIG. 20A and FIG. 6A and between FIG. 20B and FIG. 6B, the IT-CCD 200 and the IT-CCD 100 are substantially of the same configuration.

In the IT-CCD 200, light incident via the opening (light receiving section) 251 to the photoelectric converter 222 is photoelectrically converted into signal charge by the converter 222. The signal charge is read from the n-type region 203 as a signal charge storage region of the photoelectric converter 222 and is fed via a readout gate region 240 contiguous thereto to the vertical transfer CCD 230. In this operation, a predetermined field shift pulse is applied to the transfer electrode 232 (readout gate electrode region 232G) or the transfer electrode 233 (readout gate electrode region 233G).

The signal charge fed to the vertical transfer CCD 230 is sequentially transferred through the charge transfer stages of the CCD 230 and is delivered via the adjusting section to the output transfer path 270 (FIG. 15).

Figure 21:
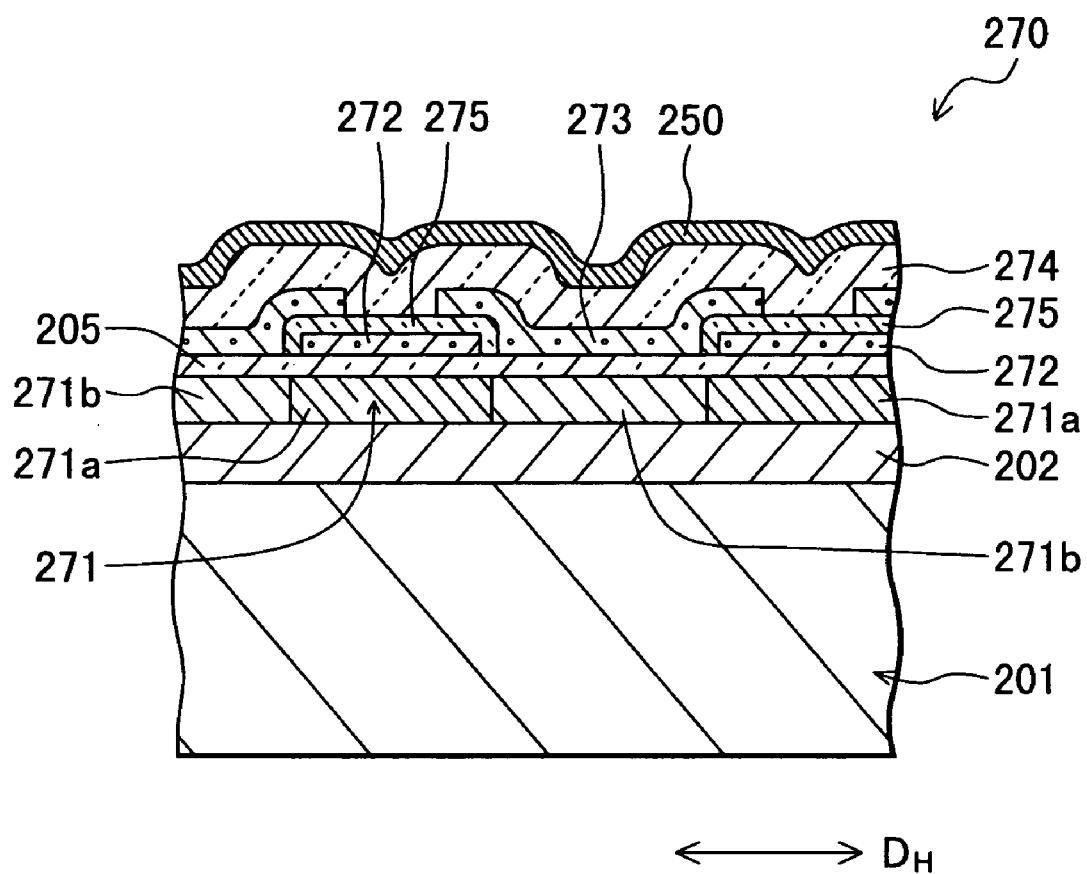
FIG. 21 is a cross-sectional view schematically showing an example of an output transfer path in the IT-CCD according to the sixth embodiment.

FIG. 21 is a cross-sectional view schematically showing an example of the output transfer path (horizontal transfer CCD) 270. The path 270 is composed of a CCD of two-phase driving type with two-layer polycrystalline silicon electrodes. FIG. 7 shows all functionally equivalent constituent components of the path 270 shown in FIG. 21. In FIG. 21, each constituent element is assigned with a reference numeral obtained by adding 200 to that of an associated constituent element shown in FIG. 7. Such functionally same constituent components as those shown in FIG. 7 will not be repeatedly described.

In the output transfer path 270, two charge transfer stages are disposed for one vertical transfer CCD 230. In the output transfer path 270, one vertical transfer CCD 230 is connected via an adjusting section 260 to every second charge transfer stage of the path 270.

The signal charge transferred from the vertical transfer CCD 230 via the adjusting section 260 is received in the potential well region of the output transfer path 270 by the output transfer path 270.

The signal charge sequentially transferred through the path 270 is passed to the output portion 280 (FIG. 15) and is converted into a signal voltage. The signal voltage is amplified in the output portion 280 to be outputted therefrom to a predetermined circuit.

To drive the IT-CCD 200, a drive pulse supplier is employed to supply predetermined driving pulses to the transfer electrodes 232, 233, 261, 262, and 263 and the output transfer path 270.

Description will now be given of an example of a method of driving the IT-CCD 200 by interlaced driving. In this example, one frame is divided into two fields, i.e., first and second fields for the interlaced driving.

Figure 22:
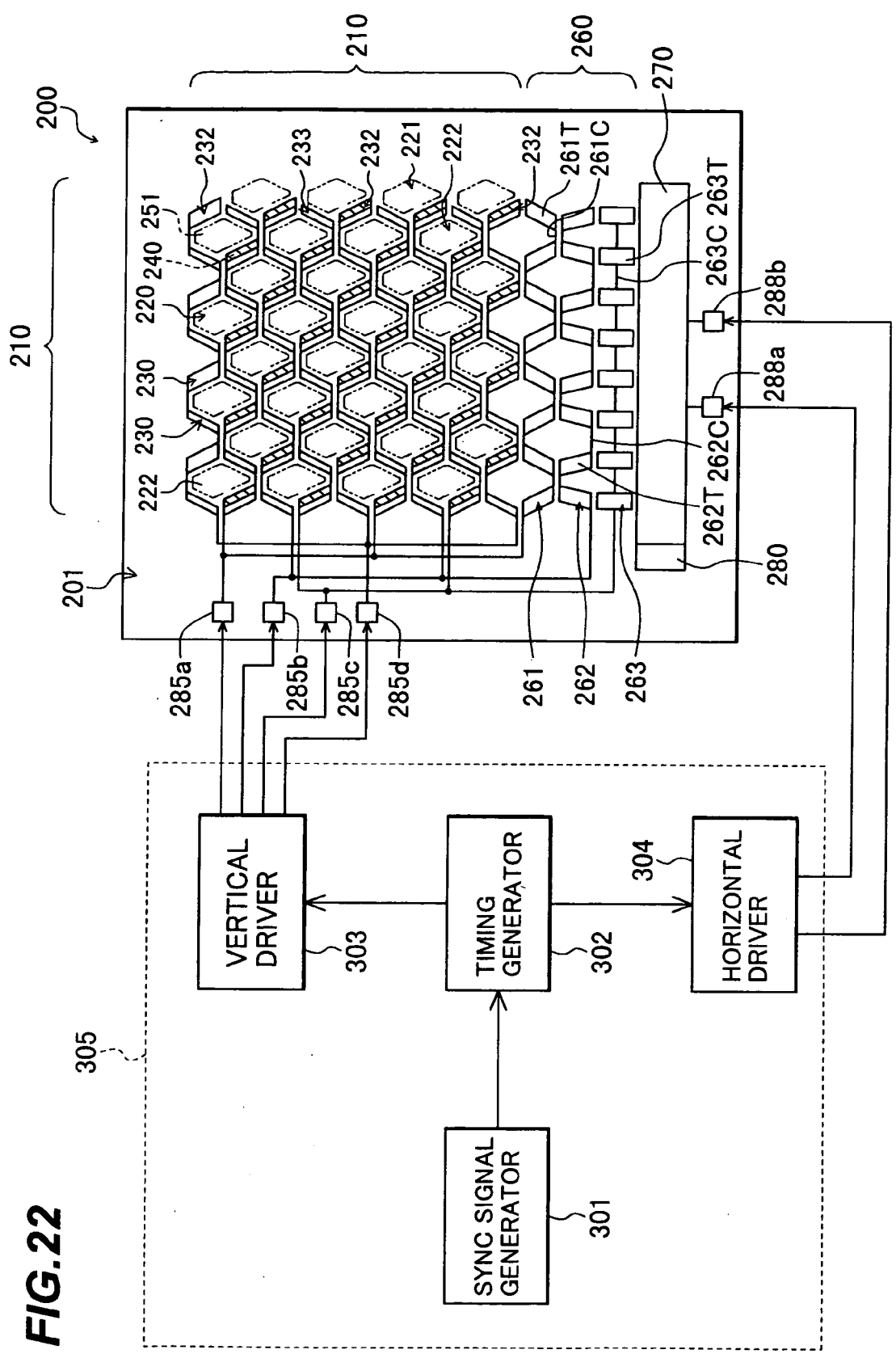
FIG. 22 is a schematic diagram showing a relationship between the IT-CCD of FIG. 15 and a driving pulse supplier to conduct interlace driving of the IT-CCD.

As shown in FIG. 22, a drive pulse supplier 305 to drive the IT-CCD 200 by interlaced driving includes, for example, a sync signal generator 301, a timing generator 302, a vertical driver circuit 303, and a horizontal driver circuit 304.

The sync signal generator 301 generates various pulses necessary for signal processing such as a vertical sync pulse and a horizontal sync pulse. The timing generator 302 generates timing signals for a four-phase vertical pulse signal necessary to drive the vertical transfer CCD 230, a field pulse necessary to read signal charge from each photoelectric converter 222, and a two-phase horizontal pulse signal necessary to drive the output transfer path 270.

The vertical driver circuit 303 generates a vertical pulse signal in response to the timing signal and feeds the vertical pulse signal via the pulse supply terminals 285a to 285d to a predetermined transfer electrode 232, 233, 261, 262, or 263. The horizontal driver circuit 304 generates a horizontal pulse signal in response to the timing signal and delivers the horizontal pulse signal via the pulse supply terminals 288a and 288b to the output transfer path 270.

Assume that the vertical pulse signals applied respectively to the terminals 285a, 285b, 285c, and 285d are represented as $V_a$, $V_b$, $V_c$, and $V_d$, respectively. The horizontal pulse signals applied respectively to the terminals 288a and 288b are designated as $H_a$ and $H_b$, respectively. The signals $H_a$ and $H_b$ are shifted π in phase from each other.

At an appropriate time in a first vertical blanking period determined by a blanking pulse, a low-level vertical pulse $V_L$ is fed to the terminals 285a and 285b and a high-level vertical pulse $V_H$ is applied to the pulse supply terminals 285c and 285d. While these vertical pulses are being applied thereto, a higher-level field shift pulse $V_R$ is delivered to the terminals 285c and 285d. The field shift pulse $V_R$ may be applied simultaneously or separately to the terminals 285c and 285d.

Figure 23A:
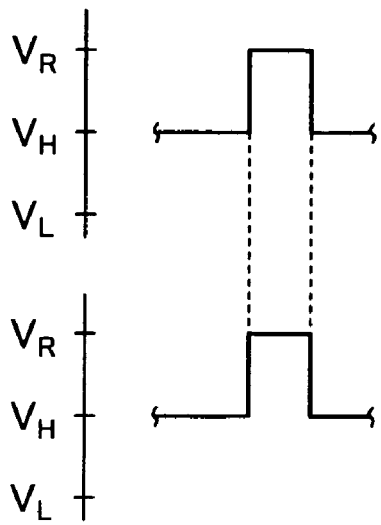
FIGS. 23A and 23B are graphs showing waveforms of filed shift pulses applied to pulse supply terminal 285c and 285d to conduct interlace driving of the IT-CCD shown in FIG. 15.
Figure 23B:
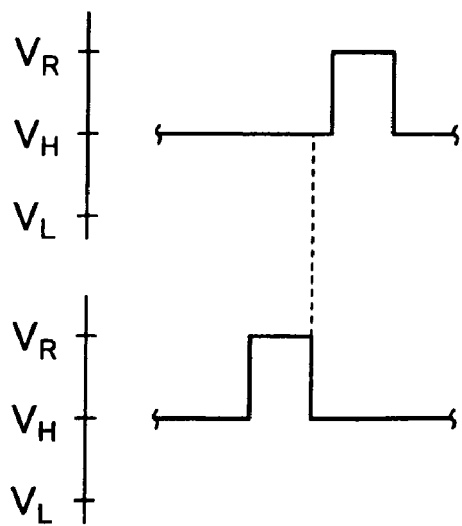

FIG. 23A shows waveforms of the field shift pulse $V_R$ which are simultaneously applied to the terminals 285c and 285d. FIG. 23B shows waveforms of the field shift pulse $V_R$ which are applied to the terminals 285d and 285c in this sequence with an interval of time therebetween.

In response to the pulse $V_R$ applied to the terminals 285c and 285d, signal charge respectively stored in the photoelectric converters 22 of the first, second, fifth, and sixth pixel rows is read therefrom to the vertical transfer CCDs 230 respectively associated therewith (signal charge readout process).

In this context, "a pixel row" indicates a group of pixels arranged in series in the row direction $D_H$. The pixel rows are called a first pixel row, a second pixel row, ..., an n-th pixel row (n is a positive integer) beginning at the pixel row nearest to the output transfer path 270 (this also applies to the other embodiments). One pixel row includes one photoelectric converter row 221 (FIG. 15). The IT-CCD 200 includes eight pixel rows ranging from the first pixel row to the eighth pixel row.

After the field shift pulse $V_R$ is applied, the vertical pulse signals as $V_a$, $V_b$, $V_c$, and $V_d$ respectively having predetermined waveforms are fed to the terminals 285a to 285d. The signal charge read out to the CCD 230 is sequentially transferred to the output transfer path 270.

The signal charge read out of each photoelectric converter 222 of the first and second pixel rows is transferred to the output transfer path 270 during a first horizontal blanking period following the vertical blanking period. The signal charge is sequentially outputted from the output portion 280 during a first effective signal period following the first horizontal blanking period. In this operation, the image signal output from the second pixel row and that from the first pixel row are alternately conducted in a unit of pixel (image signal output process).

Signal charge read from each photoelectric converter 22 of the fifth and sixth pixel rows is transferred to the output transfer path 270 during a second horizontal blanking period following the first effective signal period. The signal charge is sequentially delivered from the output portion 280 during a second effective signal period following the second horizontal blanking period. In this situation, the image signal output from the sixth pixel row and that from the fifth pixel row are alternately carried out in the pixel unit (image signal output process).

At an appropriate time in a second vertical blanking period determined by a blanking pulse after termination of the second effective signal period, a high-level vertical pulse $V_H$ is applied to the terminals 285a and 285b and a low-level vertical pulse $V_L$ is fed to the terminals 285c and 285d. While these vertical pulses are being applied thereto, a field shift pulse $V_R$ is applied to the terminal 285a and 285b. In response to the pulse $V_R$ applied, signal charge stored in each photoelectric converter 222 of third, fourth, seventh, and eighth pixel rows is read out to the vertical transfer CCD 30 respectively corresponding thereto (signal charge readout process).

The signal charge read out of each photoelectric converter 222 of the third and fourth pixel rows is transferred to the output transfer path 270 during a third horizontal blanking period following the second vertical blanking period. The signal charge is sequentially outputted from the output portion 280 during a third effective signal period following the third horizontal blanking period. In this case, the image signal output from the fourth pixel row and that from the third pixel row are alternately accomplished in a unit of pixel (image signal output process).

Signal charge read out of each photoelectric converter 222 of the seventh and eighth pixel rows is transferred to the output transfer path 270 during a fourth horizontal blanking period following the third effective signal period. The signal charge is sequentially delivered from the output portion 280 during a fourth effective signal period following the fourth horizontal blanking period. In this situation, the image signal output from the eighth pixel row and that from the seventh pixel row are alternately achieved in the pixel unit (image signal output process).

By repeatedly executing the operation above ranging from the first vertical blanking period to the fourth effective signal period, interlaced image signals, namely, image signals of each field are sequentially outputted from the output portion 280.

By disposing a color filter array in the IT-CCD 200, there is implemented an IT-CCD for color images.

In a camera requiring a color image signal for each field, color signal processing is executed for each field image output signal outputted from the output portion 280 to obtain a color image signal of each field.

In a camera requiring a color image signal for each frame, image output signals of two successive fields are once stored in a frame memory and the color signal processing is executed for the image signals of one frame to produce a frame of color image signals. In this operation, a mechanical shutter is favorably used to prevent the exposure time from varying between respective fields. After termination of the first vertical blanking period, the mechanical shutter is kept closed to prevent light from entering the pixels by the second vertical blanking period is started. As a result, for each of the first and second fields, a field image output signal at an identical time can be obtained. This also applies to a camera requiring a frame of monochrome image signals. In a camera requiring only one sheet of frame image, the mechanical shutter is kept closed after the first vertical blanking period is terminated. This prevents smear from appearing in the image of the second field.

The IT-CCD 200 of the sixth embodiment described above is an IT-CCD of a simple configuration. In an actual IT-CCD, a microlens is ordinarily arranged to improve photoelectric conversion efficiency of the photoelectric converter 222. In an IT-CCD for color images, a color filter array is disposed.

The microlens array and the color filter array can be disposed in a manner similar to that used to dispose the microlens array and the color filter array in the solid-state image pickup device 110 of the second embodiment described above by referring to FIGS. 9A and 9B.

Figure 24A:
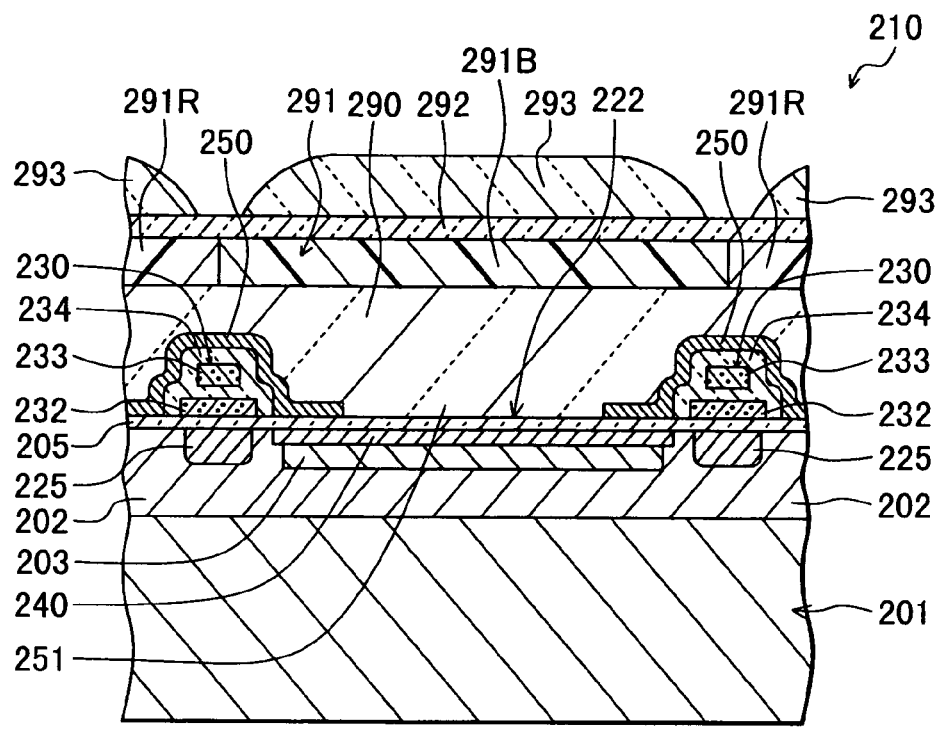
FIGS. 24A and 24B are cross-sectional views schematically showing an IT-CCD according to a seventh embodiment.
Figure 24B:
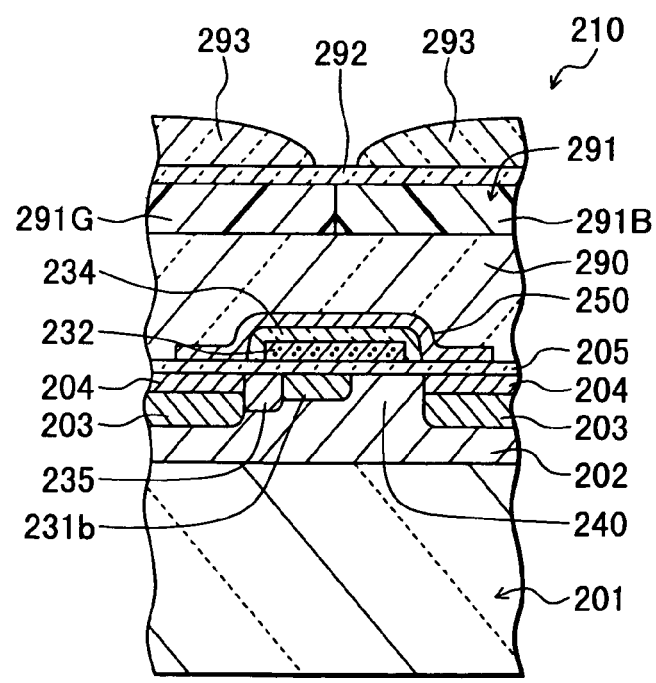

FIGS. 24A and 24B are cross-sectional views partly showing the IT-CCD 210 of the seventh embodiment. These diagrams partly show the light sensing section of the IT-CCD 210. The IT-CCD 210 is implemented by adding a color filter array and a microlens array to the IT-CCD 200 of the sixth embodiment. That is, the IT-CCD 210 is an IT-CCD for color images.

In FIG. 24A or 24B, the same constituent components as those shown in FIG. 20A or 20B are assigned with the same reference numerals and duplicated description thereof will be avoided.

In the IT-CCD 210, a first planarizing film 290 is disposed to cover a light shielding film 250 on the light sensing section and the light receiving section 251 of each pixel. Formed on a surface of the first planarizing film 290 is a color filter array 291. On the color filter array 291, a second planarizing film 292 is disposed. A microlens array including a predetermined number of microlenses 293 is disposed on a surface of the second planarizing film 292.

In the color filter array 291, a red filter 291R, a green filter 291G, and a blue filter 291B are arranged in a hexagonal pattern.

Figure 25:
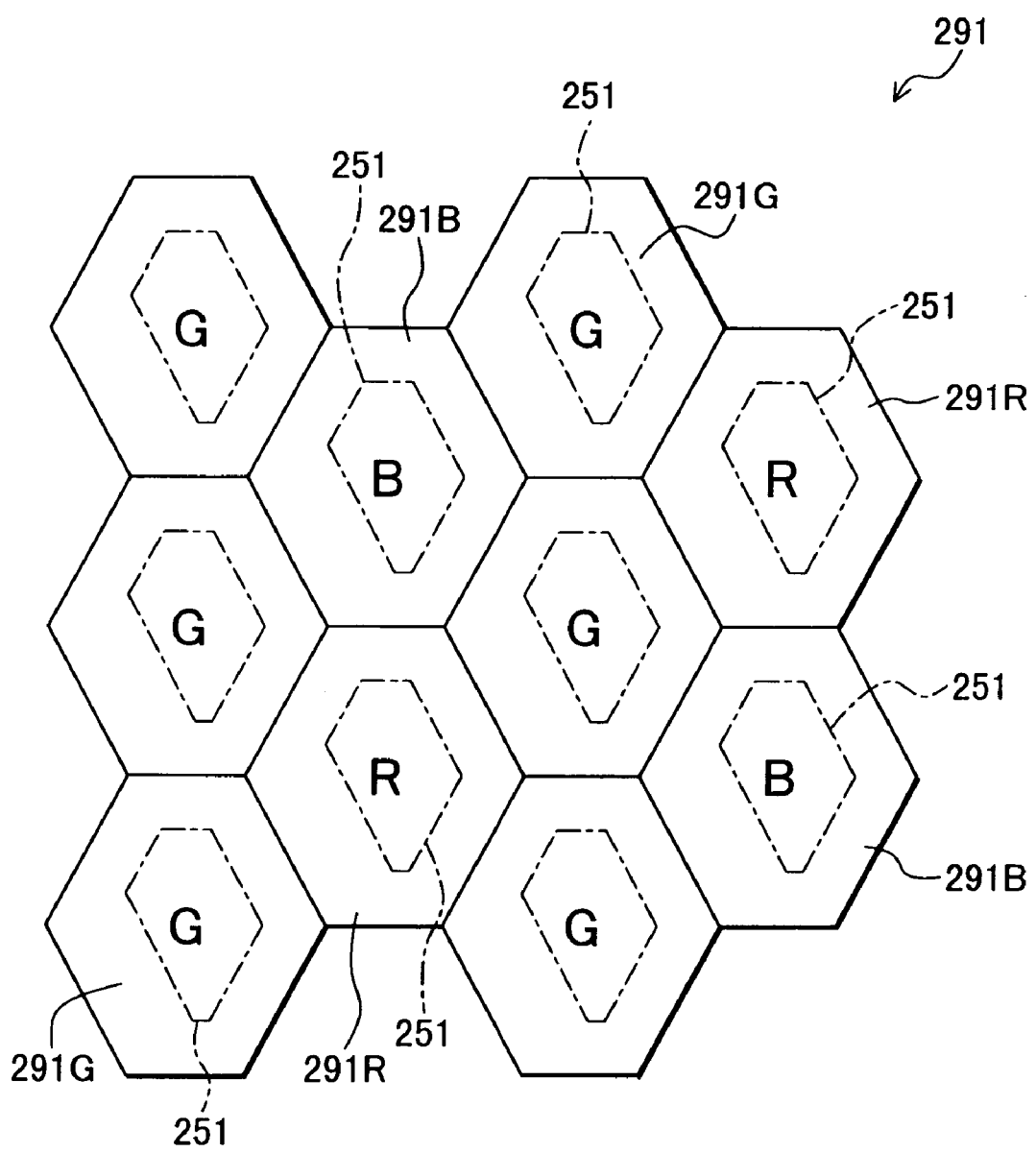
FIG. 25 is a plan view showing an example of a color filter array.

FIG. 25 partly shows in plan view an example of the color filter array 291. The array 291 alternately includes a color filter column including only green filters 291G and a color filter column alternate including a blue filter 291B and a red filter 291R.

Each of the color filters 291R, 291G, and 291B is formed to cover in plan view the light receiving section 51 of each pixel. In FIG. 25, letters R, G, and B indicate red, green, and blue of the respectively color filters.

The IT-CCD 210 having the color filter array 291 and the microlens array includes, like the IT-CCD 200 of the sixth embodiment, an output transfer path. In the output transfer path, the first planarizing film 290 is ordinarily formed on the light shielding film 250 of the output transfer path 270 shown in FIG. 21. The second planarizing film 292 is disposed on the first planarizing film 290.

Figure 26:
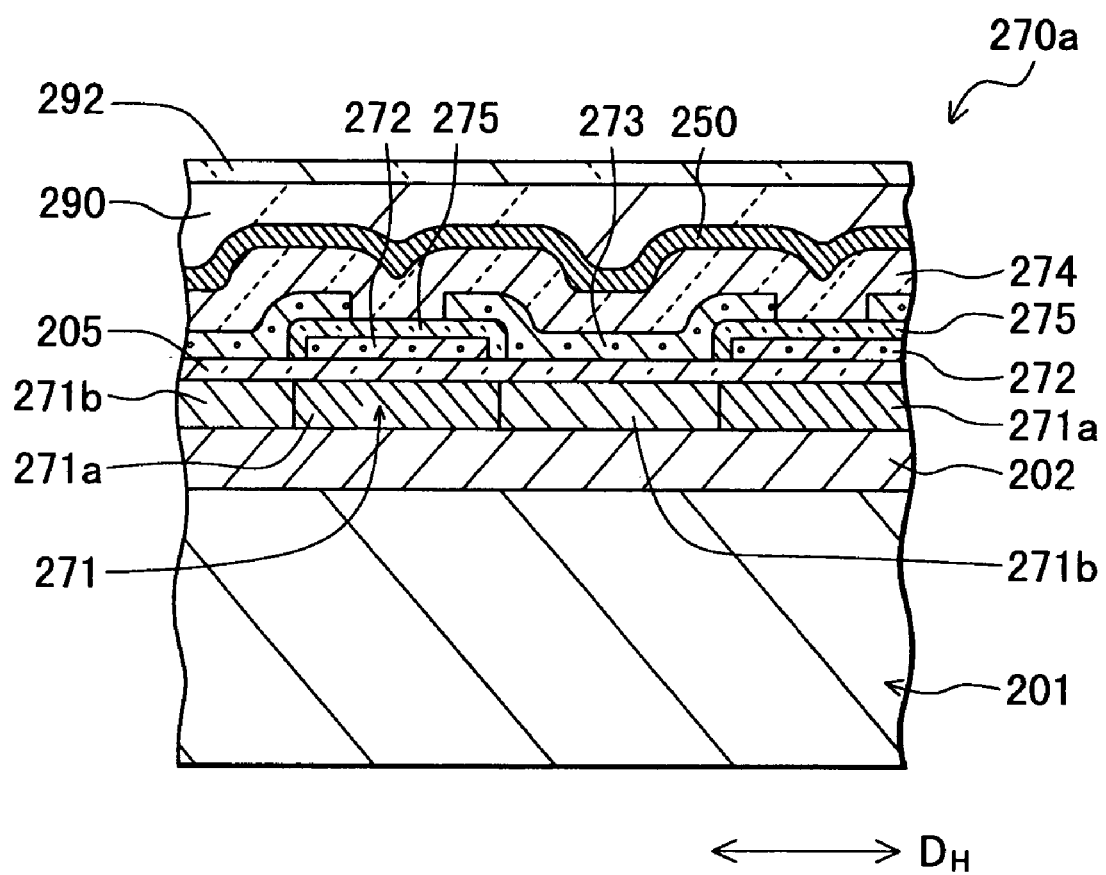
FIG. 26 is a partial cross-sectional view schematically showing an output transfer path in the IT-CCD of the seventh embodiment.

FIG. 26 is a cross-sectional view schematically showing part of the output transfer path 270a of the IT-CCD 210. In FIG. 26, the same constituent elements as those shown in FIGS. 21, 24A, or 24B are assigned with the same reference numerals and duplicated description thereof will be avoided.

The first planarizing film 290 shown in FIG. 26 is formed in the process to dispose the first planarizing film 290 on the light sensing section 210 (FIG. 24A or 24B). The second planarizing film 292 shown in FIG. 26 is arranged in the process to dispose the second planarizing film 292 over the color filter array 291 (FIG. 24A or 24B).

In the IT-CCD 210 having the color filter array 291 shown in FIG. 25, the green filter 91G is arranged over each photoelectric converter 222 of one of two adjacent pixel rows. In the other one of two adjacent pixel rows, the blue filter 291B or the red filter 291R is disposed on each photoelectric converter 222. In the other pixel row above, the blue and red filters 291B and 291R are alternately arranged in this order or in an order reverse to this order.

Full-color information is generated according to signal charge from each photoelectric converter 222 of the pixel rows provided with only the green filter 291G and signal charge from each photoelectric converter 222 of the pixel rows alternately provided with the blue filter 291B and the red filter 291R.

When the light collecting efficiency and sensitivity of each pixel vary between two adjacent pixel rows, the same disadvantageous event takes place between the pixel row provided only with the green filter 291G and the pixel row alternately provided with the blue and red filters 291B and 291R. Resultantly, a ratio between a red signal output and a green signal output and a ratio between a flue signal output and a green signal output obtained according to signal charge stored in the photoelectric converters 222 of these pixel rows become different from each other. This means that color balance is lost in the output signal from the IT-CCD 210. This leads to color shading in a picture reproduced from the signal.

However, the light sensing section of the IT-CCD 210 is substantially identical to the light sensing section 210 of the IT-CCD 200 of the sixth embodiment. That is, for all pixels, the readout gate region 240 is contiguous to the lower-left edge of the photoelectric converter 222 in plan view.

Therefore, without particularly reducing the size of the light receiving section 251 of each pixel relative to the size of the photoelectric converter 222, the light receiving section 251 can be easily formed to be equal in contour, size, and direction. Resultantly, while preventing the minimization in area of the light receiving section 251 of each pixel, the light receiving sections 251 can be easily formed to be equal in contour, size, and direction between two adjacent pixel rows.

Consequently, although the shifted-pixel layout is employed in the IT-CCD 210, the event in which the light collecting efficiency and sensitivity of each pixel vary between two adjacent pixel rows can be easily prevented. Therefore, the color shading rarely occurs. Additionally, the pixel density can be easily improved while suppressing the decrease in area of the opening (light receiving section) 251 of each pixel.

Figure 27:
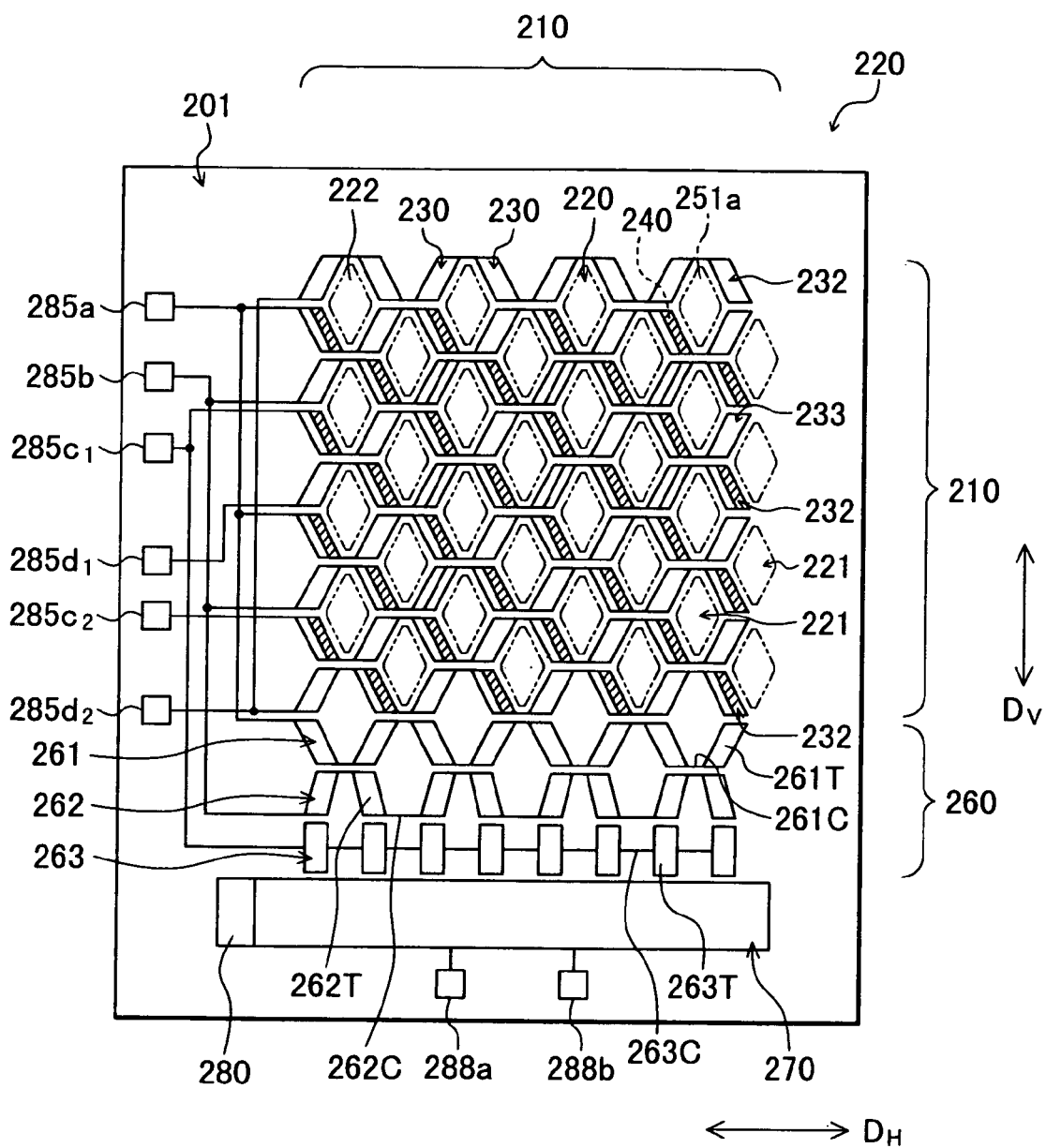
FIG. 27 is a plan view schematically showing an IT-CCD according to an eighth embodiment.

Next, an IT-CCD of an eighth embodiment will be described by referring to FIG. 27. FIG. 27 is a plan view schematically showing an IT-CCD 220 of the eighth embodiment.

The IT-CCD 220 has the same configuration as the IT-CCD 200 described above excepting (i) a contour of a light receiving section of each pixel, (ii) the number of pulse supply terminals to supply predetermined driving pulses to each of transfer electrodes 232, 233, 261, 262, and 263, and (iii) specifications of connections between the pulse supply terminals and the transfer electrodes 232, 233, 261, 262, and 263. In the configuration shown in FIG. 27, the same constituent components as those shown in FIG. 15 are assigned with the same reference numerals and duplicated description thereof will be avoided.

As shown in FIG. 27, the IT-CCD 220 has a light receiving section 251a for each pixel and the section 251a has a shape of almost a parallelogram in which a longer diagonal is substantially parallel to the column direction $D_V$ and a shorter diagonal is substantially parallel to the row direction $D_H$.

The IT-CCD 220 further includes six pulse supply terminals 285a, 285b, 285$c_1$, 285$c_2$, 285$d_1$, and 285$d_2$ to supply predetermined driving pulses to the transfer electrodes 232, 233, 261, 262, and 263.

For this configuration, the pulse supply terminal 285c shown in FIG. 15 is divided into the pulse supply terminals 285$c_1$ and 285$c_2$. The pulse supply terminal 285d shown in FIG. 15 is divided into the pulse supply terminals 285$d_1$ and 285$d_2$.

Each of the pulse supply terminals 285a, 285b, 285$c_1$, 285$c_2$, 285$d_1$, and 285$d_2$ is electrically connected to the predetermined transfer electrode 232, 233, 261, 262, or 263.

Also in the IT-CCD 220, each readout gate region 240 is contiguous to the lower-left edge of the associated photoelectric converter 222 in a hexagonal shape. The light receiving sections 251a of the respective pixels are substantially equal in contour, size, and direction to each other. In the IT-CCD 220, because of almost the same reason as for the IT-CCD 200 of the sixth embodiment, without greatly minimizing the size of the light receiving sections 251a relative to that of the photoelectric converter 222, the light receiving section 251a of each pixel can be easily formed to be equal in contour, size, and direction between two adjacent pixel rows.

Resultantly, although the IT-CCD 220 employs the shifted-pixel layout, the event in which the light collecting efficiency and sensitivity of each pixel vary between two adjacent pixel rows can be easily prevented. Moreover, it is possible to easily increase the pixel density while suppressing the decrease in the area of opening (the light receiving section) 251a of each pixel.

By disposing a color filter array in the IT-CCD 220, an IT-CCD for color images can be implemented. The color filter array can be produced in a procedure similar, for example, to the procedure to dispose the color filter array in the IT-CCD 210 of the seventh embodiment.

When the IT-CCD 220 is modified to produce color images, color shading seldom occurs for substantially the same reason as for the IT-CCD 210 of the seventh embodiment.

The IT-CCD 220 can be driven, like the IT-CCD 200, by interlaced driving. In this case, a vertical pulse signal $V_a$ is applied to the pulse supply terminals 285a and a vertical pulse signal $V_b$ is applied to the pulse supply terminal 285b. A vertical pulse signal $V_c$ is applied to the pulse supply terminals 285$c_1$ and 285$c_2$ and a vertical pulse signal $V_d$ is fed to the pulse supply terminals 285$d_1$, and 85$d_2$. A horizontal pulse signal $H_a$ is applied to the pulse supply terminal 288a and a horizontal pulse signal $H_b$ is delivered to the pulse supply terminal 288b.

Resultantly, as in the IT-CCD 200 of the sixth embodiment, one frame is subdivided into two fields, i.e., first and second fields. An image signal output of each field can be attained through operation similar to the operation of the IT-CCD 200 of the sixth embodiment. By conducting the operation above for the first and second fields, an image output signal can be obtained for one frame.

The IT-CCD 220 can be driven while thinning out the number of pixel rows of which signal charge to be read out to one quarter of all pixel rows. In the thinning-out driving, at an appropriate time during a first vertical blanking period determined by the blanking pulse, for example, a low-level vertical pulse $V_L$ is applied to the pulse supply terminals 285a and 285b and a high-level vertical pulse $V_H$ is applied to the pulse supply terminals 285$c_1$, 285$c_2$, 285$d_1$, and 285$d_2$. While these vertical pulses $V_L$ and $V_H$ are being fed to the terminals above, a field shift pulse $V_R$ is applied to the pulse supply terminals 285$c_2$ and 285$d_2$. In response to the field shift pulse $V_R$, signal charge stored in each photoelectric converter 222 of the first and second pixel rows is read out to an associated vertical transfer CCD 230 (signal charge readout process).

By processing the obtained signal charge in a manner similar to the signal charge processing by ordinary interlaced driving, there can be obtained field image signals or frame image signals thinned out to one quarter of the original image signals.

Naturally, in a manner similar to that of the quarter thinning-out process above, two desired pixel rows can be thinned out to obtain one quarter of the original image signals. Pixel rows to be thinned out can be selected as desired when necessary. According to the selection of the pixel rows, specifications are determined for connections between the pulse supply terminals 285a, 285b, 285$c_1$, 285$c_2$, 285$d_1$, and 285$d_2$ and the transfer electrodes 232, 233, 261, 262, and 263. When the IT-CCD 220 is an IT-CCD specified for color images, the pixel rows to be thinned out are selected in consideration of also an allocation pattern of each color filter of a color filter array disposed in the IT-CCD 220.

The thinning-out above is carried out to obtain image signals of rows (pixel rows) thinned out to one quarter of the original pixel rows in any situation. Namely, it is not necessary to read out signal charge of all pixels. Since the IT-CCD 220 includes only eight pixel rows, the quarter thinning-out operation is completed by one horizontal reading operation. However, the actual number of pixel rows is, for example, 600 or more.

In an IT-CCD in which n stages of the light sensing sections 210 shown in FIG. 27 are sequentially arranged in the column direction $D_V$, to obtain frame image signals thinned out to one quarter of the original image signals, the thinning-out is conducted from the first stage to the n-th stage. In this operation, for the respective stages, signal charge is simultaneously read from each photoelectric converter 222 of a desired pixel row and is fed to the vertical transfer CCD 230. Signal charge read out of each stage is sequentially transferred by an associated vertical transfer CCD 230 to the output transfer path 270. The signal charge is then transferred through the path 270 to be sequentially outputted from the output portion 280.

For example, for a digital still camera to conduct optimal setting of exposure conditions (a shutter speed and a lens opening), focus adjustment, and monitor picture display, it is necessary to obtain image output signals at a high frame frequency of about 30 frames per second.

On the other hand, to produce a digital still camera having high resolution, it is desired that the IT-CCD of the digital camera have one million pixels or more.

However, when the number of pixels exceeds one million, quite a long period of time is required to obtain an image signal output for one frame, for example, one second for several frames. As a result, the optimal setting of exposure conditions, the focus adjustment, and the monitor picture display cannot be achieved.

Consequently, to fabricate a digital still camera having high resolution, it is desired to use an IT-CCD in which operations other than the readout of a still picture recorded at depression of the shutter are achieved at a high frame frequency. The IT-CCD 220 can selectively conduct the ordinary interlaced driving and the quarter thinning-out. The frame frequency in the thinning-out driving is four times that in the ordinary interlaced driving. The IT-CCD 220 is therefore an IT-CCD of a suitable configuration to attain image signals of a high frame frequency.

Figure 28:
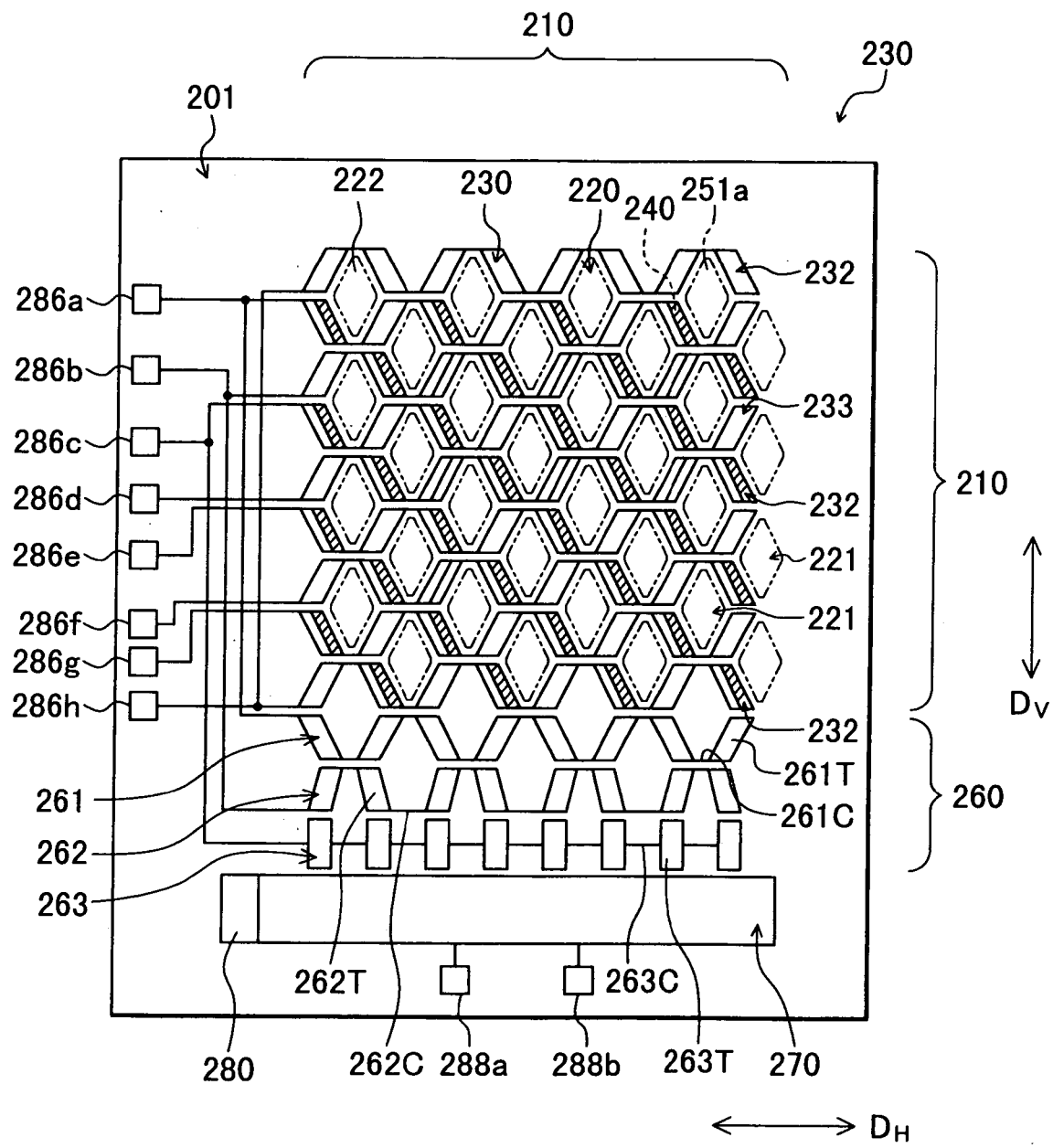
FIG. 28 is a plan view schematically showing an IT-CCD according to a ninth embodiment.

Referring next to FIG. 28, description will be given of an IT-CCD of a ninth embodiment. FIG. 28 is a plan view schematically showing an IT-CCD 230 of the ninth embodiment.

The IT-CCD 230 is of the substantially same constitution as the IT-CCD 220 excepting (i) the number of pulse supply terminals to supply predetermined driving pulses to each of the transfer electrodes 232, 233, 261, 262, and 263 and (ii) specifications of connections between the pulse supply terminals and the transfer electrodes 232, 233, 261, 262, and 263. In FIG. 28, the same constituent elements as those shown in FIG. 27 are assigned with the same reference numerals and duplicated description thereof will be avoided.

As shown in FIG. 28, the IT-CCD 230 has eight pulse supply terminals 286a to 286h to supply predetermined driving pulses to the transfer electrodes 232, 233, 261, 262, and 263.

Each of the pulse supply terminals 286a to 286h is electrically connected to the predetermined transfer electrode 232, 233, 261, 262, or 263.

In the IT-CCD 230 shown in FIG. 28, because of almost the same reason as for the IT-CCD 220 of the eighth embodiment, without conspicuously minimizing the size of the light receiving section 251a relative to the size of the photoelectric converter 222, the light receiving sections 251a can be easily manufactured to be substantially equal in contour, size, and direction between two adjacent pixel rows.

Resultantly, although the IT-CCD 230 employs the shifted-pixel layout, it is possible to easily prevent the event in which the light collecting efficiency and sensitivity of each pixel vary between two adjacent pixel rows. In addition, the pixel density can be easily increased while suppressing the decrease in area of each opening (light receiving section) 251a of each pixel.

When the IT-CCD 230 is modified to produce color images, color shading rarely occurs for substantially the same reason as for the IT-CCD 220 of the eighth embodiment.

To drive the IT-CCD 230 by interlaced driving, predetermined vertical pulses are respectively applied to the pulse supply terminals 286a to 286h. The horizontal pulse signals $H_a$ and $H_b$ are applied to the pulse supply terminals 288a and 288b, respectively.

As a result, one frame can be subdivided into four fields, namely, a first field including the first and second pixel rows, a second field including the third and fourth pixel rows, a third field including the fifth and sixth pixel rows, and a fourth field including the seventh and eighth pixel rows.

For each field, an image signal output can be obtained through operation similar to the operation to produce an image signal output of one field when one frame is divided into two fields for the interlaced driving (reference is to be made to the IT-CCD 200 of the sixth embodiment). By accomplishing the operation for the first to fourth fields, an image output signal can be obtained for one frame.

When the image signal output is produced only for an identical field in any situation, the IT-CCD 230 can be driven by quarter thinning-out driving, namely, the number of pixel rows from which signal charge to be read out is reduced to one quarter of all pixel rows. In an IT-CCD including n stages of the light sensing sections 210 shown in FIG. 28 disposed in the column direction $D_V$, to produce frame image signals thinned out to one quarter of the original image signals, the thinning-out operation above is sequentially carried out from the first stage to the n-th stage. In the operation, for the respective stages, signal charge is simultaneously read from each photoelectric converter 222 of a desired pixel row and is delivered to the associated vertical transfer CCD 230. Signal charge read out of each stage is sequentially transferred by each vertical transfer CCD 230 to the output transfer path 270. The signal charge is passed through the path 270 to be sequentially outputted from the output portion 280.

The IT-CCD 230 can drive each vertical transfer CCD 230 by eight-phase driving. In a CCD of eight-phase driving type, one potential well is formed for six to seven successive charge transfer stages and charge signal stored in the potential well is transferred. On the other hand, in a CCD of four-phase driving type, one potential well is disposed for two to three successive charge transfer stages and charge signal stored in the potential well is transferred.

Therefore, when the transfer electrodes 232 and 233 have an almost equal design pattern, the vertical transfer CCD of eight-phase driving type could transfer signal charge of about two to three times that of the vertical transfer CCD of four-phase driving type.

Resultantly, in the IT-CCD 230, by decreasing the channel width of the charge transfer channel of each vertical transfer CCD 230, the area of the photoelectric converter 222 and the area of the light receiving section 251*a* can be as much increased in proportion to the decrease in the channel width. Consequently, the sensitivity, the saturation output level and the dynamic range can be increased.

By arranging a color filter array, the IT-CCD 230 can be modified to an IT-CCD for color images. The color filter array can be disposed in almost the same production procedure as for the color filter array employed, for example, in the IT-CCD 210 of the seventh embodiment.

In a camera requiring color image signals for each field, color signal processing is executed for image output signals of each field delivered from the output portion 280 to obtain color image signals for each field.

In a camera requiring color image signals of a frame, image output signals of four successive fields are once accumulated in a frame memory and color signal processing is executed for image output signals of one frame to obtain color image signals for one frame. To prevent exposure time from varying between respective fields, a mechanical shutter is favorably employed. After the vertical blanking period for the first field is terminated, the mechanical shutter is kept closed to prevent light from entering the pixels by the vertical blanking period for the fourth field is started. As a result, for each of the first to fourth fields, there is obtained a field image output signal at an identical time. This also applies to a camera requiring a frame of monochrome image signals. In a camera requiring only one sheet of frame image, the mechanical shutter is kept closed after the vertical blanking period for the first field is terminated. This prevents smear from appearing in the image of the second to fourth fields.

Figure 29:
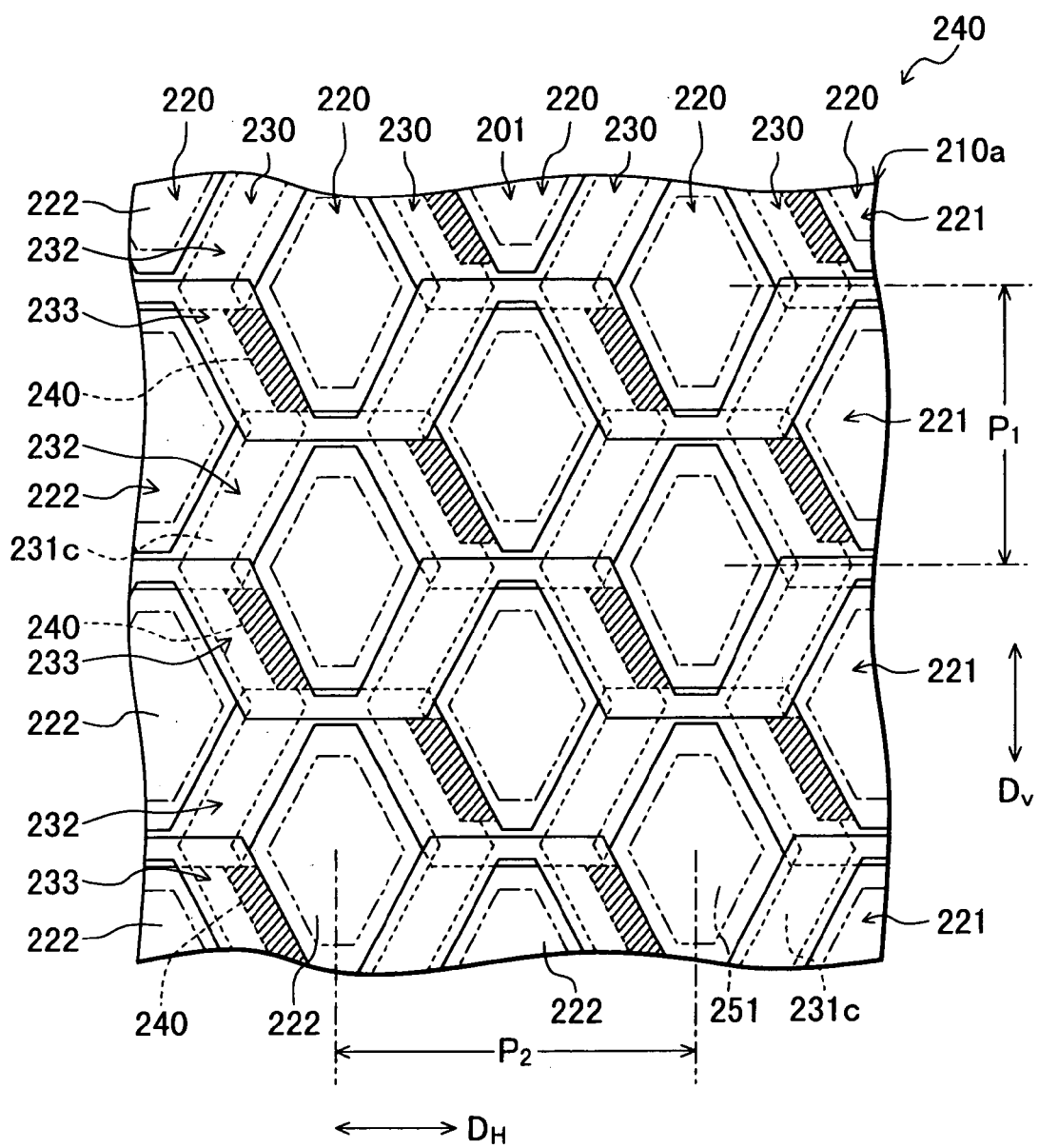
FIG. 29 is a plan view showing a light sensing section of an IT-CCD according to a tenth embodiment.
Figure 30:
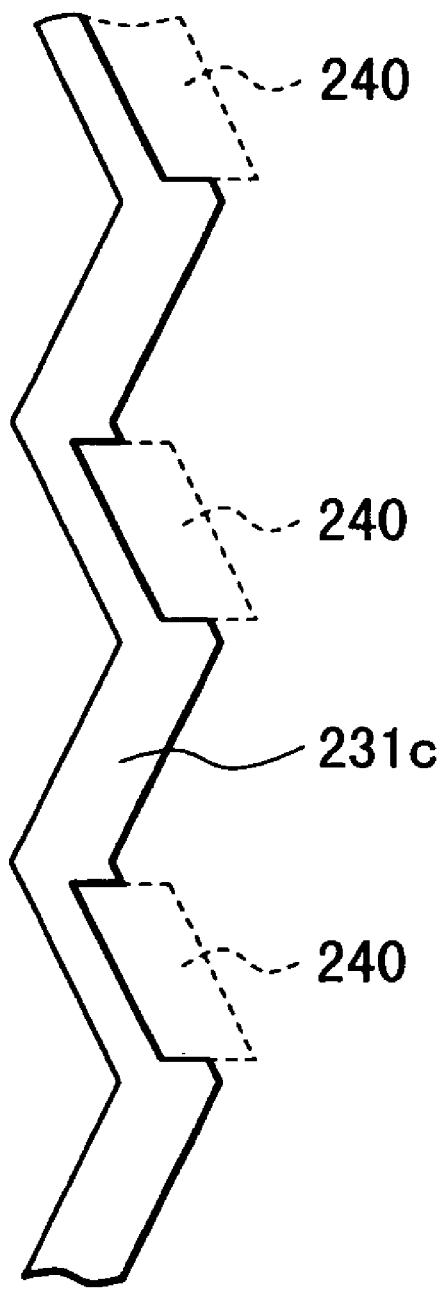
FIG. 30 is a plan view schematically showing one of charge transfer channels 231c shown in FIG. 29.

Description will now be given of an IT-CCD of a tenth embodiment by referring next to FIGS. 29 and 30. FIG. 29 is a magnified plan view showing a light sensing section 210 of an IT-CCD 240 of the tenth embodiment. FIG. 30 is a plan view schematically showing a charge transfer channel 231*c* shown in FIG. 29.

The IT-CCD 240 is configured almost in the same way as for the IT-CCD 200 of the sixth embodiment excepting that the light sensing section 210 of the IT-CCD 200 of the sixth embodiment is replaced with a light sensing section 210*a*. In FIGS. 29 and 30, the same constituent elements as those shown in FIGS. 16, 19A, or 19B are assigned with the same reference numerals and description thereof will be partly avoided.

The IT-CCD 240 has a predetermined number of charge transfer channels 231*c* having a particular shape in the light sensing section 210*a*. The channel 231*c* includes a first section contiguous to the readout gate region 240 and another section wider than the first section (FIG. 30). Two adjacent charge transfer channels 231*c* are configured to be shifted from each other by one charge transfer stage in the column direction $D_v$.

Selection of the channel width in the charge transfer channel 231*c* leads to advantages as follows. In the forming of the readout gate region 240 having a desired size (width) on the semiconductor substrate 201, it is not necessary to particularly increase, in the transfer path forming sections of the transfer electrode 232, the width of the transfer path forming section including the readout gate electrode region relative to the width of the other transfer path forming sections. This also applies to the transfer electrode 233.

Resultantly, an event in which the region which cannot be used as the light receiving section 251 of each pixel on the surface of the photoelectric converter 222 increases in association with the forming of the readout gate region 240, and the readout gate electrode region can be easily prevented. Simultaneously, the light receiving sections 251 can be easily produced to be substantially equal in contour, size, and direction between two adjacent pixel rows.

Consequently, in the IT-CCD 240, the event in which the light collecting efficiency and sensitivity of each pixel vary between two adjacent pixel rows can be more easily prevented when compared with the IT-CCDs of the other embodiments. Additionally, it is easier in the IT-CCD 240 of this embodiment than in those of the other embodiments to increase the pixel density while suppressing the decrease in area of the light receiving section 251 (or 251*a*) of each pixel.

In the IT-CCD 240 having the light sensing section 210*a* shown in FIG. 29, for every second one of a plurality of sections of each charge transfer channel 231*c* (every second photoelectric converter row 221), the readout gate region 240 is manufactured to be contiguous thereto. That is, the narrow region or section with a narrowed width of the channel 231*c* is disposed for every second charge transfer stage. The charge transfer stage having a narrow width in the charge transfer channel 231*c* need only store signal charge for a short period of time and transfer the signal charge to a subsequent charge transfer stage.

When the charge transfer channel 231*c* and the readout gate region 240 are disposed as above, charge transfer efficiency equivalent to that obtained in the prior art can be attained while keeping unchanged as in the prior art the channel width of the sections of the channel 231*c* which are not contiguous to the readout gate region 240.

However, when the width of the section of the channel 231 contiguous to the readout gate region 240 is too small, it is difficult to store signal charge in the pertinent charge transfer stage. This width is favorably about 50% to about 95% of that of the section of the channel 231 not contiguous to the readout gate region 240 and is particularly favorable about 60% to about 80% thereof.

Figure 31:
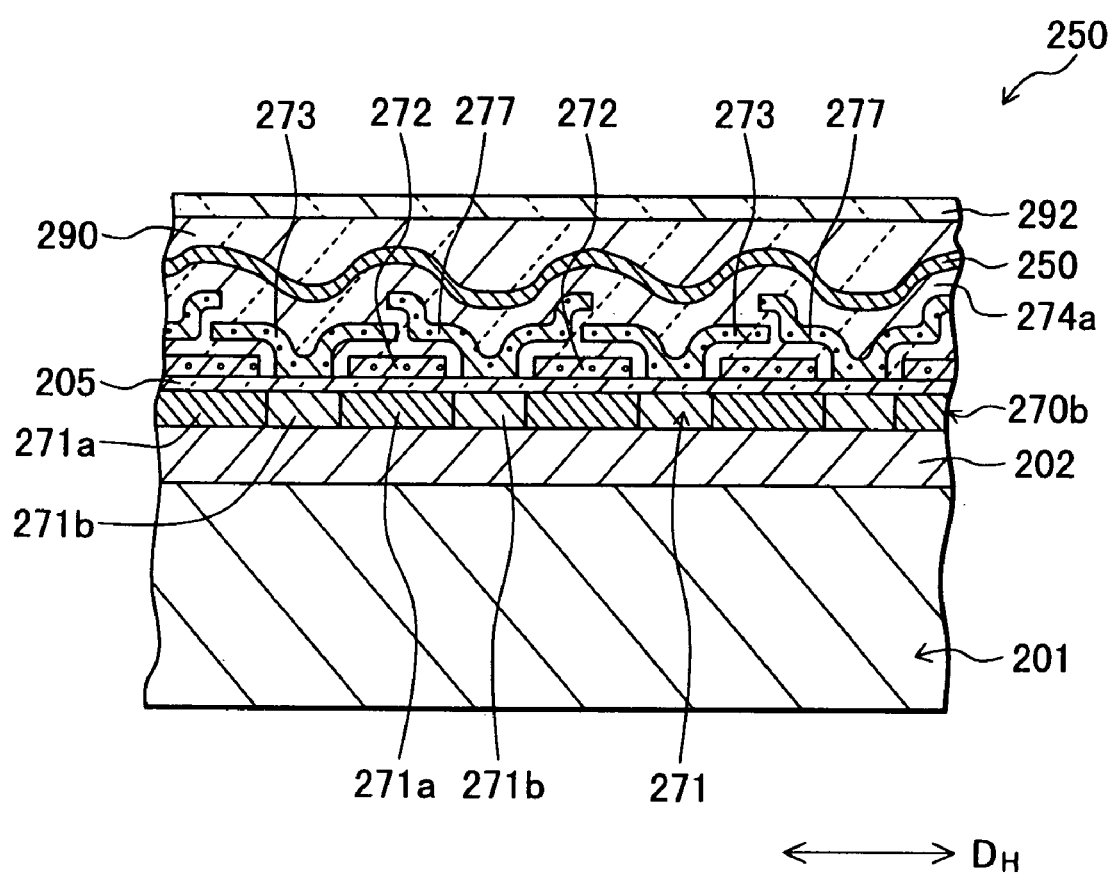
FIG. 31 is a cross-sectional view schematically showing an example of an output transfer path being composed of a CCD of three-layer polycrystalline silicon electrodes in an IT-CCD of an 11th embodiment.

Description will now be given of an IT-CCD of an 11th embodiment by referring next to FIG. 31. FIG. 31 is a partial cross-sectional view schematically showing an example of an output transfer path 270*b* of an IT-CCD 250 of the 11th embodiment. The output transfer path 270*b* is composed of a CCD of two-phase driving type with three-layer polycrystalline electrodes.

The IT-CCD 250 is configured almost in the same way as for the IT-CCD 200 of the sixth embodiment excepting that the output transfer path 270 of the IT-CCD 200 is replaced with an output transfer path 270*b*. In FIG. 31, the functionally same constituent elements as those of the output transfer path 270*a* shown in FIG. 26 are assigned with the same reference numerals and duplicated description thereof will be avoided.

Like the output transfer path 270*a* of the IT-CCD 210 shown in FIG. 26, the output transfer path 270*b* includes a charge transfer channel 271 produced as follows. At a predetermined locations of a p-type well 202 formed on one surface of a semiconductor substrate 201, a predetermined number of $n^+$-type regions 271*a* having a high n-type impurity concentration and n-type regions 271*b* having a low n-type impurity concentration are alternately disposed in the row direction $D_H$. The $n^+$-type region 271*a* is wider than the n-type region 271b. The charge transfer channel 271 extends in the row direction $D_H$.

The output transfer path 270b has three kinds of transfer electrodes 272, 273, and 277 made of a polycrystalline layer. Each transfer electrode 272 is disposed on the n+-type region 271a. The transfer electrodes 273 and 277 are alternately arranged on the n-type regions 271b associated therewith.

The transfer electrodes 272, 273, and 277 are disposed to intersect the charge transfer channel 271. The transfer electrode 273 has an end section on the side of the electrode 272, the section covering the transfer electrode 272. On the side of the transfer electrode 273, the transfer electrode 277 has an end covering the transfer electrode 273. In short, the electrodes 272, 273, and 277 are arranged in a so-called overlapping transfer electrode configuration.

One n+-type region 271a and one transfer electrode 272 disposed on the region 271a form one potential well region. Similarly, one n-type region 271b and one transfer electrode 273 or one transfer electrode 277 form one potential barrier region.

One charge transfer stage is configured by applying a voltage of a predetermined level to the transfer electrode 273 or 277 forming one potential barrier region and to the transfer electrode 272 forming one potential well region immediately downstream (the side of the output portion 280) of the potential barrier.

Disposed on each of the transfer electrodes 272, 273, and 277 is an insulating film. FIG. 31 shows only one insulating film 274a for simplicity of the drawing.

As for the output transfer path 270 shown in FIG. 15, two pulse supply terminals are arranged to supply a predetermined driving pulse to the output transfer path 270b. The transfer electrode 272 and the transfer electrode 273 or 277 immediately downstream of the electrode 272 are electrically connected to an identical pulse supply terminal. Two adjacent transfer electrodes 272 with the transfer electrode 273 or 277 intervening therebetween are electrically connected mutually different pulse supply terminals, respectively.

When compared with the output transfer path being composed of the CCD of two-phase driving type with two-layer polycrystalline silicone electrodes, the output transfer path being composed of the CCD of two-phase driving type with three-layer polycrystalline silicone electrodes has advantage of loose or wide design rules. For example, when the CCD of two-phase driving type with two-layer polycrystalline silicone electrodes is disposed in a so-called overlapping electrode layout shown in FIG. 21 or 26, it is required to keep the gap between the transfer electrodes 273 substantially equal to, or less than the gap between the transfer electrodes 272. In consideration of design rules, it is difficult to form the transfer electrodes 273 of this kind.

In the CCD 270b of two-phase driving type with three-layer polycrystalline silicone electrodes shown in FIG. 31, the transfer electrodes 273 can be formed without such difficulty associated with the design rules.

Therefore, when an output transfer path being composed of the CCD of two-phase driving type with three-layer polycrystalline silicone electrodes is adopted, it is easy to produce an IT-CCD by minimizing the pixel pitch between pixels (pitch $P_2$ between photoelectric converters) in the direction of the photoelectric converter row (row direction DH). This also applies to a case in which the electrodes are formed with a material other than polycrystalline silicon.

Description has been given of IT-CCDs according to the embodiments. However, the present invention is not restricted by the embodiments. It is to be understood by those skilled in the art that the embodiments can be changed or modified in various manners.

As above, each IT-CCD of the embodiments has photoelectric converters (photodiodes), vertical transfer CCDs, output transfer path, and the like disposed on one surface of an n-type semiconductor substrate having a p-type well. However, such an IT-CCD can be produced by disposing photoelectric converters (photodiodes), vertical transfer CCDs, output transfer path, and the like on one surface of a p-type semiconductor substrate.

It is also possible to use a sapphire substrate or the like such that a desired semiconductor layer is formed on the substrate. By disposing photoelectric converters (photodiodes), vertical transfer CCDs, output transfer path, and the like on one surface of the semiconductor layer, an IT-CCD can be produced.

In this specification, a term "semiconductor substrate" includes an item including a substrate made of material other than semiconductor and a semiconductor layer formed on the substrate to dispose photoelectric converters (photodiodes), vertical transfer CCDs, output transfer path, and the like.

The contour of the photoelectric converter can be appropriately selected and is, for example, a rectangle (including a parallelogram), a polygon having five or more segments in which each internal angle is obtuse, a polygon having five or more segments in which internal angles include an obtuse angle and an acute angle, or one of contours obtained by rounding the corners of the contours above. The vertical transfer CCD has at least two charge transfer stages for each photoelectric converter. Two, three, or four charge transfer stages are disposed for each photoelectric converter.

The number of transfer electrodes constituting the vertical transfer CCD and the number of sections thereof in the charge transfer channel can be appropriately selected according to the number of charge transfer stages to be disposed for each photoelectric converter. The contour of each section above in plan view may be a linear contour, a curved contour, or a combination of a line contour and a curved contour.

Each transfer electrode of the vertical transfer CCD may be in a contour as shown in each IT-CCD of the embodiments in which two transfer path forming sections each inclined with respect to the row direction $D_H$ are linked with each other by a connecting section extending in the row direction $D_H$ (this contour will be referred to as "contour A" herebelow). Each transfer electrode may be in a shape in which two transfer path forming sections each inclined with respect to the row direction $D_H$ are directly linked with each other without using the connecting section above (this contour will be referred to as "contour B" herebelow). When the contour A is adopted, each transfer electrode is favorably formed to have a contour so that the connecting section and the transfer path forming section is linked with each other with an obtuse angle therebetween, or smoothly linked without forming an angle therebetween.

In the vertical transfer CCD, two adjacent transfer electrodes may be made of mutually different materials. The material of each electrode includes, in addition to polycrystalline silicon, a metal such as aluminum, wolfram, or molybdenum as well as an alloy including at least tow kinds of these metals.

The connecting sections of two adjacent transfer electrodes may completely overlap each other in an area in which these electrodes are contiguous to each other as shown in FIG. 6A. Alternatively, only an edge section in the width direction of the connecting section of one of the adjacent transfer electrodes may overlap with the connecting section of the other one of the adjacent transfer electrodes. The connecting sections may be contiguous to each other, i.e., there exists no overlapped area therebetween.

The contour in plan view of the each photoelectric converter region defined by two adjacent transfer electrodes for every second photoelectric converter column (an inner side contour of an area in plan view, the area being determined by two adjacent transfer electrodes by enclosing one photoelectric converter in plan view) can be appropriately selected. The contour may be a rectangle (including a parallelogram), a polygon having five or more segments in which each internal angle is obtuse, a polygon having five or more segments in which internal angles include an obtuse angle and an acute angle, or one of contours obtained by rounding the corners of the contours above.

Similarly, the contour of the light receiving section of each pixel can be appropriately selected and is, for example, a rectangle (including a parallelogram), a polygon having five or more segments in which each internal angle is obtuse, a polygon having five or more segments in which internal angles include an obtuse angle and an acute angle, or one of contours obtained by rounding the corners of the contours above. To prevent an event in which the light collecting efficiency and sensitivity of each pixel vary between two adjacent pixel rows, the contour of the light receiving section of each pixel is desirably axially symmetric with respect to the column direction $D_V$ and the row direction $D_H$.

The readout gate electrode region need not necessarily entirely cover in plan view the readout gate region. The readout gate region may be extended in plan view over the readout gate region, for example, toward the photoelectric converter.

The vertical transfer CCD driving method is not restricted by the driving methods described in the embodiments. The driving method may be appropriately changed according to a utilization purpose or the like of the pertinent IT-CCD. The number of pulse supply terminals to supply predetermined driving pulses to the respective transfer electrodes and specifications of connections between the pulse supply terminals and the transfer electrodes can also be appropriately changed according to the vertical transfer CCD driving method of the pertinent IT-CCD. This also applies to the output transfer path.

When a CCD of two-phase driving type is employed as the output transfer path, two adjacent transfer electrodes in the CCD may be formed using mutually different materials, respectively. The materials of each transfer electrode may be polycrystalline silicon, metals such as aluminum, wolfram, and molybdenum as well as alloys including at least two kinds of these metals.

The adjusting section is not an essential constituent element and hence may be dispensed with. The vertical transfer CCD may be directly connected via the light sensing section to the output transfer path. In place of the adjusting section, a CCD storage to store signal charge for one frame may be arranged.

When one microlens is disposed over the light receiving section to cover in plan view the light receiving section of each pixel, the contour in plan view of each microlens may be a rectangle, a rounded rectangle having rounded corners, a polygon having five or more segments in which each internal angle is obtuse, a rounded polygon obtained by rounding corners of the polygon above, a circle, an ellipse, or the like. The contour in plan view of the microlens may be appropriately selected according to the shape of the light receiving section of each pixel. It is also possible to arrange microlens structure by accumulating a plurality of light collecting lenses including at least one inner lens on the light receiving section of each pixel.

The microlenses may have a pitch in the column direction $D_V$ substantially equal to or slightly different from the pitch $P_1$ of the photoelectric converters in the column direction $D_V$. When the microlens pitch in the column direction $D_V$ is slightly different from the pitch $P_1$ of the photoelectric converters in the column direction $D_V$, each microlens is moved, for example, as follows.

In consideration of a displacement of an incident direction of light according to a displacement of position in the light receiving section, the microlens is moved to produce a focused image on a desired position of the light receiving section of the pixel, for example, the microlens is moved to a position advantageous to obtain desired sensitivity or resolution. To increase sensitivity or resolution of each pixel, it is favorable that the photoelectric conversion region exists in a wide range of the periphery of the position at which the microlens produces a focused image.

Because of a similar reason, the pitch of the microlenses in the row direction $D_H$ may be substantially equal to or slightly different from the pitch $P_2$ of the photoelectric converters in the row direction $D_H$.

Figure 34:
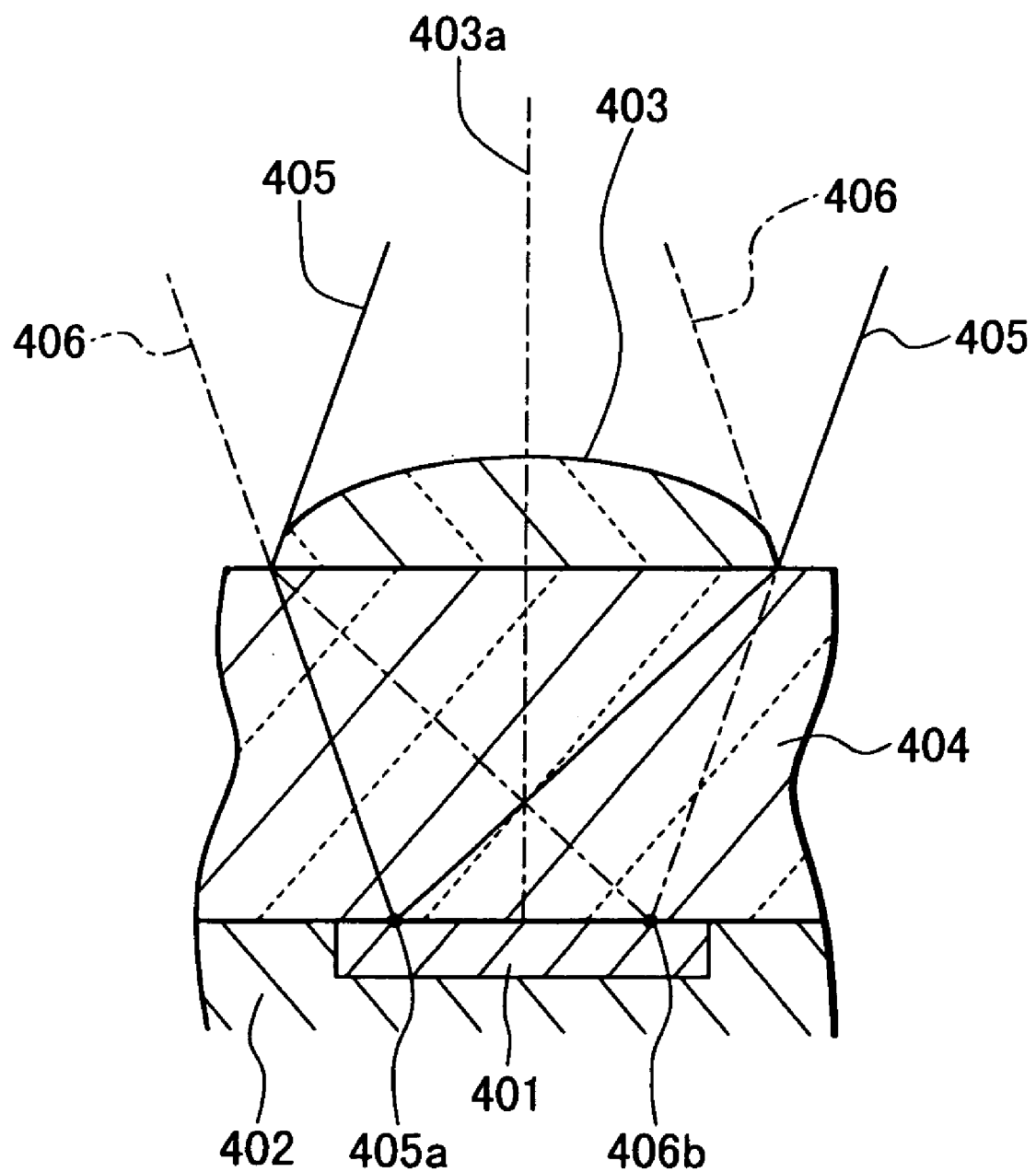
FIG. 34 is a diagram for explaining position of an image produced by a microlens on a photoelectric converter.

When the relative positional relationship between the photoelectric converter and the associated microlens is substantially fixed for all pixels, the position at which the microlens produces a focused image on the photoelectric converter varies between a central section of the photoelectric converter column and an upper section or lower section thereof as shown in FIG. 34. To possibly minimize the distance between the position at which the microlens produces a focused image and the desired position, the microlens is favorably moved, for example, as described in (1) to (3) below.

Figure 32A:
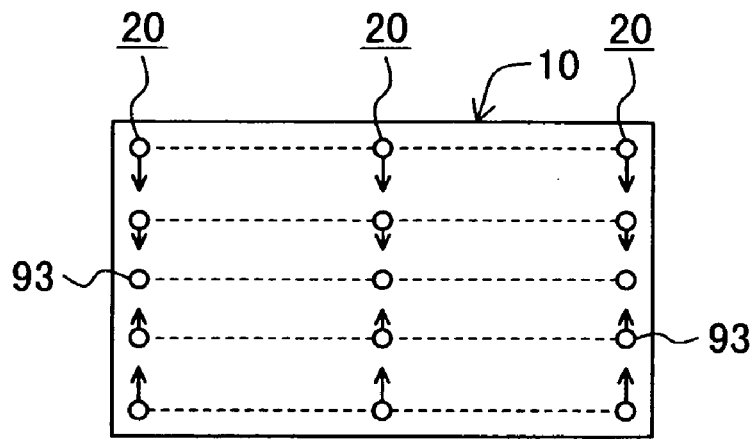
FIGS. 32A to 32C are diagrams for explaining directions of microlenses when the microlenses are moved in the manufacturing of the solid-state image pickup device.

(1) As schematically shown in FIG. 32A, in each photoelectric converter column 20, the position of the microlens 93 is shifted in the column direction $D_V$ toward the central photoelectric converter row as the distance between the microlens 93 and the central row increased. In FIG. 32A, the microlens shifting direction is indicated by an arrow mark.

Figure 32B:
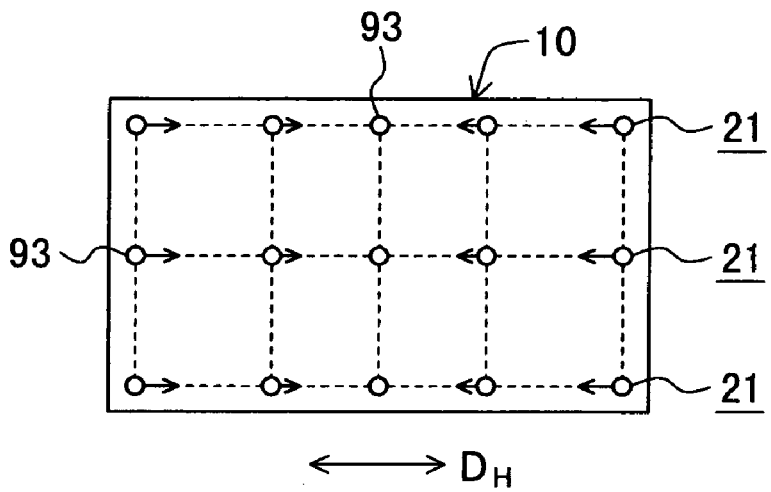

(2) As schematically shown in FIG. 32B, in each photoelectric converter row 20, the position of the microlens 93 is moved in the row direction $D_H$ toward the central photoelectric converter column as the distance between the microlens 93 and the central column increased. In FIG. 32B, the microlens moving direction is indicated by an arrow mark.

Figure 32C:
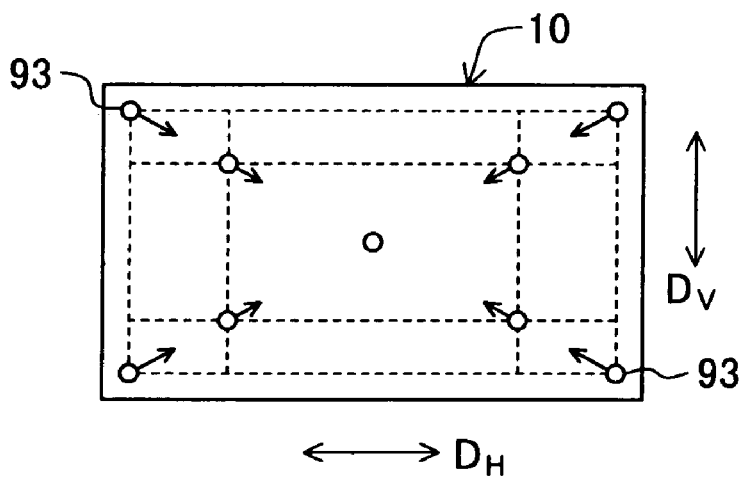

(3) As schematically shown in FIG. 32C, the position of the microlens 93 is moved in the row and column directions $D_H$ and $D_V$ toward the central position of the light sensing section 10 as the distance between the microlens 93 and the central position increased. In FIG. 32C, the microlens moving direction is indicated by an arrow mark.

By moving the microlens as (1) to (3) above, luminance shading can also be improved.

When a color filter array is arranged in an IT-CCD, the color filter array include color filters to produce color images. Such color filter arrays include the color filter array of three primary color (red, green, and blue) type described in the embodiments and a color filer array of complementary color type.

Such a color filter array of complementary color type can be implemented using, for example, (i) color filters of green (G), cyan (Cy), and yellow (Ye); (ii) color filters of cyan (Cy), yellow (Ye), and white or colorless (W); (iii) color filters of cyan (Cy), magenta (Mg), yellow (Ye), and green (G); or (iv) color filters of cyan (Cy), yellow (Ye), green (G), and white or colorless (W).

Figure 33A:
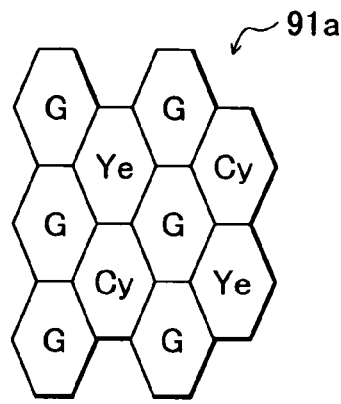
FIGS. 33A to 33E are plan views showing examples of color filter arrays of complementary color type.
Figure 33B:
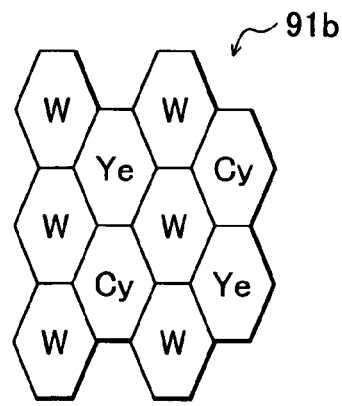
Figure 33C:
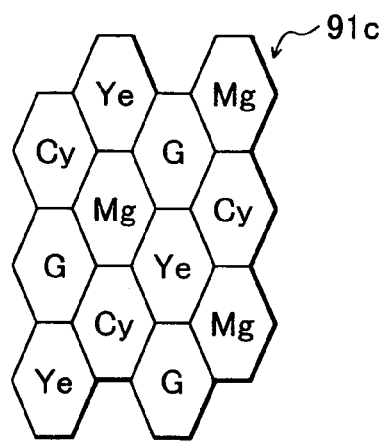
Figure 33D:
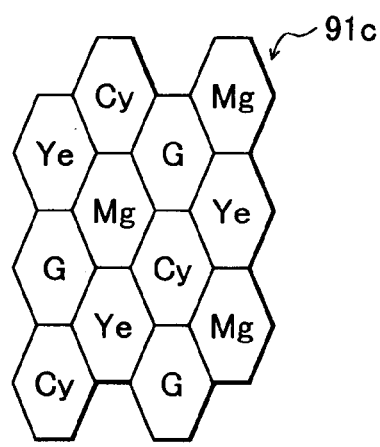
Figure 33E:
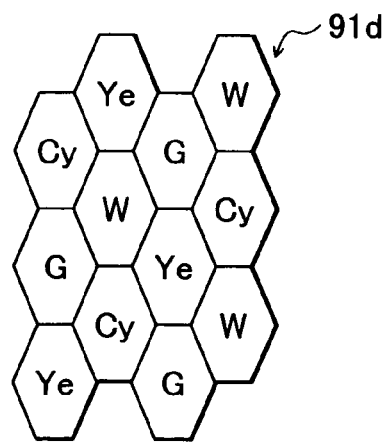

FIG. 33A is a plan view showing an example of a color filter array 91a of complementary color type (i), FIG. 33B is a plan view showing an example of a color filter array 91b of complementary color type (ii), FIG. 33C is a plan view showing an example of a color filter array 91c of complementary color type (iii), FIG. 33D is a plan view showing another example of a color filter array 91c of complementary color type (iii), and FIG. 33E is a plan view showing an example of a color filter array 91d of complementary color type (iv).

In FIGS. 33A to 33E, each hexagon enclosing G, Cy, Ye, W, or Mg designates one color filter in which G, Cy, Ye, W, or Mg designates a filter color.

The color filter allocation pattern of a color filter array of three primary color type is not limited to those shown in FIG. 10 or 25. Similarly, the color filter allocation pattern of a color filter arrays of complementary color type is not limited to those shown in FIGS. 33A to 33E.

In each IT-CCD of the embodiments, a photoelectric converter (photodiode) 22 or 222 is disposed on a p-type well 2 or 202 formed on an n-type semiconductor substrate 1 or 201. Therefore, vertical overflow drain structure can be added to the IT-CCD. In association therewith, an electronic shutter can be additionally disposed. To add vertical overflow drain structure to the IT-CCD, there is additionally provided structure which can apply a reverse bias to the p-type well 2 or 202 and a region below the n-type semiconductor substrate 1 or 201 (a region lower then the p-type well 2 or 202). In place of the vertical overflow drain structure, horizontal overflow drain structure may be added to the IT-CCD. By adding the vertical or horizontal overflow drain structure, blooming can be easily suppressed.

To drive the ID-CCD, an appropriate driving method can be selected from various methods. Therefore, it is accordingly possible to select appropriate structure for an appropriate drive pulse supply circuit to supply predetermined driving pulses respectively to the vertical transfer CCD (transfer electrodes constituting the vertical transfer CCD) and the output transfer path (transfer electrodes constituting the output transfer path).

As above, in the IT-CCD according to the present invention, the event in which the light collecting efficiency and sensitivity of each pixel vary between two adjacent pixel rows can be easily prevented, and the pixel density can be easily increased while suppressing the decrease in area of the light receiving section of each pixel.

Consequently, in accordance with the present invention, there can be easily provided an IT-CCD capable of producing images having high picture quality.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A solid-state image pickup device, comprising:
a semiconductor substrate;
a large number of photoelectric converters arranged on one surface of said semiconductor substrate in a plurality of columns and a plurality of rows, each of said columns and said rows including a plurality of photoelectric converters, said photoelectric converters in odd ones of said columns being shifted about one half of a pitch $P_1$ in a direction of said column relative to said photoelectric converters in even ones of said columns, said photoelectric converters in odd ones of said rows being shifted about one half of a pitch $P_2$ in a direction of said row relative to said photoelectric converters in even ones of said rows, each said photoelectric converter column including said photoelectric converters of only said odd rows or said even rows;
a vertical charge transfer channel provided for each said photoelectric converter column on the surface of said semiconductor substrate, each said channel being adjacent to an associated photoelectric converter column, each said channel including a plurality of sections of different directions lying in a line, said channel generally extending, while meandering in a zigzag shape, in column direction;
a plurality of transfer electrodes disposed on the surface of said semiconductor substrate to intersect in plan view said charge transfer channels, each said transfer electrode including a plurality of transfer path forming regions which are equal in number to said charge transfer channels, each said transfer path forming region covering one of said sections of said charge transfer channels, said transfer path forming region and said section disposed thereunder forming one charge transfer stage; each said transfer electrode generally extending in row direction, while two adjacent ones of said transfer electrodes sandwiching one of said photoelectric converter rows therebetween and determining one photoelectric converter region for every second one of said photoelectric converter columns by meeting each other and parting from each other to enclose in plan view every one of said photoelectric converters in said odd or even row; and
a readout gate region disposed contiguous to each said photoelectric converter and to an associated one of said charge transfer channels,
each said charge transfer channel having a first width at location where said channel is contiguous to said readout gate region and a second width at a location where said channel is separated from said readout gate region, said first width being less than said second width.

2. A solid-state image pickup device according to claim 1, wherein said charge transfer channels and said transfer electrodes configure at least two charge transfer stages for each said photoelectric converter.

3. A solid-state image pickup device according to claim 2, wherein said readout gate regions associating to one of said charge transfer channel are contiguous to every second one of said sections of said charge transfer channel.

4. A solid-state image pickup device according to claim 1, further including a plurality of readout gate electrode regions, said readout gate electrode region being disposed on each said readout gate region and covering said readout gate region in plan view, wherein
each said readout gate electrode region is a part of said transfer path forming region covering in plan view one of said sections of said charge transfer channel contiguous to said readout gate region associating to said readout gate electrode region.

5. A solid-state image pickup device according to claim 1, wherein said photoelectric converters are substantially equal to each other in contour, size, and direction in plan view.

6. A solid-state image pickup device according to claim 1, wherein each said photoelectric converter region determined by said two adjacent transfer electrodes sandwiching said one photoelectric converter column therebetween has a contour of substantially a hexagon in plan view.

7. A solid-state image pickup device according to claim 1, further including a light shielding film having an opening provided for each said photoelectric converter, each said opening being disposed over the associated photoelectric converter.

8. A solid-state image pickup device according to claim 7, wherein said openings are substantially equal to each other in contour, size, and direction in plan view.

9. A solid-state image pickup device according to claim 7, wherein each said opening has a contour equal to a rectangle, a pentagon, or a hexagon in plan view.

10. A solid-state image pickup device according to claim 7, further including a microlens provided for each said opening, each said microlens being disposed over the associated opening and covering the opening in plan view.

11. A solid-state image pickup device according to claim 10, further including a color filter provided for each region between said opening and said microlens associating to the opening, said color filter covering the associated opening in plan view.

12. A solid-state image pickup device according to claim 1, further including an output transfer path being composed of a CCD of two-phase driving type with two-layer or three-layer electrode structure, said output transfer path receives, via said charge transfer channels, signal charge stored in each said photoelectric converter through photoelectric conversion conducted by said each photoelectric converter and transfers said signal charge in a predetermined direction.

13. A solid-state image pickup device according to claim 12, further including an adjusting section, said adjusting section including an adjusting charge transfer channel for each said charge transfer channel connected to one end thereof, said adjusting charge transfer channels changing, before said signal charge is transferred to said output transfer path, the transfer direction of said signal charge and adjusting mutual pitch in said photoelectric converter row direction to a constant value.

14. A method of driving a solid-state image pickup device comprising a semiconductor substrate; a large number of photoelectric converters arranged on one surface of said semiconductor substrate in a plurality of columns and a plurality of rows, each of said columns and said rows including a plurality of photoelectric converters, said photoelectric converters in odd ones of said columns being shifted about one half of a pitch $P_1$ in a direction of said column relative to said photoelectric converters in even ones of said columns, said photoelectric converters in odd ones of said rows being shifted about one half of a pitch $P_2$ in a direction of said row relative to said photoelectric converters in even ones of said rows, each said photoelectric converter column including said photoelectric converters of only said odd rows or said even rows; a vertical charge transfer channel provided for each said photoelectric converter column on the surface of said semiconductor substrate, each said channel being adjacent to an associated photoelectric converter column, each said channel including a plurality of sections of different directions lying in a line, said channel generally extending, while meandering in a zigzag shape, in column direction; a plurality of transfer electrodes disposed on the surface of said semiconductor substrate to intersect in plan view said charge transfer channels, each said transfer electrode including a plurality of transfer path forming regions which are equal in number to said charge transfer channels, each said transfer path forming region covering one of said sections of said charge transfer channels, said transfer path forming region and said section disposed thereunder forming one charge transfer stage; each said transfer electrode generally extending in row direction, while two adjacent ones of said transfer electrodes sandwiching one of said photoelectric converter rows therebetween and determining one photoelectric converter region for every second one of said photoelectric converter columns by meeting each other and parting from each other to enclose in plan view every one of said photoelectric converters in said odd or even row; and a readout gate region disposed contiguous to each said photoelectric converter and to an associated one of said charge transfer channels, each said charge transfer channel having a first width at location where said channel is contiguous to said readout gate region and a second width at a location where said channel is separated from said readout gate region, said first width being less than said second width, comprising the steps of:

reading out, in one vertical blanking period, signal charge stored in each said photoelectric converter of a predetermined photoelectric converter rows, via said associated readout gate region contiguous to said photoelectric converter, to said associated charge transfer channel contiguous to said associated readout gate region; and converting, from the vertical blanking period to a next vertical blanking period subsequent thereto, each said signal charge read out to said charge transfer channel into an image signal and outputting the image signal.

15. A solid-state image pickup device driving method according to claim 14, wherein said charge transfer channels and said transfer electrodes configure at least two charge transfer stages for each said photoelectric converter.

16. A solid-state image pickup device driving method according to claim 14, wherein said readout gate region associating to said charge transfer channel is contiguous to every second one of said sections of said charge transfer channel.

* * * * *